(12) United States Patent
Kuroda et al.

(10) Patent No.: US 9,087,816 B2
(45) Date of Patent: Jul. 21, 2015

(54) SEMICONDUCTOR DEVICE AND METHOD OF MANUFACTURING THE SAME

(71) Applicant: Renesas Electronics Corporation, Kawasaki-shi, Kanagawa (JP)

(72) Inventors: Soshi Kuroda, Kanagawa (JP); Kenya Hironaga, Kanagawa (JP); Hironori Matsushima, Kanagawa (JP); Masatoshi Yasunaga, Kanagawa (JP); Akira Yamazaki, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 14/190,366

(22) Filed: Feb. 26, 2014

(65) Prior Publication Data

US 2014/0175678 A1   Jun. 26, 2014

Related U.S. Application Data

(62) Division of application No. 13/231,856, filed on Sep. 13, 2011, now Pat. No. 8,692,383.

(30) Foreign Application Priority Data

Sep. 13, 2010  (JP) .................................. 2010-204225
Apr. 28, 2011  (JP) .................................. 2011-100473

(51) Int. Cl.
*H01L 23/52* (2006.01)
*H01L 23/48* (2006.01)
(Continued)

(52) U.S. Cl.
CPC ............ *H01L 24/46* (2013.01); *H01L 21/6836* (2013.01); *H01L 23/3121* (2013.01); *H01L 23/49838* (2013.01); *H01L 24/05* (2013.01);
(Continued)

(58) Field of Classification Search
CPC .......... H01L 24/29; H01L 24/46; H01L 24/05
USPC ............................ 257/774, 783, 784, E23.011
See application file for complete search history.

(56) References Cited

U.S. PATENT DOCUMENTS 6,448,507 B1 *  9/2002  Fontecha et al. ............... 174/260
6,472,749 B1   10/2002  Hirano et al.
(Continued)

FOREIGN PATENT DOCUMENTS

JP   2000-133742    5/2000
JP   2000-236040 A  8/2000
(Continued)

OTHER PUBLICATIONS

Office Action for related Japanese Application No. 2011-100473, mailed Dec. 2, 2014 (citing Foreign Patent Documents 1-4; also citing JP 2000-236040).

*Primary Examiner* — Luan C Thai
(74) *Attorney, Agent, or Firm* — Miles & Stockbridge P.C.

(57) ABSTRACT

To achieve a reduction in cost of a semiconductor device, in a common board (a wiring board), a plurality of bonding leads each extend toward the center of the board, and a solder resist film as a die bonding region supporting a minimum chip is coated with a die bonding material. With this, even when a first semiconductor chip as a large chip is mounted, wire bonding can be performed without causing the die bonding material to cover the bonding leads. Thus, development cost can be reduced to reduce the cost of the semiconductor device (LGA).

10 Claims, 45 Drawing Sheets

(51) Int. Cl.
  *H01L 29/40*   (2006.01)
  *H01L 23/00*   (2006.01)
  *H01L 21/683*  (2006.01)
  *H01L 23/31*   (2006.01)
  *H01L 23/498*  (2006.01)

(52) U.S. Cl.
  CPC .............. *H01L 24/27* (2013.01); *H01L 24/29* (2013.01); *H01L 24/32* (2013.01); *H01L 24/743* (2013.01); *H01L 24/83* (2013.01); *H01L 24/97* (2013.01); *H01L 23/49827* (2013.01); *H01L 24/45* (2013.01); *H01L 24/48* (2013.01); *H01L 24/49* (2013.01); *H01L 24/85* (2013.01); *H01L 2224/04042* (2013.01); *H01L 2224/05554* (2013.01); *H01L 2224/27312* (2013.01); *H01L 2224/27334* (2013.01); *H01L 2224/27436* (2013.01); *H01L 2224/2919* (2013.01); *H01L 2224/32014* (2013.01); *H01L 2224/32225* (2013.01); *H01L 2224/45144* (2013.01); *H01L 2224/48011* (2013.01); *H01L 2224/48091* (2013.01); *H01L 2224/48095* (2013.01); *H01L 2224/48227* (2013.01); *H01L 2224/48465* (2013.01); *H01L 2224/49171* (2013.01); *H01L 2224/73265* (2013.01); *H01L 2224/838* (2013.01); *H01L 2224/83191* (2013.01); *H01L 2224/83192* (2013.01); *H01L 2224/83194* (2013.01); *H01L 2224/83385* (2013.01); *H01L 2224/85* (2013.01); *H01L 2224/92247* (2013.01); *H01L 2224/97* (2013.01); *H01L 2924/014* (2013.01); *H01L 2924/01005* (2013.01); *H01L 2924/01006* (2013.01); *H01L 2924/01014* (2013.01); *H01L 2924/01023* (2013.01); *H01L 2924/01028* (2013.01); *H01L 2924/01029* (2013.01); *H01L 2924/01033* (2013.01); *H01L 2924/01074* (2013.01); *H01L 2924/01079* (2013.01); *H01L 2924/01082* (2013.01); *H01L 2924/0665* (2013.01); *H01L 2924/07802* (2013.01); *H01L 2924/15311* (2013.01)

(56) References Cited

U.S. PATENT DOCUMENTS

| | | | | |
|---|---|---|---|---|
| 6,853,089 | B2 * | 2/2005 | Ujiie et al. | 257/783 |
| 7,432,602 | B2 * | 10/2008 | Kuramochi | 257/783 |
| 7,518,250 | B2 * | 4/2009 | Shimanuki | 257/784 |
| 2003/0153127 | A1 | 8/2003 | Wada et al. | |
| 2005/0093179 | A1 | 5/2005 | Andoh | |
| 2006/0091523 | A1 | 5/2006 | Shimanuki | |

FOREIGN PATENT DOCUMENTS

| | | |
|---|---|---|
| JP | 2003-234359 | 8/2003 |
| JP | 2005-136329 | 5/2005 |
| JP | 2006-128455 | 5/2006 |

\* cited by examiner

SEMICONDUCTOR DEVICE AND METHOD OF MANUFACTURING THE SAME

CROSS-REFERENCE TO RELATED APPLICATION

The present application claims priorities from Japanese Patent Application No. 2010-204225 filed on Sep. 13, 2010, and Japanese Patent Application No. 2011-100473 filed on Apr. 28, 2011, the contents of which are hereby incorporated by reference into this application.

TECHNICAL FIELD OF THE INVENTION

The present invention relates to a semiconductor device and manufacturing technology of the same. More particularly, the present invention relates to technology effectively applied to sharing of a wiring board of board-type semiconductor devices.

BACKGROUND OF THE INVENTION

A semiconductor device having a board capable of mounting semiconductor chips of different outer sizes has been disclosed (for example, Japanese Patent Application Laid-Open Publication No. 2000-236040 (Patent Document 1)).

SUMMARY OF THE INVENTION

In recent years, since models of semiconductor devices such as microcontrollers are wide-ranging, it takes enormous amounts of development cost, resources, and time in the way to develop one model for one product thus far. Moreover, there is also a demand for a low cost, which should be taken seriously as well in development.

In an existing developing method, optimum designing is made for each model. Therefore, development resources are required as many as the number of models, and the development also takes a long time.

To get around this, the inventors of the present invention have studied the use of a wiring board that can be shared among models. That is, a wiring board capable of mounting semiconductor chips (hereinafter, also referred to simply as chips) of different dimensions (outer sizes) is shared in common for use. In this case, the board is generally designed according to a maximum chip with a maximum planar size. As illustrated in FIG. 10 illustrating a semiconductor package 21 of a comparative example, since a bonding lead 2c is placed according to the maximum chip in this structure, the bonding lead 2c is disposed near an outer edge of a wiring board 2.

Therefore, when a small chip having a small planar size (a second semiconductor chip 3) is mounted, a wire length is long. When a wire 5 for use is made of metal, a cost of a product (semiconductor package 21, a semiconductor device) may be increased.

To prevent a long wire length when a small chip is mounted, it is required for a plurality of bonding leads for connecting wires to extend long from the outer perimeter (circumference) of the wiring board toward the center of the board. In this structure, when a large chip having a large planar size is mounted, a bonding lead extends toward the center of the board, and therefore a portion of the bonding lead near an end closer to the center of the board is positioned below the chip. That is, in a planar view, the portion of the bonding lead near the end closer to the center of the board is positioned below the chip.

Thus, when a paste-form die bonding material is applied to the board at the time of die bonding, a phenomenon occurs in which the die bonding material covers the bonding lead. Here, since a wetting-spread area of the pasty die bonding material is large, the paste-form die bonding material spreads over the bonding leads in a wetting manner, thereby posing a new problem of making wire boding impossible.

Note that the above-described Patent Document 1 describes the structure of the semiconductor device in which, when semiconductor chips of different dimensions are mounted, a plurality of wire-connecting pads are formed on a wiring pattern of a board so that the length of each wire is not changed. However, detailed descriptions of an applying region or an applying range of the die bonding material are not described.

The present invention has been made in view of the problems mentioned above, and has a preferred aim of providing a technology capable of achieving a reduction in cost of a semiconductor device.

Another preferred aim of the present invention is to provide a technology capable of achieving an improvement in reliability of a semiconductor device.

Still another preferred aim of the present invention is to provide a technology capable of achieving an improvement in productivity of a semiconductor device.

The above and other preferred aims and novel characteristics of the present invention will be apparent from the description of the present specification and the accompanying drawings.

The typical ones of the inventions disclosed in the present application will be briefly described as follows.

A semiconductor device including: a wiring board having an upper surface, a plurality of bonding leads disposed on and around an insulating film formed in a region of the upper surface to which a die bond material is applied, a lower surface on an opposite side to the upper surface, and a plurality of lands formed on the lower surface; a semiconductor chip having a main surface and a plurality of electrode pads formed on the main surface, and being mounted on the insulating film of the wiring board; the die bond material disposed between the insulating film of the wiring board and the semiconductor chip; and a plurality of metal wires each electrically connecting each of the plurality of bonding leads of the wiring board and each of the plurality of electrode pads of the semiconductor chip, wherein the wiring board can mount the semiconductor chips having different planar sizes, and the insulating film of the wiring board has a pattern having dimensions smaller than a planar size of the semiconductor chip.

A semiconductor device including: a wiring board having an upper surface, a plurality of bonding leads disposed on and around an insulating film formed in a region of the upper surface to which a die bond material is applied, a lower surface on an opposite side to the upper surface, and a plurality of lands formed on the lower surface; a semiconductor chip having a main surface and a plurality of electrode pads formed on the main surface, and being mounted on the insulating film of the wiring board; the die bond material disposed between the insulating film of the wiring board and the semiconductor chip; and a plurality of metal wires each electrically connecting each of the plurality of bonding leads of the wiring board and each of the plurality of electrode pads of the semiconductor chip, wherein the wiring board can mount the semiconductor chips having different planar sizes, and the insulating film of the wiring board has a pattern having dimensions smaller than a planar size of the semiconductor chip, and an end on an inner side of each of the bonding leads is positioned below the semiconductor chip and, in a planar view, the end of the bonding lead on the side of the bonding lead overlaps with the semiconductor chip.

A semiconductor device including: a wiring board having an upper surface, a first insulating film formed in a region of the upper surface to be coated with a die bond material, a second insulating film formed around the first insulating film, a plurality of bonding leads disposed around the first insulating film, a lower surface on an opposite side of the upper surface, and a plurality of lands formed on the lower surface; a semiconductor chip having a main surface and a plurality of electrode pads formed on the main surface, and being mounted on the first insulating film of the wiring board; the die bond material disposed between the first insulating film of the wiring board and the semiconductor chip; and a plurality of metal wires each electrically connecting each of the plurality of bonding leads of the wiring board and each of the plurality of electrode pads of the semiconductor chip, wherein the first insulating film of the wiring board has an area smaller than an area of the semiconductor chip, and the first insulating film of the wiring board has a film thickness larger than a film thickness of the second insulating film.

A method of manufacturing a semiconductor device including the steps of: (a) preparing a semiconductor chip; (b) supplying an adhesive material onto a wiring board; (c) mounting the semiconductor chip on the wiring board via the adhesive material; (d) electrically connecting an electrode pad on a front surface of the semiconductor chip and a bonding lead on an upper surface of the wiring board with a metal wire; and (e) sealing the semiconductor chip and the metal wire with a sealing body, wherein a first insulating film having an area smaller than an area of the semiconductor chip and having the semiconductor chip mounted thereon is provided on the upper surface of the wiring board, the bonding lead is placed around the first insulating film, in the step (b), the adhesive material is supplied onto the first insulating film of the wiring board, and the step (c) is performed so that a space between the semiconductor chip and the first insulating film of the wiring board is filled with the adhesive material.

A method of manufacturing a semiconductor device including the steps of: (a) preparing a semiconductor wafer; (b) attaching an adhesive material in a film-like from on a back surface of the semiconductor wafer; (c) dicing the semiconductor wafer and obtaining a semiconductor chip with a back surface having the adhesive material in a film-like form attached thereto; (d) mounting the semiconductor chip on a wiring board; (e) electrically connecting an electrode pad on a front surface of the semiconductor chip and a bonding lead on an upper surface of the wiring board by a metal wire; (f) sealing the semiconductor chip and the metal wire with a sealing body, wherein a first insulating film having an area smaller than an area of the semiconductor chip and on which the semiconductor chip is mounted is provided on the upper surface of the wiring board, the bonding lead is disposed around the first insulating film, and, in the step (d), the semiconductor chip is mounted on the wiring board so that parts of the first insulating film and an upper surface of the bonding lead are covered with the adhesive material in a film-like form.

The effects obtained by typical aspects of the present invention will be briefly described below.

In a board-type semiconductor device, a development cost can be reduced by sharing a board, and therefore a reduction in cost of the semiconductor device can be achieved.

Also, warping of the semiconductor device after singulation can be reduced, and a temperature cycle life after semiconductor device implementation can be improved. As a result, an improvement in reliability of the semiconductor device can be achieved.

Furthermore, by restricting a die bonding region, the time for applying a die bonding material can be shortened to improve process throughput, and therefore an improvement in productivity of the semiconductor device can be achieved.

BRIEF DESCRIPTIONS OF THE DRAWINGS

DESCRIPTIONS OF THE PREFERRED EMBODIMENTS

In addition, the description of the same or similar portions is not repeated in principle unless particularly required in the following embodiments.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Moreover, in the embodiments of the present invention described below, when expressions of "formed of A", "comprising A", "having A", "including A" are used regarding components, other components are not eliminated unless otherwise clearly stated that the components are limited to the described ones. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail with reference to the accompanying drawings. Note that components having the same function are denoted by the same reference symbols throughout the drawings for describing the embodiment, and the repetitive description thereof will be omitted.

(First Embodiment)

Figure 1:
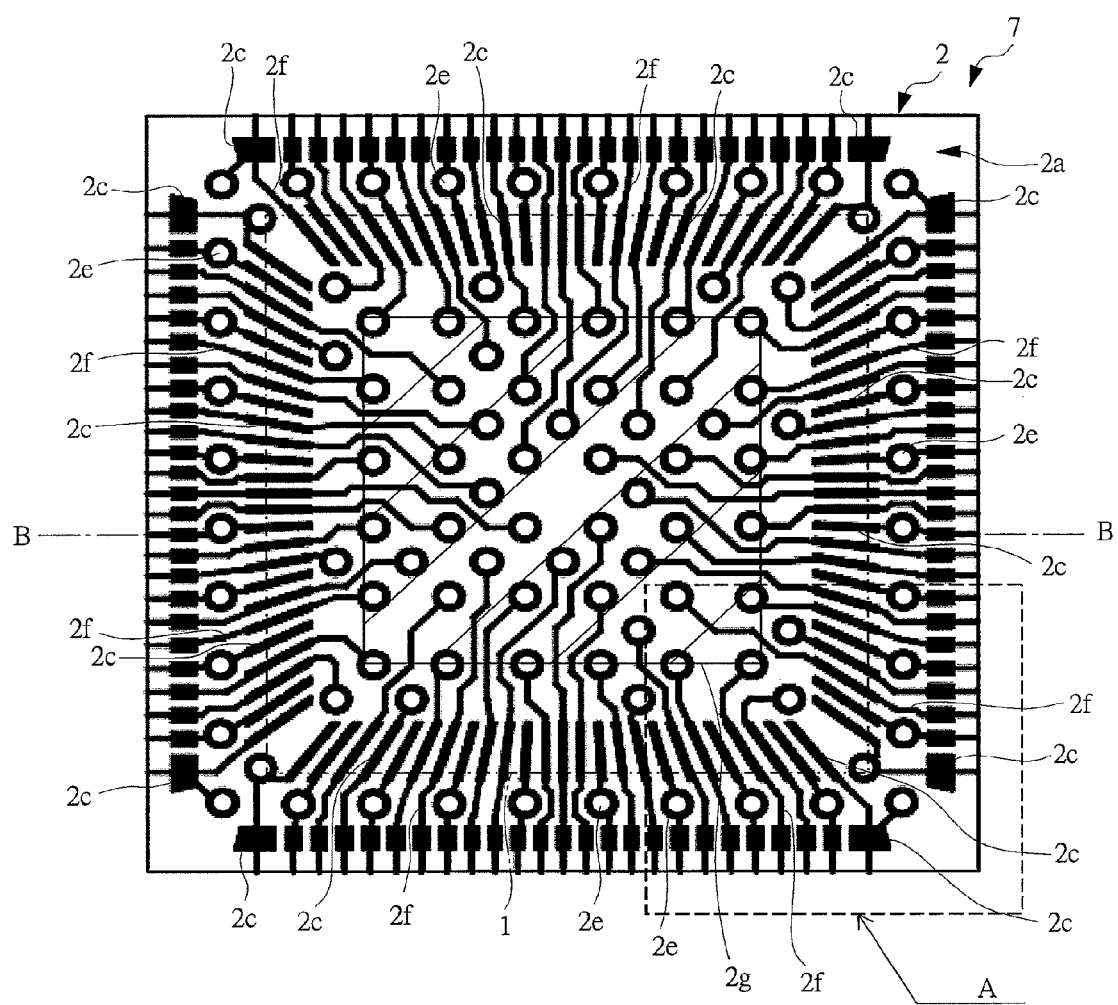
FIG. 1 is a plan view of an example of a structure of a semiconductor device (having a large chip mounted thereon) according to a first embodiment of the present invention, with a sealing body seen through and wires omitted therefrom.
Figure 2:
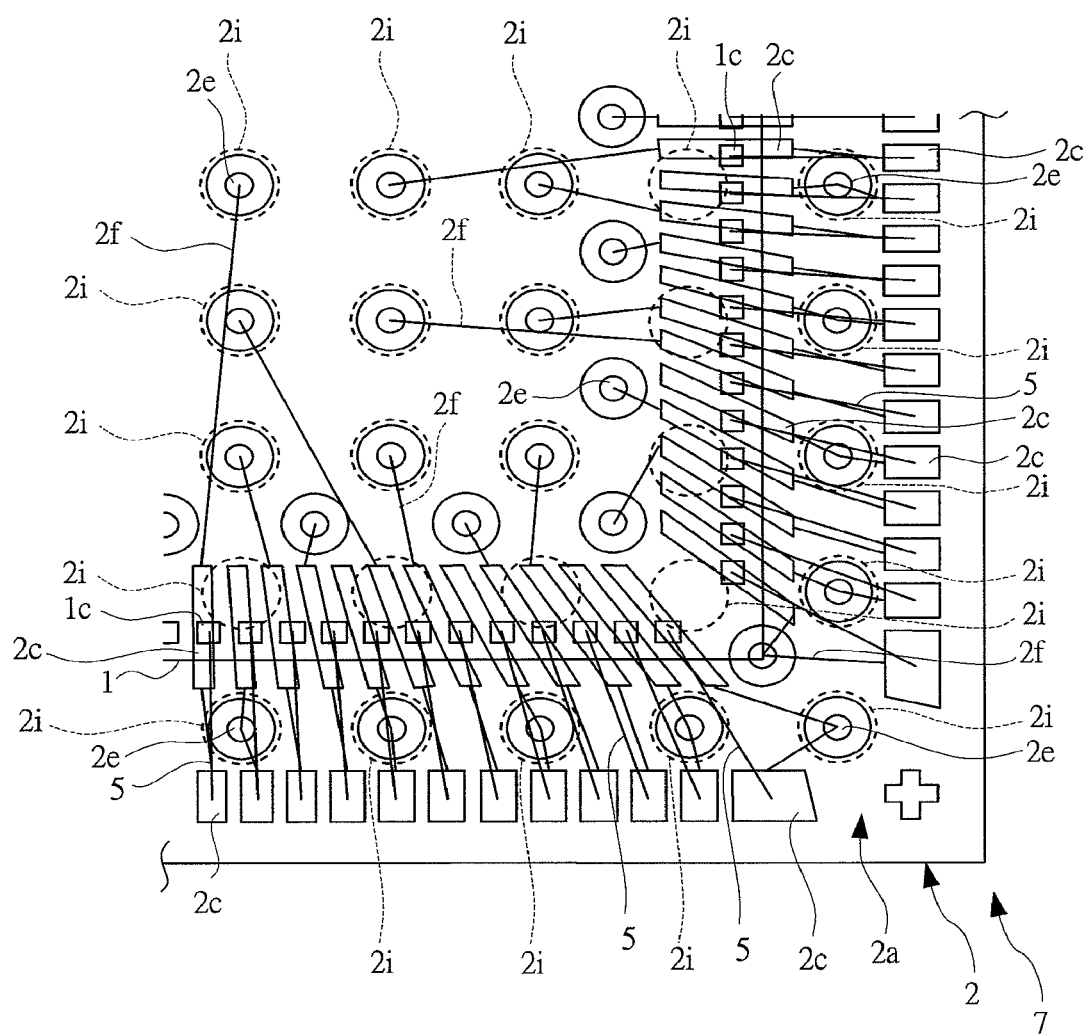
FIG. 2 is a partially enlarged plan view of an example of a structure of a part A in FIG. 1, with a solder resist film omitted therefrom, and wires and lands on a lower surface added thereto.
Figure 3:
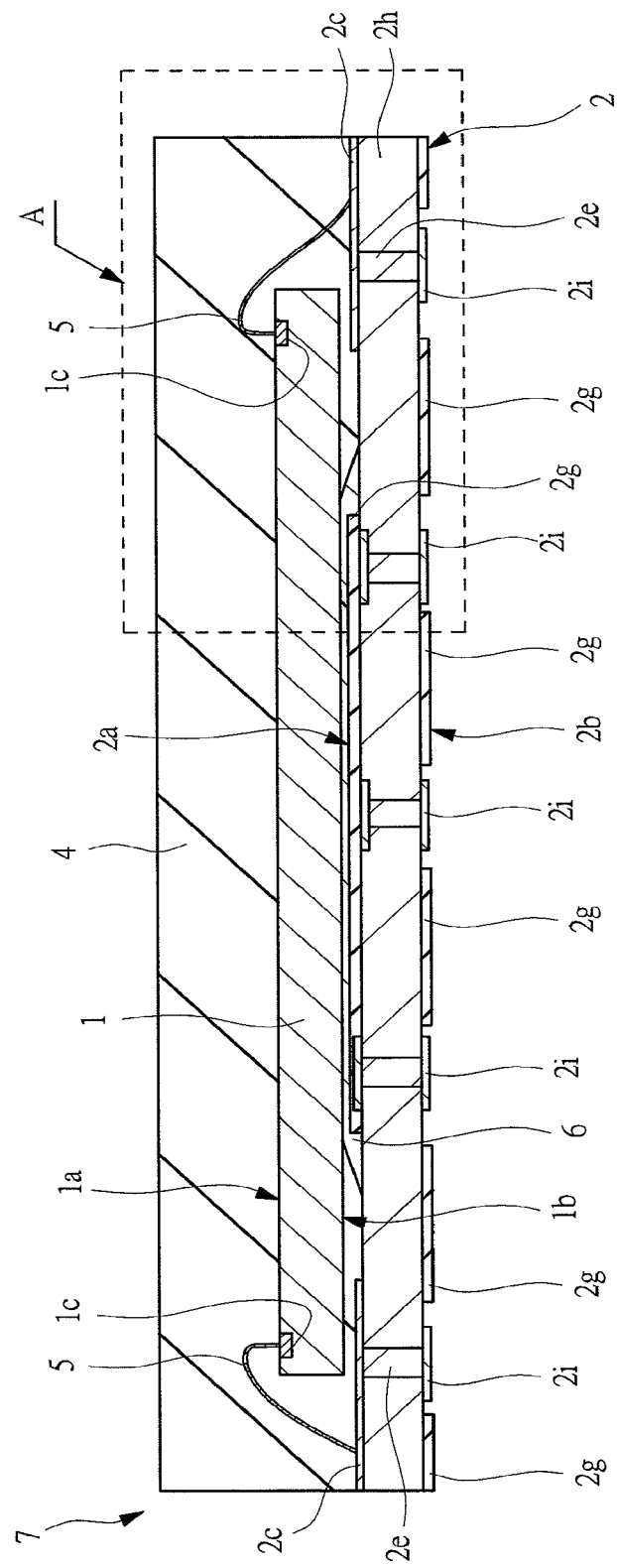
FIG. 3 is a cross-sectional view of an example of a structure cut along a line B-B of FIG. 1.
Figure 4:
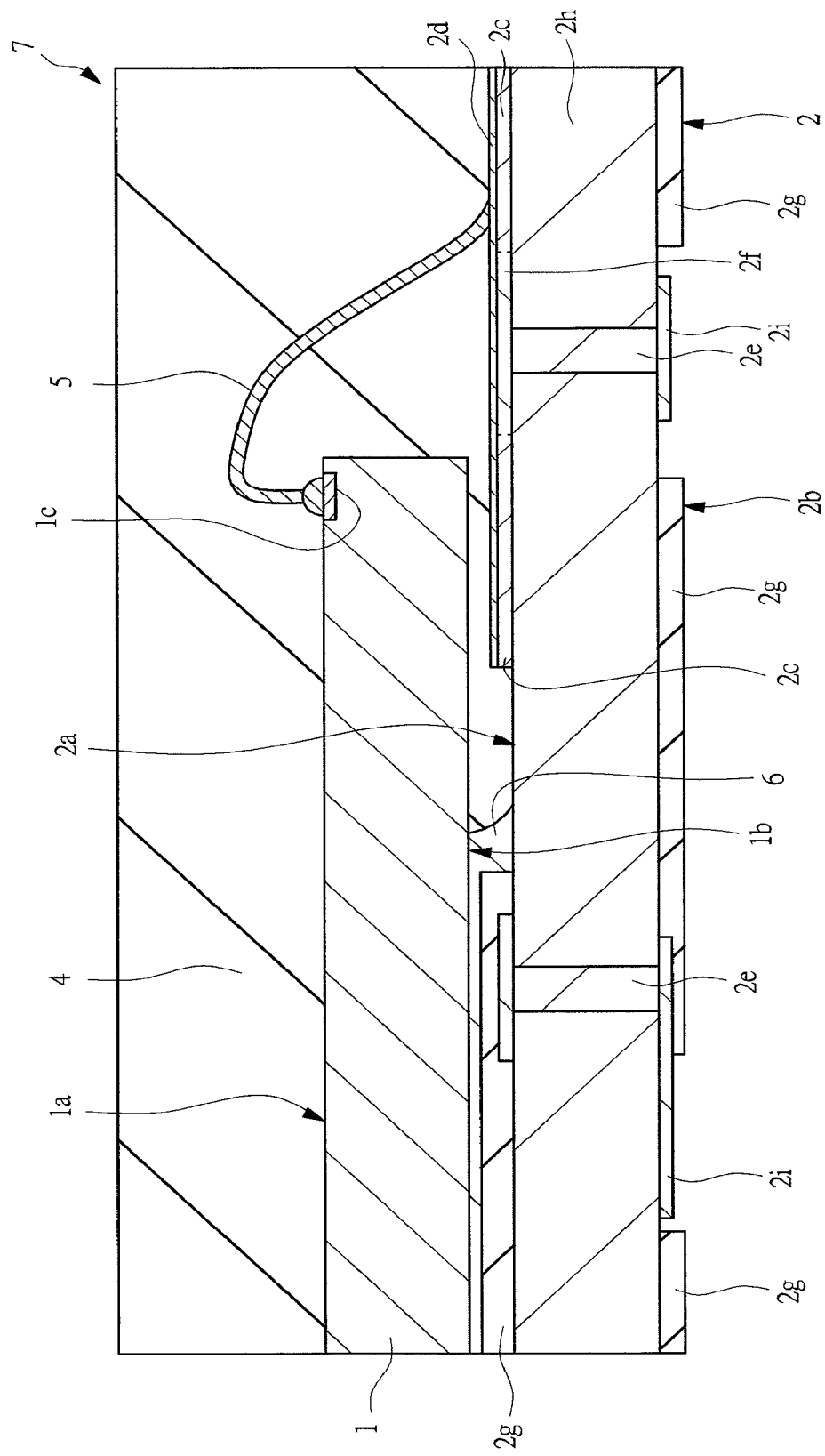
FIG. 4 is a partially enlarged cross-sectional view of an example of a structure of a part A in FIG. 3.

FIG. 1 is a plan view of an example of a structure of a semiconductor device (having a large chip mounted thereon) according to a first embodiment of the present invention, with a sealing body seen through and wires omitted therefrom. FIG. 2 is a partially enlarged plan view of an example of a structure of a part A in FIG. 1, with a solder resist film omitted therefrom and wires and lands on a lower surface added thereto. FIG. 3 is a cross-sectional view of an example of structure cut along a line B-B of FIG. 1. FIG. 4 is a partially enlarged cross-sectional view of an example of a structure of a part A in FIG. 3.

In the semiconductor device of the first embodiment illustrated in FIGS. 1 to 4, a plurality of types of semiconductor chips with different planar sizes can be mounted, thereby achieving sharing of a board. That is, a plurality of types of semiconductor chips with different planar sizes (outer sizes and dimensions) can be mounted on the same package board. By sharing a board, a reduction in development cost is achieved.

In the first embodiment, as examples of the semiconductor device, described are mounting a first semiconductor chip 1, which is a semiconductor chip having a large planar size (an area of a main surface 1a illustrated in FIG. 3), on a wiring board 2, which is a package board achieving sharing; and mounting a second semiconductor chip 3, which is a semiconductor chip (a minimum chip) having a planar size (an area of a main surface 3a illustrated in FIG. 7) smaller than that of the first semiconductor chip 1 (FIG. 5 to FIG. 8), on the wiring board 2. Note that the minimum chip is a semiconductor chip having the smallest planar size among semiconductor chips of various sizes the wiring board 2 can mount thereon.

Also, in the first embodiment, an LGA (Land Grid Array) is described as an example of the semiconductor device, in which a plurality of lands 2i, which are external terminals, are formed on a lower surface 2b of the wiring board 2.

First, the structure of an LGA 7 on which the first semiconductor chip 1 mounting a large planar size is described, which is illustrated in FIGS. 1 to 4. The LGA 7 includes the wiring board 2 capable of mounting semiconductor chips having a plurality of types of planar sizes; the first semiconductor chip 1 having a relatively large planar size mounted on the wiring board 2; a plurality of wires 5, which are metal wires electrically connecting the first semiconductor chip 1 and the wiring board 2; and a sealing body 4 that seals the first semiconductor chip 1 and the plurality of wires 5 with a sealing resin.

Note that, as being wire-bonded, the first semiconductor chip 1 is placed with its main surface 1a facing upward. That is, the first semiconductor chip 1 is mounted in a face-up manner on the wiring board 2. Therefore, the first semiconductor chip 1 has its back surface 1b bonded onto the wiring board 2 via a die bonding material 6, which is an adhesive material.

Here, the first semiconductor chip 1 is formed of silicon, for example, and has a semiconductor integrated circuit embedded therein, such as a microcontroller. The first semiconductor chip 1 has a substantially rectangular shape in a planar view, and has the main surface 1a and the back surface 1b on the opposite side. Note that a plurality of electrode pads 1c, which are surface electrodes, are formed so as to be arranged in a line around an outer edge of the main surface 1a. The semiconductor chip 1 has a planar size (outer size) of, for example, 4.0 mm×4.0 mm.

In addition, the wires 5 are gold wires, for example, each electrically connecting the electrode pad 1c of the first semiconductor chip 1 and the bonding lead 2c of the wiring board 2 corresponding to the electrode pad 1c.

Further, the die bonding material 6 is formed by applying an adhesive material in a paste-like form, such as an epoxy-based insulating adhesive material.

Moreover, the sealing body 4 is formed by thermosetting a sealing resin having a thermosetting property, such as an epoxy-based sealing resin having a thermosetting property.

Next, the wiring board 2 is described. As illustrated in FIG. 4, the wiring board 2 has an upper surface 2a and a lower surface 2b on the opposite side to the upper surface 2a. Both of the upper surface 2a and the lower surface 2b have a rectangular shape as illustrated in FIG. 1. The structure of the wiring board 2 in a thickness direction is such that, as illustrated in FIG. 4, wiring parts 2f and the bonding leads 2c illustrated in FIG. 1 are formed on a core material 2h and its upper surface 2a side. On the other hand, the plurality of lands 2i serving as external terminals are formed on the lower surface 2b side. The wiring parts 2f and the bonding leads 2c on the upper surface 2a side and the lands 2i on the lower surface 2b side are electrically connected to each other via a via 2e or a through hole.

Note that the plurality of lands 2i on the lower surface 2b side are placed in a lattice shape as illustrated in FIG. 2 (represented by dotted lines in FIG. 2).

A solder resist film 2g to be an insulating film is formed on each of the upper surface 2a side and the lower surface 2b side. On the lower surface 2b side, the solder resist film 2g is formed around each of the plurality of lands 2i as external terminals so that they are exposed.

On the other hand, on the upper surface 2a side of the wiring board 2, a wiring pattern including the wiring parts 2f, the bonding leads 2c, the vias 2e as illustrated in FIG. 1 is formed. The solder resist film 2g is formed on a region (a hatched part of FIG. 1) having an area significantly smaller than the region of the first semiconductor chip 1 having a large area, and the region (the hatched part of FIG. 1) is formed in a rectangular shape and serves as a die bonding region in the LGA 7.

Note that the die bonding region in the LGA 7 is restricted by adopting a restriction of the die bonding region when the second semiconductor chip 3 also being as a minimum chip illustrated in FIG. 7, which will be described further below, is mounted on the wiring board 2 as a common board. That is, in the LGA 7 of the first embodiment, the die bonding region is restricted with the solder resist film 2g with reference to a minimum mountable chip (the second semiconductor chip 3). Therefore, each of the plurality of bonding leads 2c is formed on a region further outside of the rectangular solder resist film 2g defined with reference to the minimum mountable chip (the second semiconductor chip 3).

That is, the wiring board 2 has, for example, the upper surface 2a; the plurality of bonding leads 2c arranged on and around the solder resist film 2g that is formed on the region (the die bonding region) of the upper surface 2a to be applied with the die bonding material 6; the lower surface 2b on the opposite side of the upper surface 2a; and the plurality of lands 2i formed on the lower surface 2b. Furthermore, the first semiconductor chip 1 is mounted on the solder resist film 2g via the die bonding material 6. That is, the die bonding material 6 is disposed between the solder resist film 2g and the first semiconductor chip 1.

Therefore, on the wiring board 2 of the LGA 7 of the first embodiment, semiconductor chips of different planar sizes can be mounted. Here, the dimensions of the pattern of the rectangular solder resist film 2g of the wiring board 2 are smaller than the planar size of the semiconductor chip (the first semiconductor chip 1.

That is, in the LGA 7, as illustrated in FIG. 1, the solder resist film 2g of the wiring board 2 on the upper surface 2a side is formed in a rectangular shape at a substantial center of the upper surface 2a as a die bonding region (the hatched part), but no solder resist film other than the rectangular solder resist film 2g is formed on the upper surface 2a side. That is, the entire outer perimeter of the pattern of the solder resist film 2g is terminated at a position inside of the outer perimeter of the first semiconductor chip 1, and this pattern is not formed in a region outside of the first semiconductor chip 1.

In this manner, the die bonding material 6 is also in the state of being disposed inside of the outer perimeter of the first semiconductor chip 1.

Note that, when the LGA 7 is assembled, as illustrated in FIG. 4, the plurality of bonding leads 2c, the wiring parts 2f, and others are covered and protected by a part of the sealing body 4.

Here, the core material 2h in the wiring board 2 is made of, for example, a glass epoxy resin, and the solder resist film 2g is made of an epoxy-based resin or the like. Furthermore, the wiring parts 2f, the lands 2i, the via 2e, and the bonding leads 2c are made of, for example, a metal containing a copper alloy as a main ingredient.

Also, on the wiring board 2 of the LGA 7, as illustrated in FIGS. 1 and 2, the bonding leads 2c are provided in two lines outside and inside of the outer edge of the upper surface 2a. Here, the outside bonding leads 2c and the inside bonding leads 2c are connected together via the wiring parts 2f. That is, on the upper surface 2a, the plurality of bonding leads 2c are provided in two lines along the outer edge on the wiring board 2, and each of the outside bonding leads 2c and each of the inside bonding leads 2c are connected together via a relevant one of the wiring parts 2f. In this manner, each of the plurality of bonding leads 2c is formed extending in an elongated manner toward the center of the board.

In this manner, when the first semiconductor chip 1, which is a semiconductor chip having a large size, is mounted, as illustrated in FIG. 2, the electrode pads 1c of the first semiconductor chip 1 and the bonding leads 2c outside can be electrically connected to each other by the wire 5. On the other hand, even when the second semiconductor chip 3, which is a minimum chip that will be described further below, is mounted, the second semiconductor chip 3 and each of the inside bonding leads 2c can be electrically connected together by the wire 5, thereby achieving sharing of the board.

Note that the dimensions of the wiring board 2 of the LGA 7 are, for example, on the order of 5.5 mm×5.5 mm, and the LGA 7 has about 100 pins, for example.

Therefore, since routing of a wiring pattern on the upper surface 2a of the wiring board 2 has a little clearance, the plurality of vias 2e (or through holes) connected respectively to the plurality of bonding leads 2c are formed on the upper surface 2a side. The bonding leads 2c extend in directions on both sides, that is, inside and outside of the plurality of vias 2e (or through holes).

That is, the bonding leads 2c are provided in two lines outside and inside of the outer perimeter of the upper surface 2a of the wiring board 2 as illustrated in FIGS. 1 and 2, and the outside bonding leads 2c and the inside bonding leads 2c are connected together by the wiring parts 2f. On each of the wiring parts 2f connecting the outside bonding lead 2c and the inside bonding lead 2c, the via 2e (or the through hole) is formed. As illustrated in FIG. 4, this via 2e (or this through hole) is directly connected to the land 2i on the lower surface 2b side.

That is, in routing of the wiring pattern on the upper surface 2a of the wiring board 2, a pattern is also present in which the via 2e (or the through hole) is formed on the wiring part 2f connecting the outside bonding lead 2c and the inside bonding lead 2c. This can support a narrow pitch. In this pattern, as illustrated in FIG. 4, the structure is such that the land 2i is directly connected immediately below the via 2e (or the through hole) on the wiring part 2f.

Also, since the LGA 7 has the first semiconductor chip 1 having a large size mounted on the wiring board 2 as a shared board, as illustrated in FIGS. 2 and 4, a portion near an end of the first semiconductor chip 1 is disposed on the inside bonding lead 2c, and the electrode pad 1c and the outside bonding lead 2c are electrically connected together by the wire 5.

In other words, an end of the bonding lead 2c on an inner row closer to the inside is positioned under the first semiconductor chip 1. And, in a planar view, the end of the bonding lead 2c on the inner row near the inner side overlaps with the first semiconductor chip 1. Here, the solder resist film 2g representing a die bonding region is terminated in an inner region of the first semiconductor chip 1. Therefore, at the end of die bonding, a gap is formed between a lower portion of the outer perimeter of the first semiconductor chip 1 and the end closer to the inside of the bonding lead 2c on the inner row.

After that, by resin sealing, the gap is filled with a sealing resin. Therefore, after resin sealing, a part of the sealing body 4 is disposed at the outer perimeter (the outer edge) of the first semiconductor chip 1 on the back surface 1b side.

Also, as illustrated in FIG. 4, the front surface of each of the bonding leads 2 is applied with nickel-gold plating 2d. The nickel-gold plating 2d is formed so as to ensure an excellent connection with the gold wire (the wire 5).

Next, the structure in which the second semiconductor chip 3 as a minimum chip is mounted on the wiring board 2 as a shared board.

Figure 5:
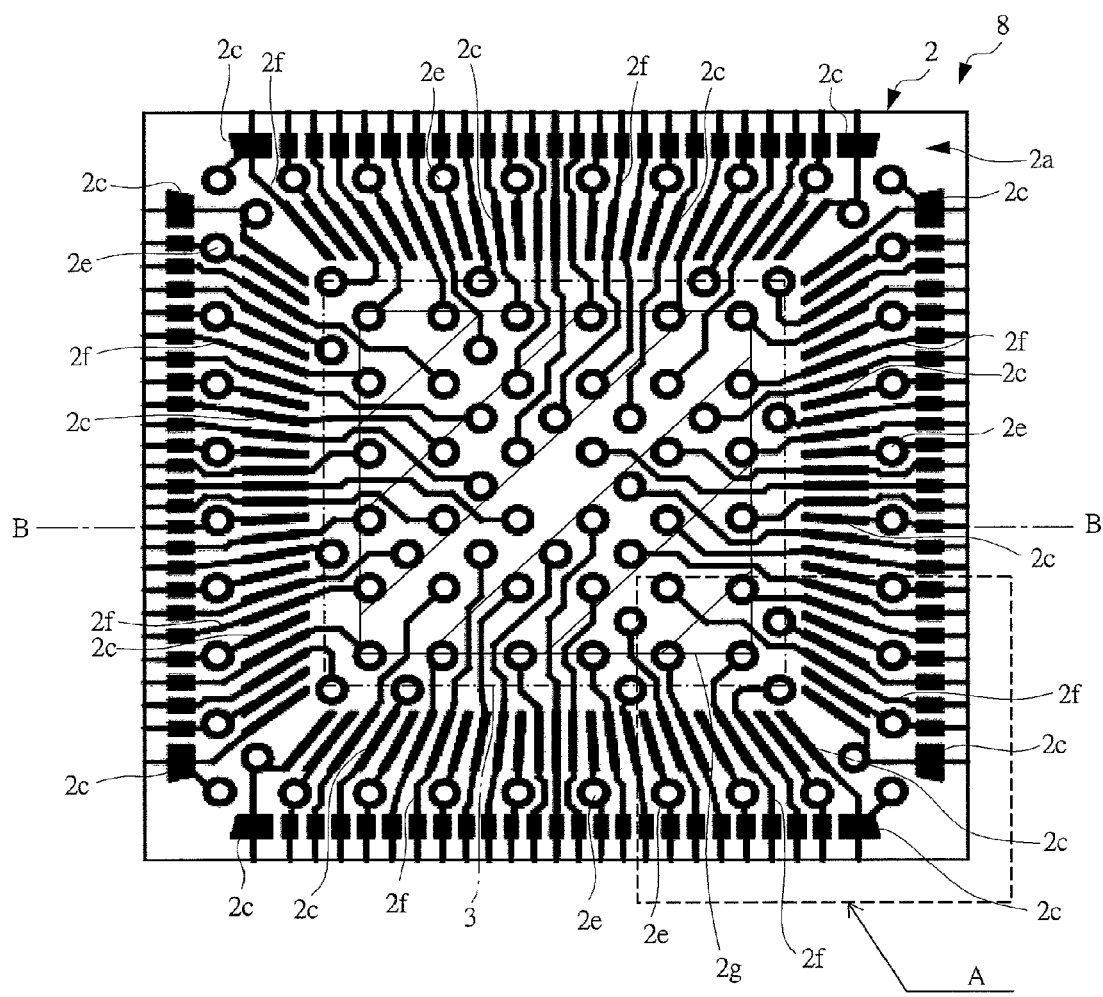
FIG. 5 is a plan view of an example of a structure of a semiconductor device (having a small chip mounted thereon) according to the first embodiment of the present invention, with a sealing body seen through and wires omitted therefrom.
Figure 6:
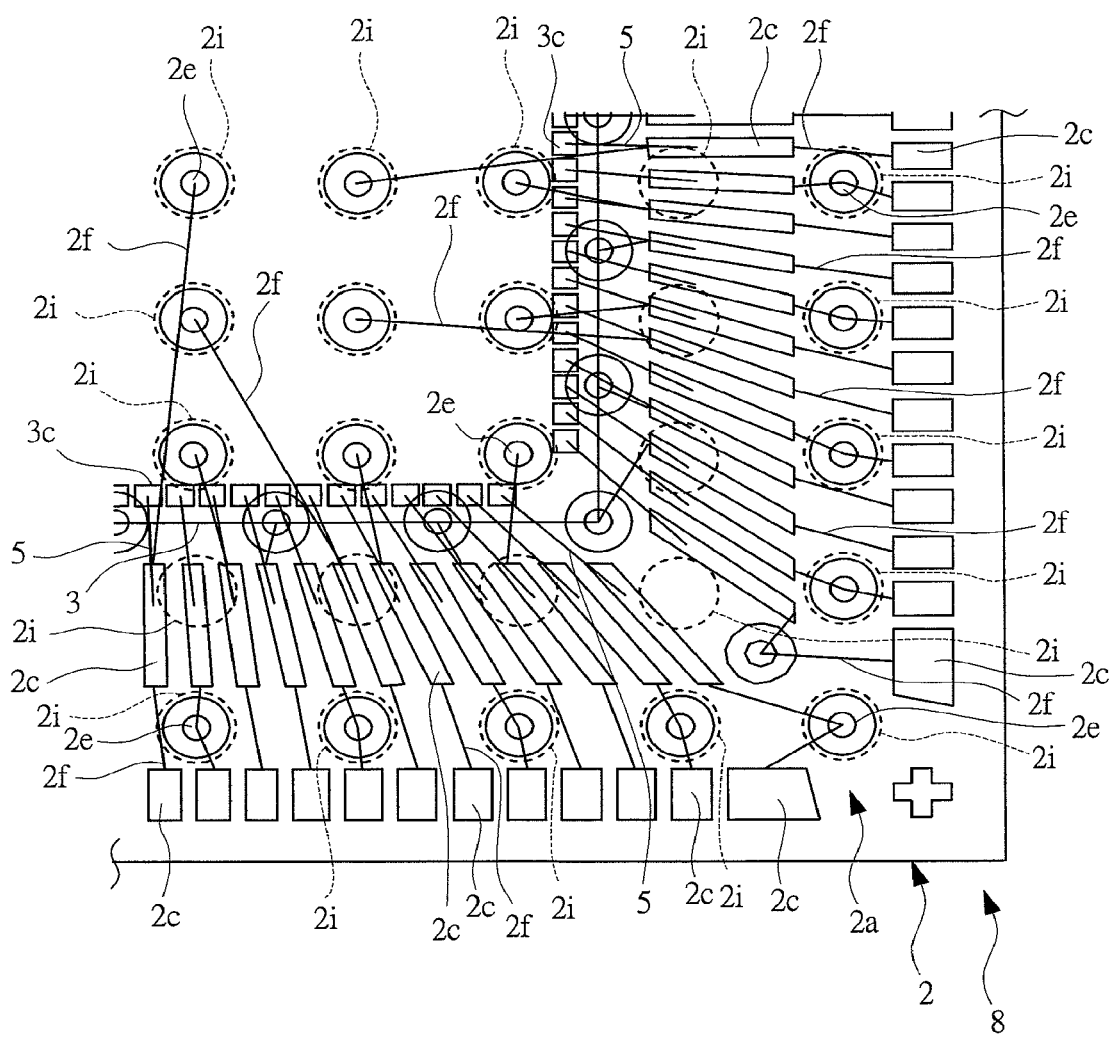
FIG. 6 is a partially enlarged plan view of an example of a structure of a part A in FIG. 5, with a solder resist film omitted therefrom and wires and lands on a lower surface added thereto.
Figure 9:
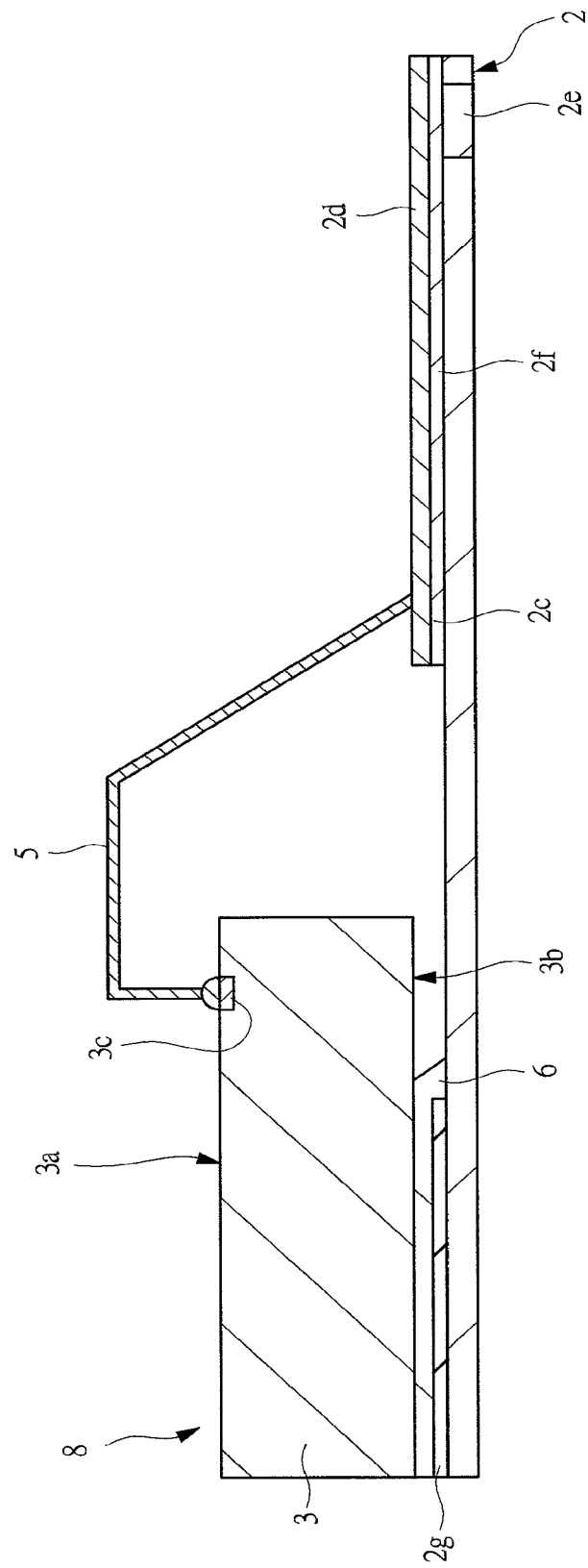
FIG. 9 is a partial cross-sectional view of the semiconductor device of FIG. 7, illustrating an example of a wire length and nickel-gold plating.
Figure 10:
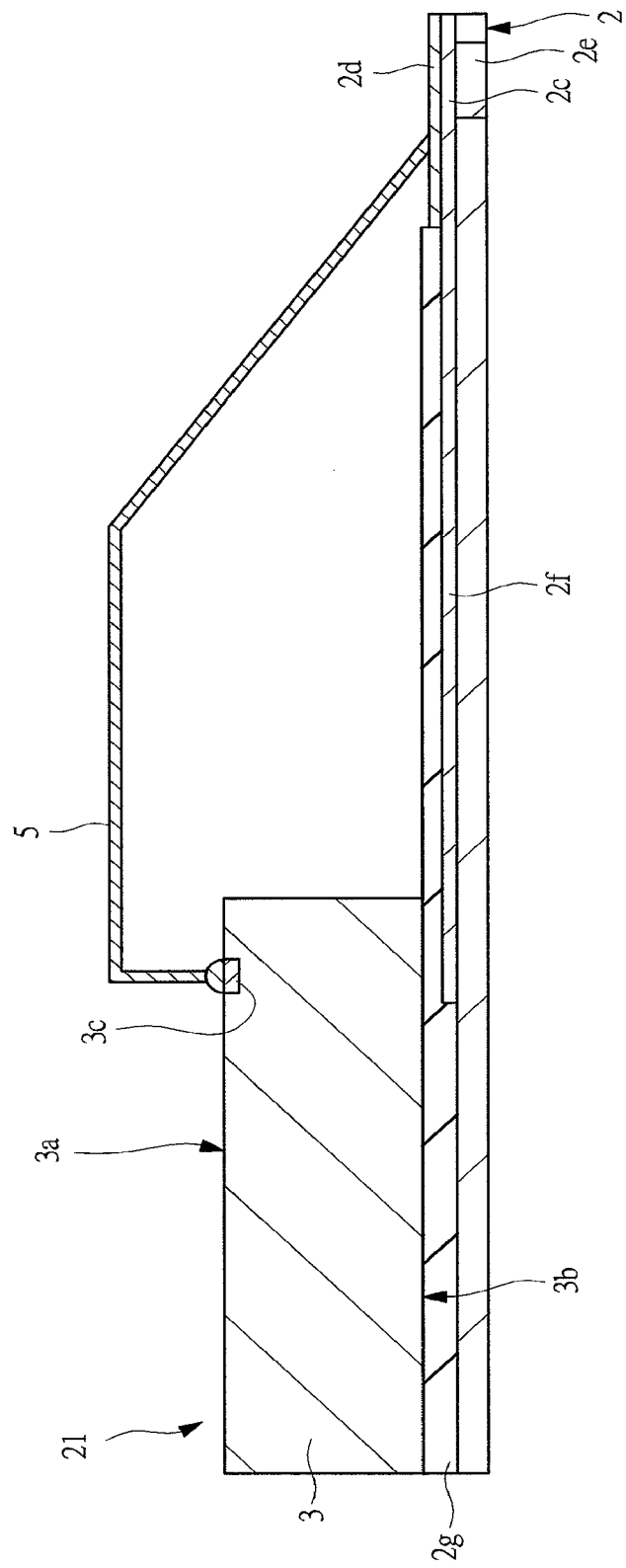
FIG. 10 is a partial cross-sectional view of a semiconductor device of a comparative example, illustrating a wire length and nickel-gold plating.
Figure 11:
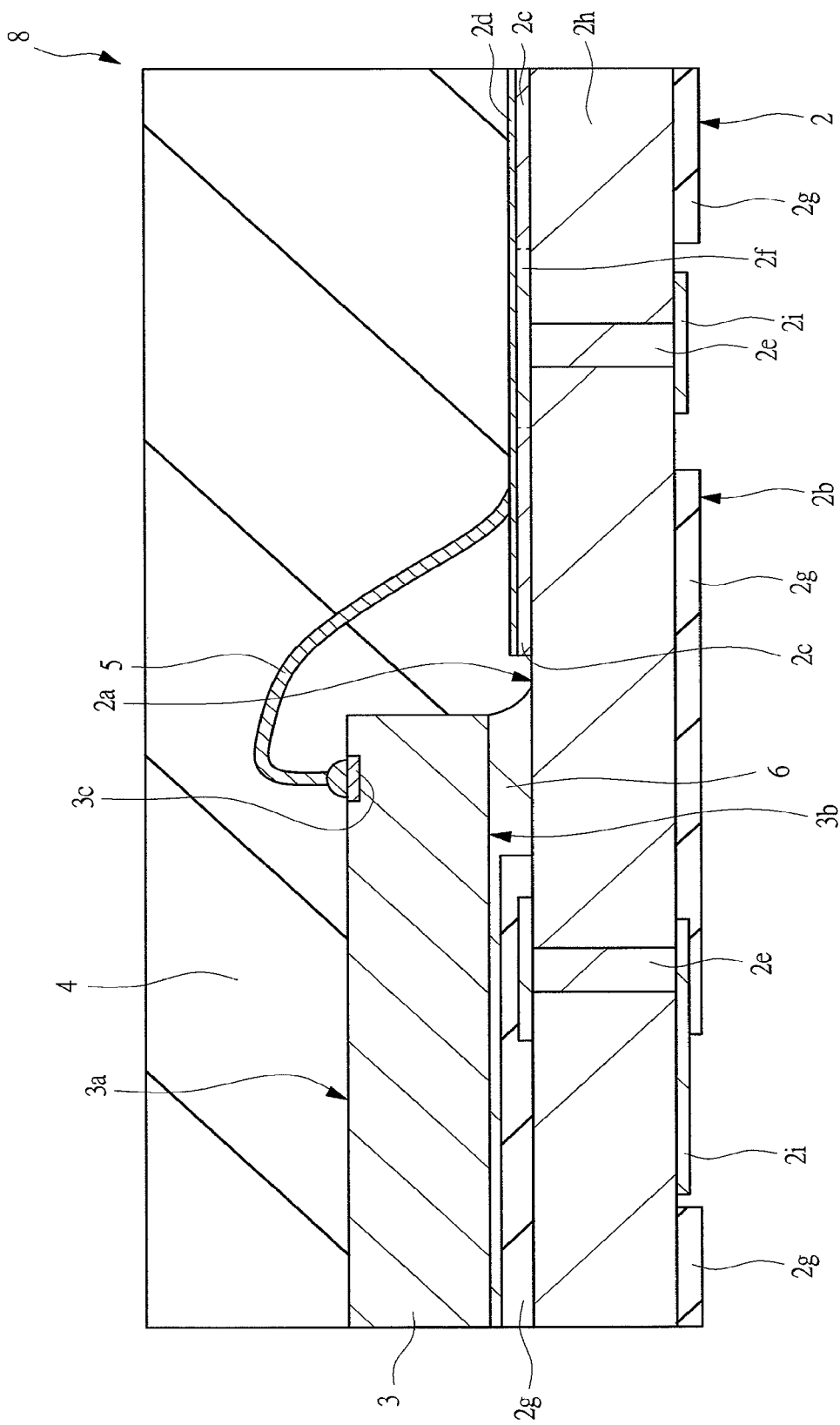
FIG. 11 is a partially enlarged cross-sectional view of a structure of a semiconductor device according to a modification example of the first embodiment of the present invention.

FIG. 5 is a plan view of an example of a structure of a semiconductor device (having a small chip mounted thereon) according to the first embodiment of the present invention, with a sealing body seen through and wires omitted therefrom. FIG. 6 is a partially enlarged plan view of an example of a structure of a part A in FIG. 5, with a solder resist film omitted therefrom and wires and lands on a lower surface added thereto. FIG. 7 is a cross-sectional view of an example of a structure cut along a line B-B of FIG. 5. FIG. 8 is a partially enlarged cross-sectional view of an example of a structure of a part A in FIG. 7. FIG. 9 is a partial cross-sectional view of the semiconductor device of FIG. 7, illustrating an example of a wire length and nickel-gold plating. FIG. 10 is a partial cross-sectional view of a semiconductor device of a comparative example, illustrating a wire length and nickel-gold plating. FIG. 11 is a partially enlarged cross-sectional view of the structure of a semiconductor device of a modification example of the first embodiment of the present invention.

First, a structure of an LGA 8 as a semiconductor device illustrated in FIGS. 5 to 8 is described. The LGA 8 has a structure similar to that of the LGA 7, and the same wiring board 2 is adopted by sharing of the board. What is different from the LGA 7 is the dimensions of the semiconductor chip to be mounted. In the LGA 8, the structure is such that the second semiconductor chip 3 as a semiconductor chip having an outer size far smaller than that of the first semiconductor chip 1 mounted on the LGA 7. Note that the second semiconductor chip 3 has dimensions in its planar direction (dimensions of a main surface 3a) of, for example, 3.0 mm×3.0 mm.

Here, a die bonding region formed of a solder resist film 2g is restricted with reference to the minimum chip (the second semiconductor chip 3) mountable on this wiring board 2. Therefore, even when the second semiconductor chip 3 as a minimum chip is mounted as illustrated in FIG. 5, the solder resist film 2g having a rectangular shape in a planar direction is disposed in a region inside the second semiconductor chip 3. That is, the outer perimeter of the rectangular solder resist film 2g is positioned inside the outer perimeter of the second semiconductor chip 3.

Figure 7:
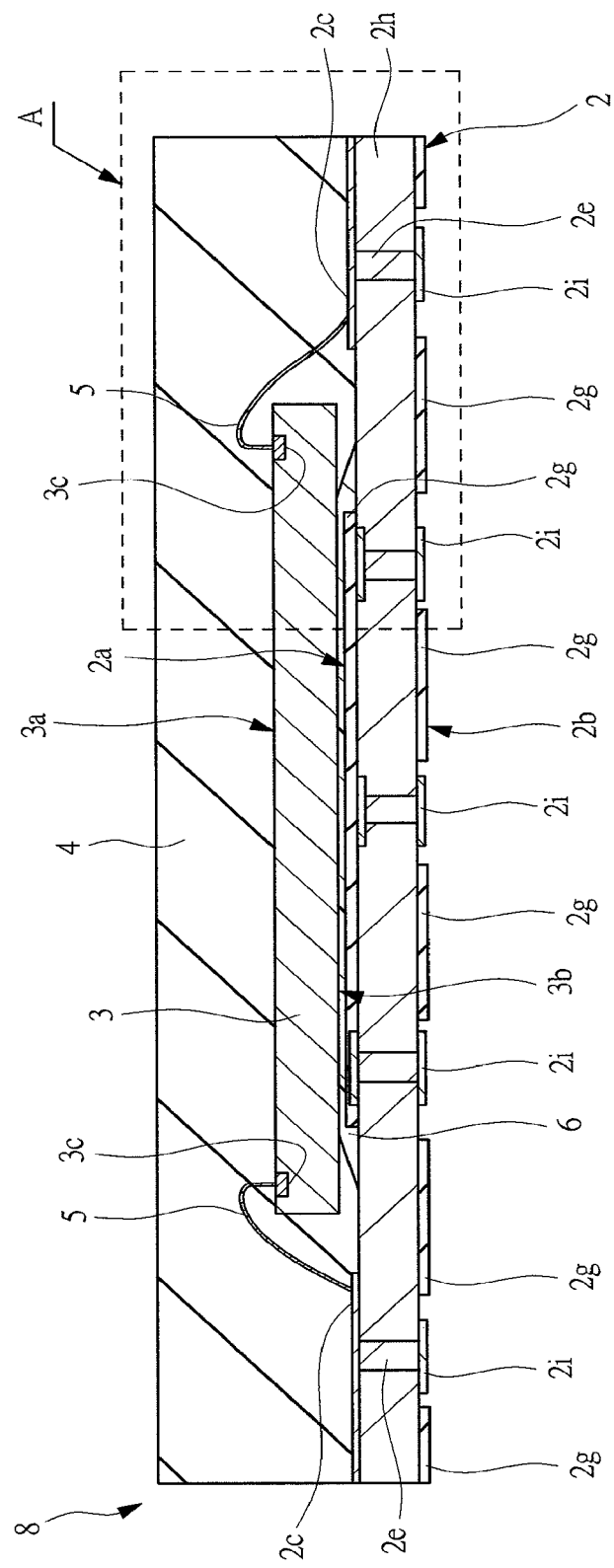
FIG. 7 is a cross-sectional view of an example of a structure cut along a line B-B of FIG. 5.
Figure 8:
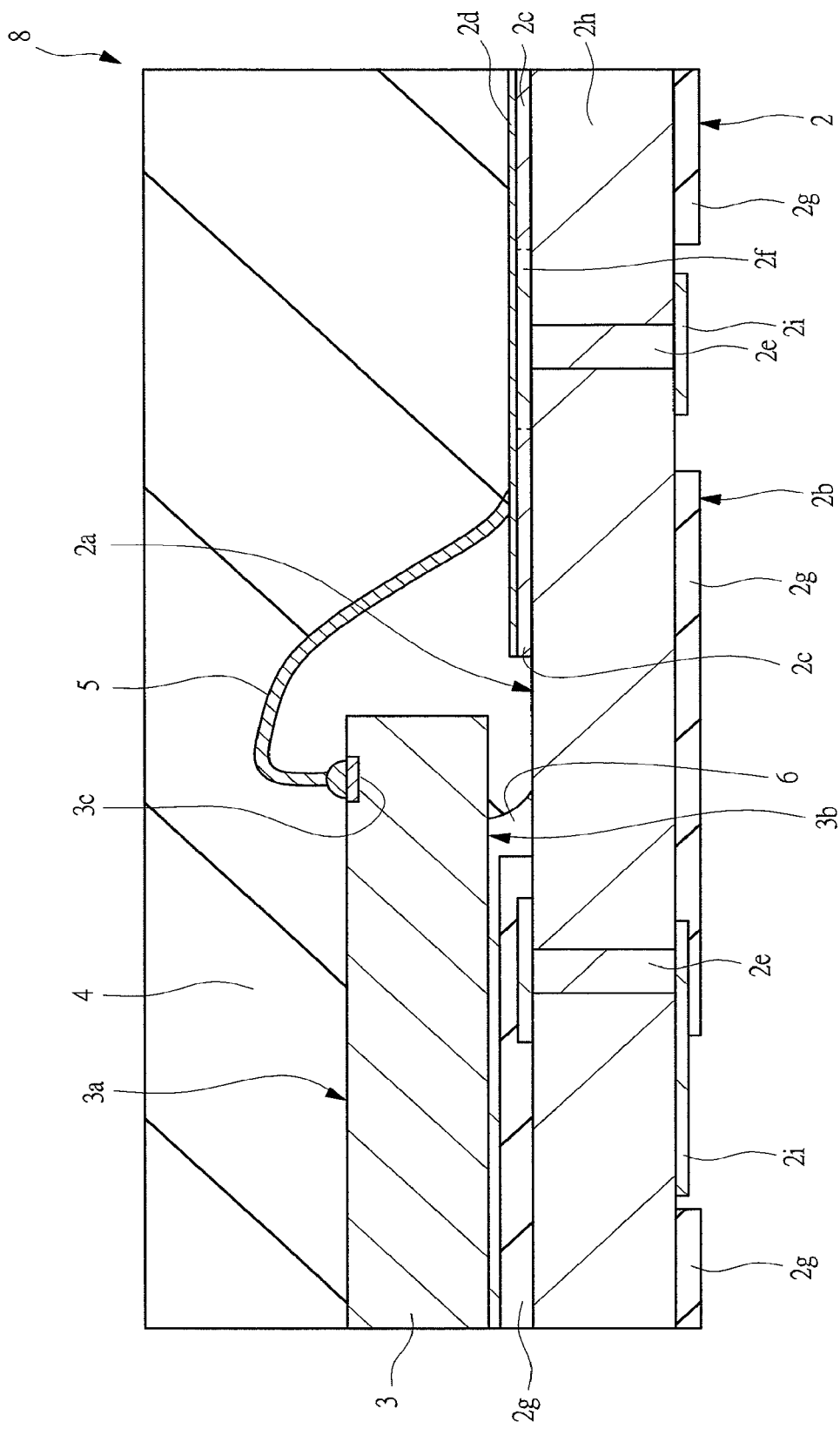
FIG. 8 is a partially enlarged cross-sectional view of an example of a structure of a part A in FIG. 7.

Therefore, as illustrated in FIGS. 7 and 8, a die bonding material 6 applied to be disposed on the solder resist film 2g is also disposed in a region inside the second semiconductor chip 3 without running off the edge of the second semiconductor chip 3.

In this manner, a back surface 3b of the second semiconductor chip 3 and the wiring board 2 are bonded via the die bonding material 6.

Also, among bonding leads 2c arranged in two lines, a plurality of the bonding leads 2c on an inner row are disposed in a region outside of an outer perimeter edge of the second semiconductor chip 3 that is a minimum chip.

In this manner, also in the second semiconductor chip 3 as a minimum chip as illustrated in FIGS. 6 to 8, its electrode pads 3c and the bonding leads 2c corresponding thereto can be electrically connected via wires 5.

Here, as illustrated in FIG. 9, in the wiring board 2 of the first embodiment, toward the rectangular solder resist film 2g as a die bonding region defined with reference to the mountable minimum chip (the second semiconductor chip 3), the bonding lead 2c on the inner row extend from an outer perimeter direction toward the center of the board. Therefore, the bonding lead 2c extends immediately near the second semiconductor chip 3. As a result, the electrode pad 3c of the second semiconductor chip 3 and the bonding lead 2c can be connected with the wire 5 being short. That is, the wire can be shortened even when the second semiconductor chip 3 as a minimum chip is mounted.

Note that FIG. 10 depicts a semiconductor package 21 of a comparative example where the second semiconductor chip 3 as a minimum chip is mounted in the semiconductor package 21 having a structure in which sharing of the board is achieved. In the semiconductor package 21, the structure is such that the bonding lead 2c is placed on the outer perimeter (the outer edge) of the wiring board 2. That is, the solder resist film 2g is formed to extend even to a region outside the second semiconductor chip 3. In this manner, the bonding lead 2c is exposed only from the outer perimeter of the board.

Therefore, when the second semiconductor chip 3 as a minimum chip is mounted, the distance between the electrode pad 3c of the second semiconductor chip 3 and the bonding lead 2c is long, resulting in a long length of the wire 5 and making it impossible to make the wire shortened.

Furthermore, in the structure of the first embodiment illustrated in FIG. 9, the length of the bonding lead 2c is longer than that of the comparative example of FIG. 10. Therefore, the amount of the nickel-gold plating 2d applied to the front surface of the bonding lead 2c is increased, making the used amount of gold seem to be increased.

However, the used amount of gold per unit length in the bonding lead 2c lengthened by sharing of the board is not much as that of the gold wire (the wire 5) per unit length. Therefore, the used amount of gold can be reduced more in the structure of the first embodiment illustrated in FIG. 9, compared with the structure of the comparative example of FIG. 10.

The structure of the LGA 8 of the first embodiment other than those described above is similar to that of the LGA 7 and is therefore not repetitively described herein.

According to the semiconductor device (the LGA 7, 8) of the first embodiment, to achieve sharing of the board so that semiconductor chips having different dimensions (such as the first semiconductor chip 1 and the second semiconductor chip 3) can be mounted, the plurality of bonding leads 2c extend toward the center of the board, respectively. Also, only the die bonding region formed of the solder resist film 2g supporting the minimum chip (the second semiconductor chip 3) is coated with the die bonding material 6. In this manner, even when a large chip (the first semiconductor chip 1) is mounted, wire bonding can be performed with having the die bonding material 6 prevented from covering the bonding leads 2c.

That is, by restricting the die bonding region with reference to the minimum chip (the second semiconductor chip 3), the die bonding material 6 can be prevented from covering the bonding leads 2c even when the maximum chip is mounted, thereby allowing wire bonding.

In this manner, even semiconductor chips having different dimensions and different pad arrangements can be mounted on the same wiring board 2, and therefore sharing of the board can be achieved.

As a result, development cost can be reduced, and cost of the semiconductor device (the LGA 7, 8) can be reduced. Also, resources regarding development of the semiconductor device can be reduced and, furthermore, development time can be shortened.

Still further, since the wire can be shortened, the used amount of the wires 5 can be reduced, and therefore the manufacture cost of the semiconductor device can be reduced.

Still further, by restricting the die bonding region, the used amount of the die bonding material 6 can be reduced, and therefore the manufacture cost of the semiconductor device can be reduced.

Still further, by restricting the die bonding region, a coefficient of thermal expansion (a) is decreased and an elastic modulus (E) is increased below the semiconductor chip. That is, since the die bonding material 6 is reduced below the semiconductor chip, the coefficient of thermal expansion (a) is decreased and, as a part of the sealing body 4 enters below the chip, the elastic modulus (E) can be increased.

That is, since a part of the sealing body 4 is placed near the outer perimeter (the outer edge) of the semiconductor chip (the first semiconductor chip 1, the second semiconductor chip 3) on the back surface side, the elastic modulus (E) can be increased.

In this manner, warping of the semiconductor device in the assembly process of the semiconductor device (the LGA 7, 8) and after singulation can be reduced. Furthermore, a temperature cycle life after implementation of the semiconductor device can be improved.

As a result, an improvement in reliability of the semiconductor device (the LGA 7, 8) can be achieved.

Still further, by restricting the die bonding region, the applied amount of the die bonding material 6 is reduced, and therefore the application time can be shortened and the process throughput can be improved. Still further, jigs and tools can be shared.

In this manner, an improvement in productivity of the semiconductor device (the LGA 7, 8) can be achieved.

Still further, since the used amount of the die bonding material 6 can be reduced, the amount of gas volatilizing at the time of heating in the die bond process can be reduced. Thus, contamination of a lead frame or contamination of a manufacturing device can be reduced.

Still further, by restricting the die bonding region, a moisture immersion route to the die bonding material 6 below the chip in the semiconductor device can be elongated, and therefore the heat resistance of the semiconductor device can be improved.

Next, a modification example of the first embodiment illustrated in FIG. 11 is described.

The modification example illustrated in FIG. 11 has a structure in which the die bonding material 6 is running off the edge of the second semiconductor chip 3. That is, the semiconductor device of the first embodiment has a condition in which the solder resist film 2g restricting the die bonding region is not disposed in an outer region of the semiconductor chip (the second semiconductor chip 3). The die bonding material 6 applied to be disposed on the solder resist film 2g may run off the edge of the semiconductor chip (the second semiconductor chip 3) (FIG. 11), or may be terminated in an inner region of the semiconductor chip (FIG. 8).

(Second Embodiment)

Figure 12:
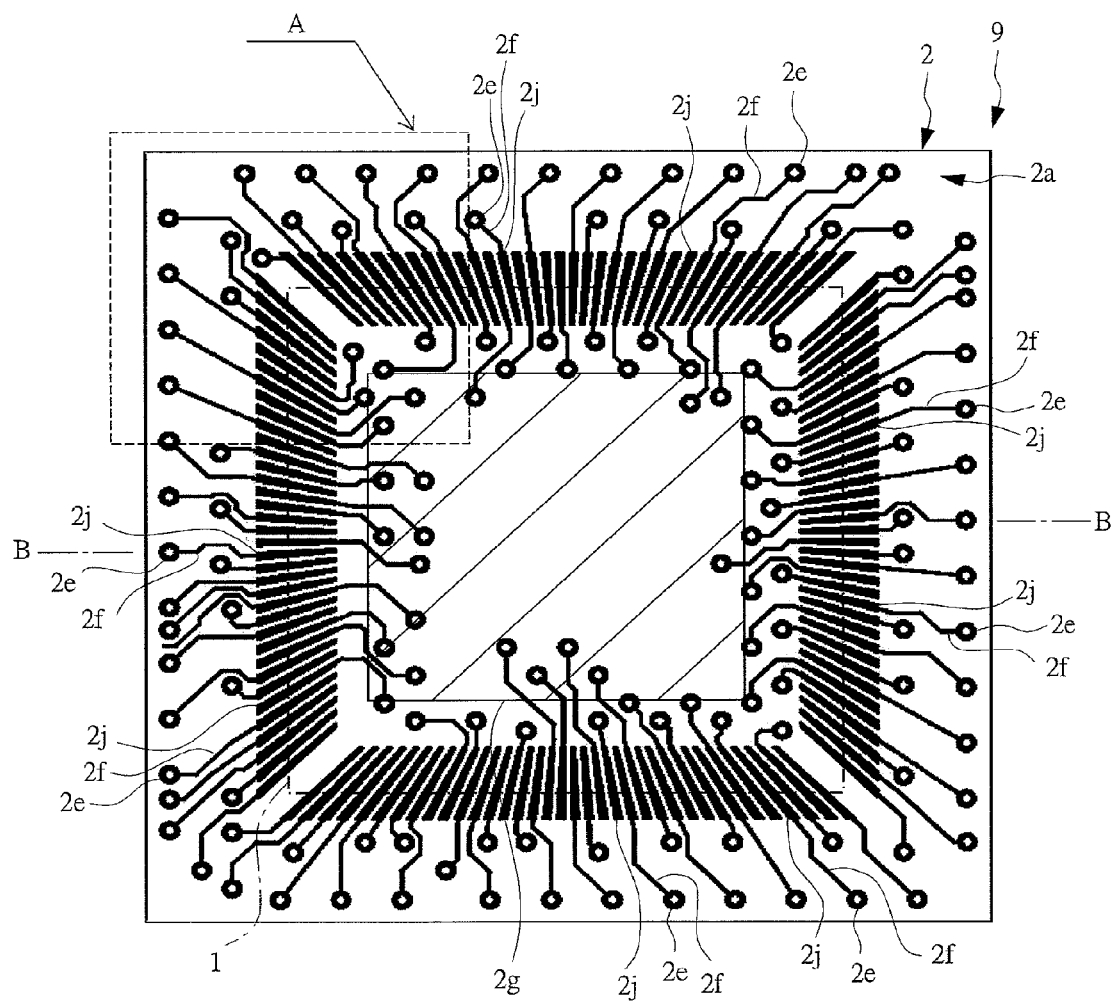
FIG. 12 is a plan view of an example of a structure of a semiconductor device (having a large chip mounted thereon) according to a second embodiment of the present invention, with a sealing body seen through and wires omitted therefrom.
Figure 13:
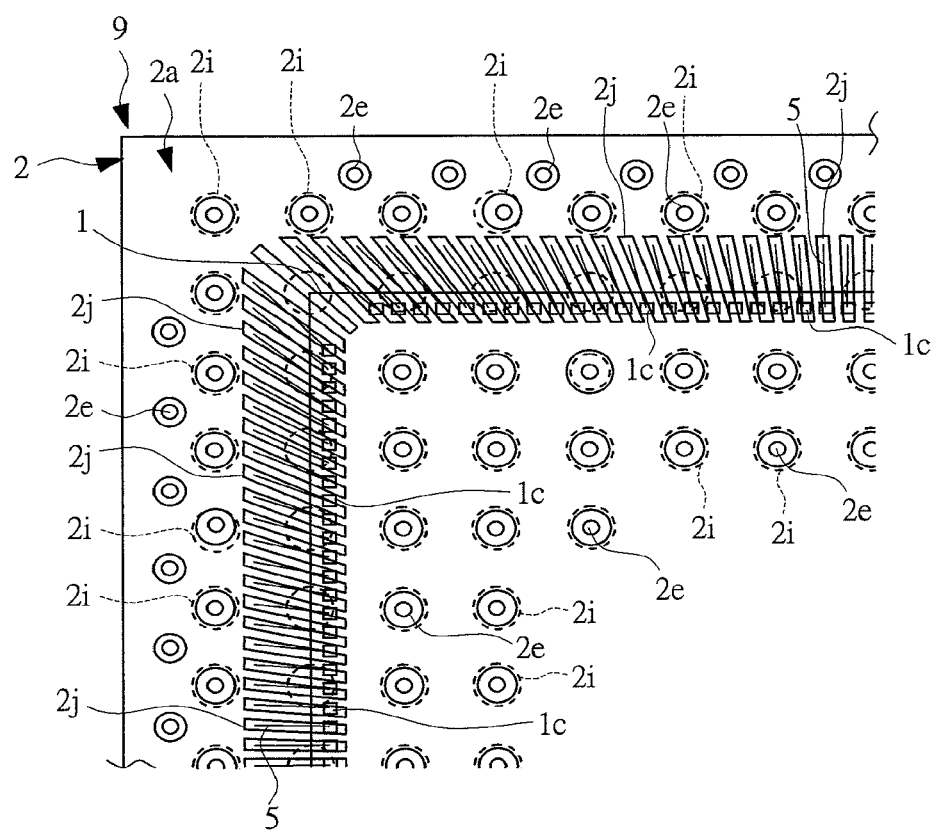
FIG. 13 is a partially enlarged plan view of an example of a structure of a part A in FIG. 12, with a solder resist film omitted therefrom and wires and lands on a lower surface added thereto.
Figure 14:
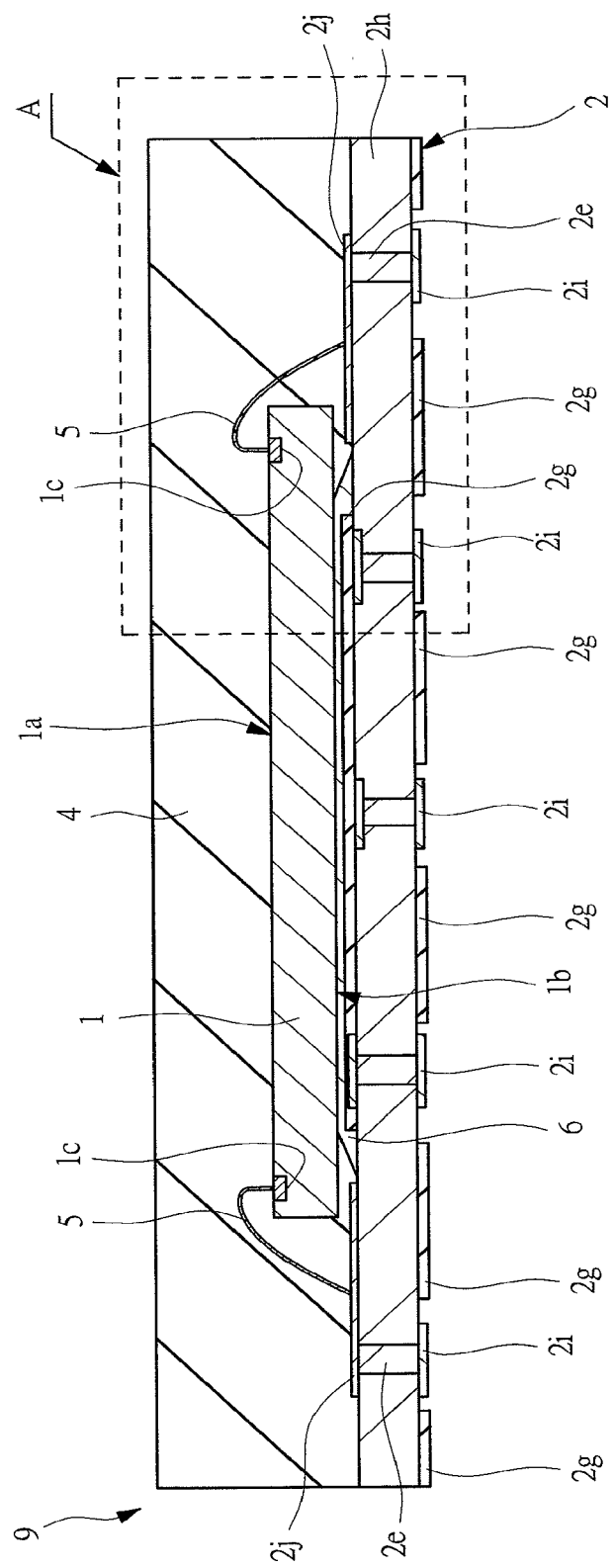
FIG. 14 is a cross-sectional view of an example of a structure cut along a line B-B of FIG. 12.
Figure 15:
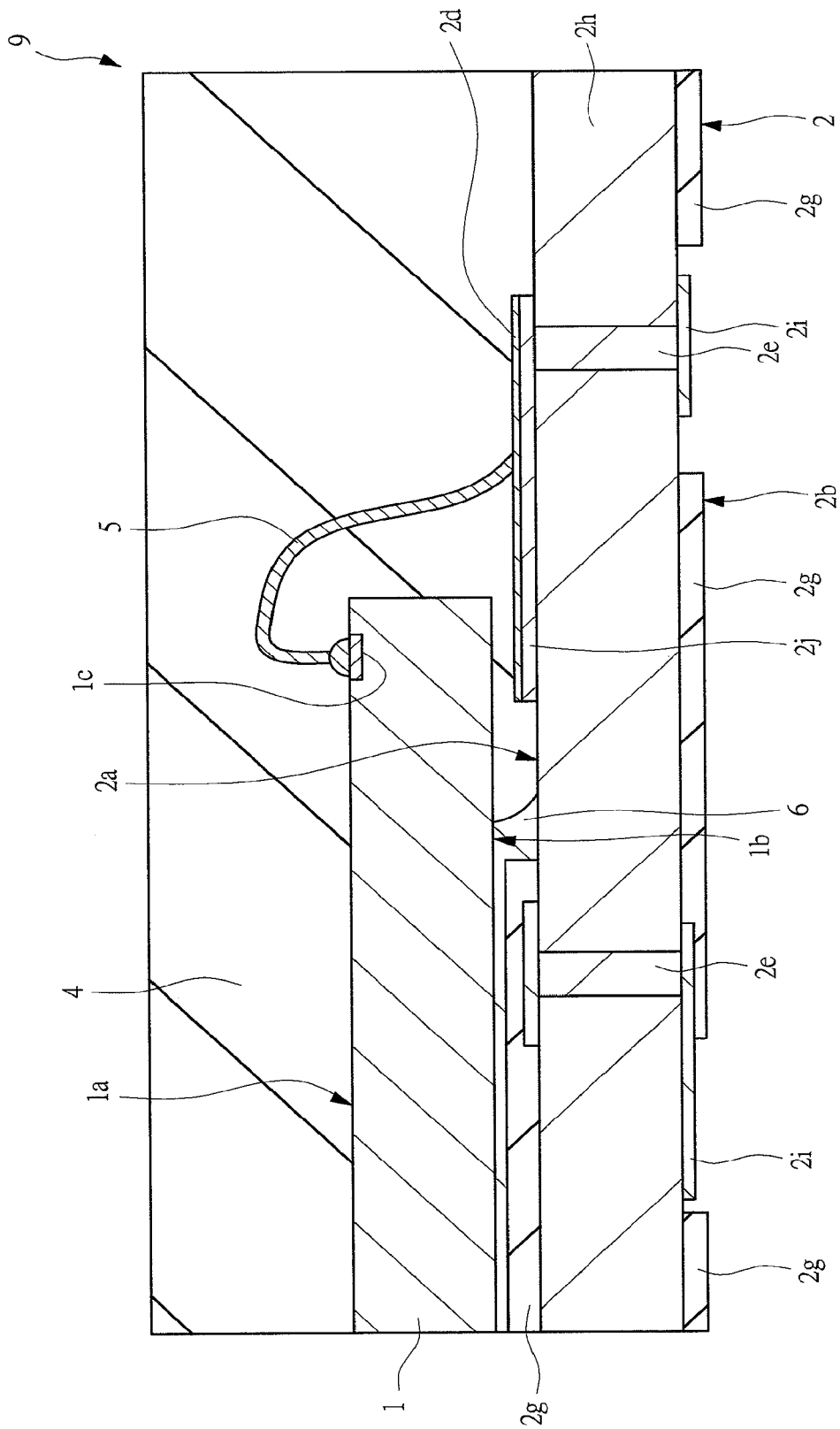
FIG. 15 is a partially enlarged cross-sectional view of an example of a structure of a part A in FIG. 14.
Figure 16:
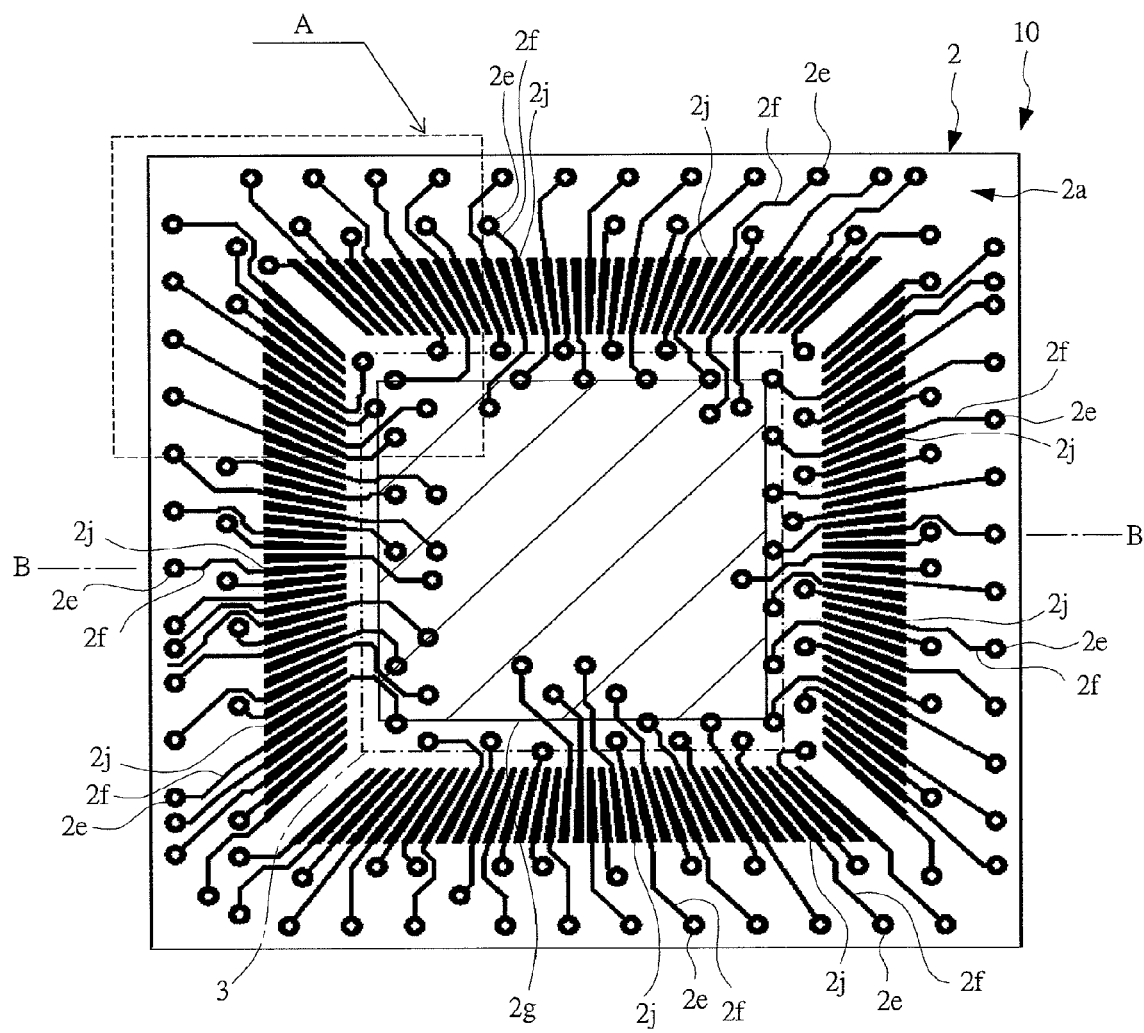
FIG. 16 is a plan view of an example of a structure of a semiconductor device (having a small chip mounted thereon) of the second embodiment of the present invention, with a sealing body seen through and wires omitted therefrom.
Figure 17:
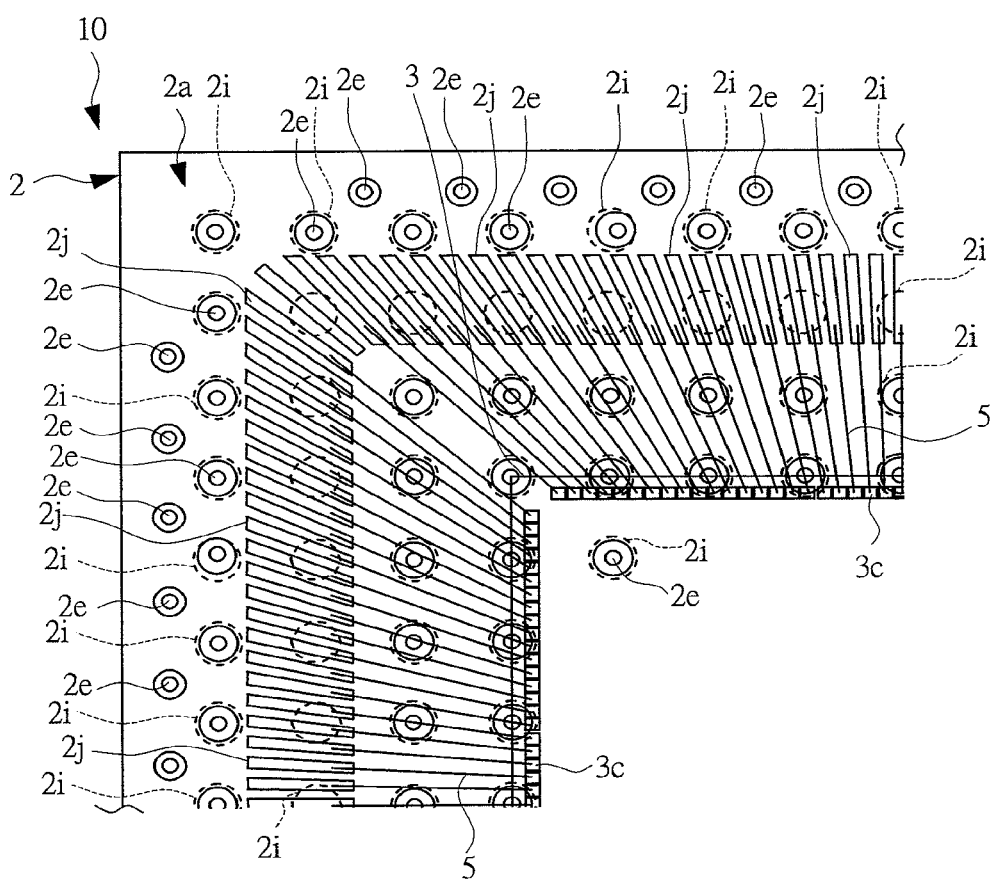
FIG. 17 is a partially enlarged plan view of an example of a structure of a part A in FIG. 16, with a solder resist film omitted therefrom, and wires and lands on a lower surface added thereto.
Figure 18:
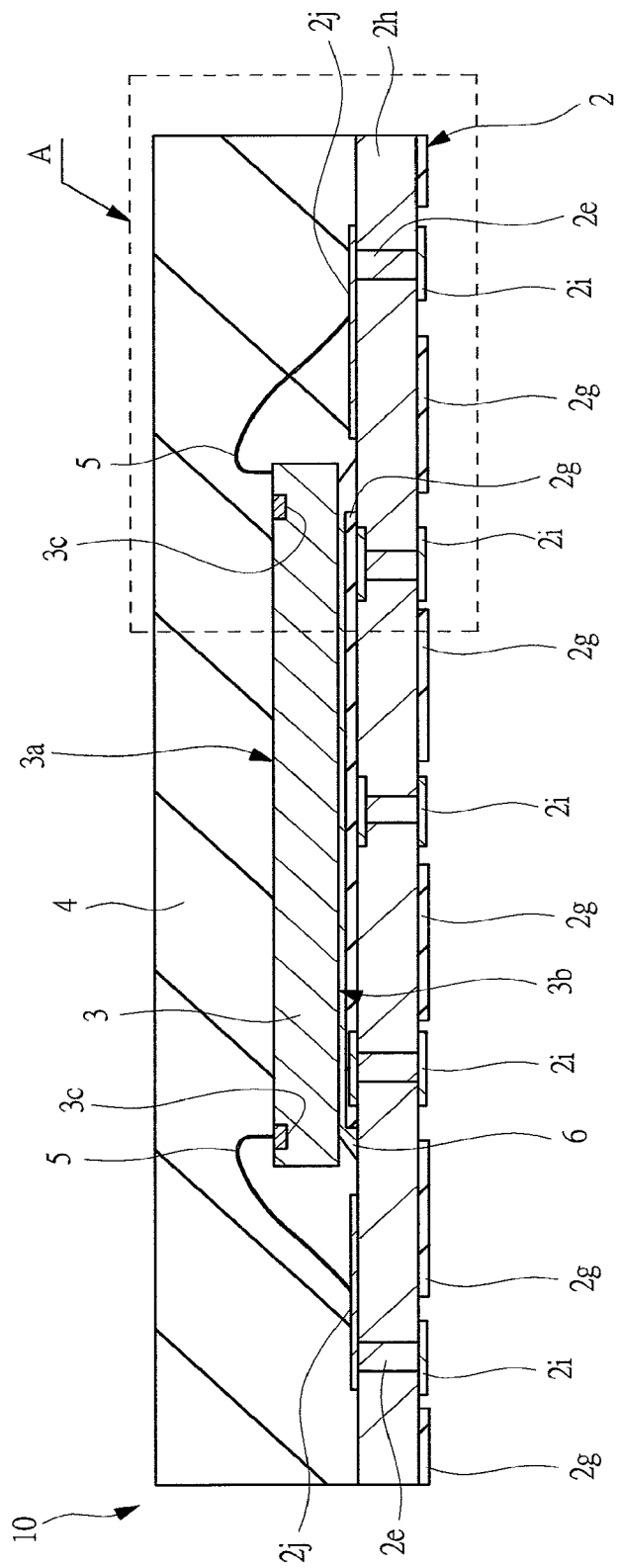
FIG. 18 is a cross-sectional view of an example of a structure cut along a line B-B of FIG. 16.
Figure 19:
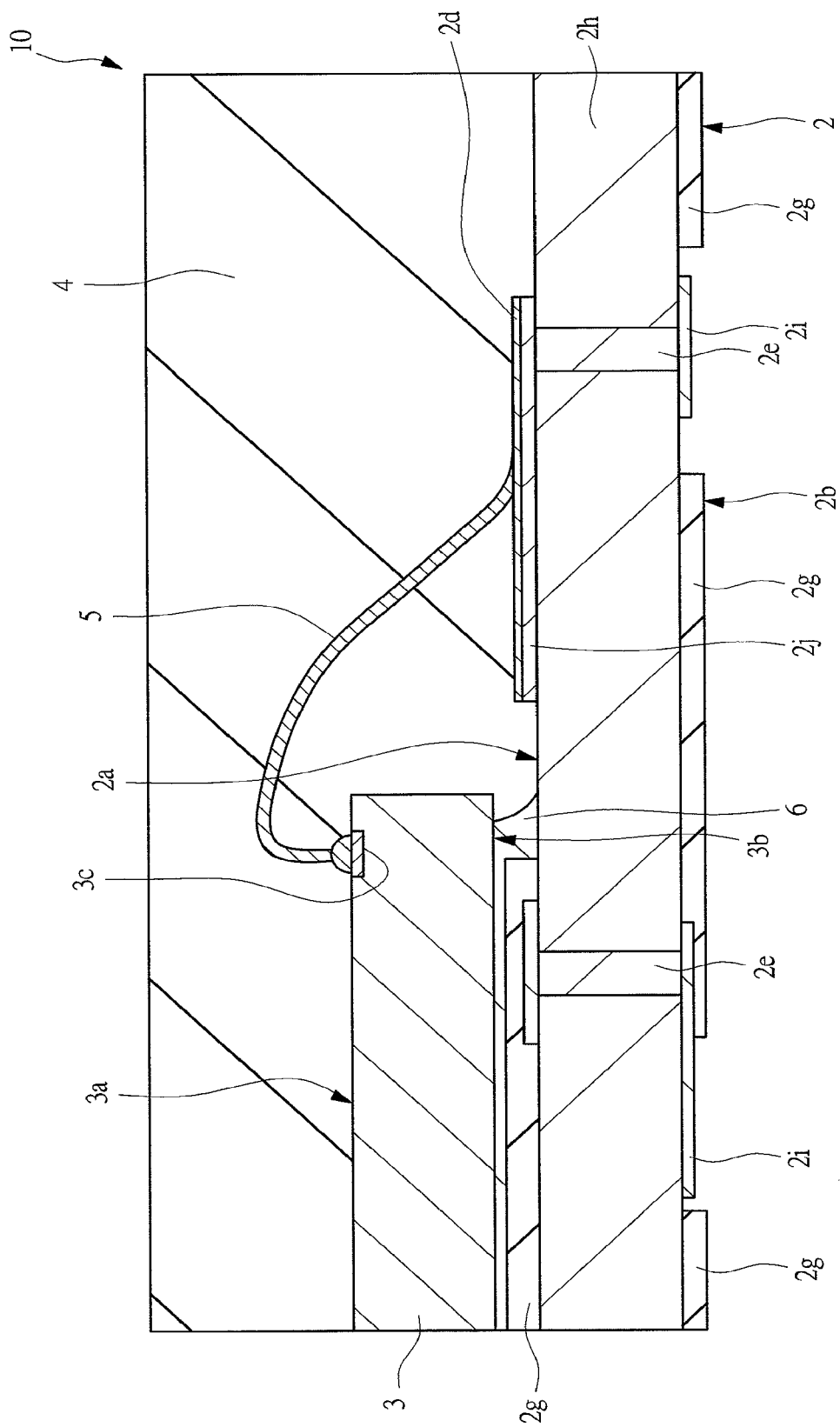
FIG. 19 is a partially enlarged cross-sectional view of an example of a structure of a part A in FIG. 18.

FIG. 12 is a plan view of an example of a structure of a semiconductor device (having a large chip mounted thereon) according to a second embodiment of the present invention, with a sealing body seen through and wires omitted therefrom. FIG. 13 is a partially enlarged plan view of an example of a structure of a part A in FIG. 12, with a solder resist film omitted therefrom and wires and lands on a lower surface added thereto. FIG. 14 is a cross-sectional view of an example of a structure cut along a line B-B of FIG. 12. FIG. 15 is a partially enlarged cross-sectional view of an example of a structure of a part A in FIG. 14. Furthermore, FIG. 16 is a plan view of an example of a structure of a semiconductor device (having a small chip mounted thereon) according to the second embodiment of the present invention, with a sealing body seen through and wires omitted therefrom. FIG. 17 is a partially enlarged plan view of an example of a structure of a part A in FIG. 16, with a solder resist film omitted therefrom and wires and lands on a lower surface added thereto. FIG. 18 is a cross-sectional view of an example of a structure cut along a line B-B of FIG. 16. FIG. 19 is a partially enlarged cross-sectional view of an example of a structure of a part A in FIG. 18.

The semiconductor device of the second embodiment has a structure with a further increased number of pins compared with the semiconductor device (the LGA 7, 8) of the first embodiment. Therefore, in order to support an increase of the number of pins, bonding leads 2$j$ of the wiring board 2 are arranged at a further narrow pitch. First, the semiconductor device illustrated in FIGS. 12 to 15 is an LGA 9 in which the first semiconductor chip 1 as a semiconductor chip having a large planar size (outer size) is mounted on the wiring board 2.

In the LGA 9, the number of pins is, for example, 177, and the package size (dimensions of the wiring board 2 in a planar direction) is, for example, 8.0 mm×8.0 mm. Furthermore, the first semiconductor chip 1 as a large semiconductor chip to be mounted has dimensions of, for example, 6.0 mm×6.0 mm.

As illustrated in FIGS. 12 and 13, along with an increase of the number of pins, the bonding leads 2$j$ in the wiring board 2 of the LGA 9 are arranged at a further narrow pitch. Therefore, each bonding lead 2$j$ cannot extend toward the center of the board as long as the bonding lead on the wiring board 2 of the first embodiment.

That is, although each of the bonding leads 2$j$ on the wiring board 2 is formed in an elongated lead shape, since the lead pitch between adjacent bonding leads 2$j$ is narrow, the length of extension of the bonding lead 2$j$ in a direction toward the center of the board is shorter than that of the wiring board 2 of the first embodiment.

Also in the LGA 9 of the second embodiment, as illustrated in FIG. 12, on the upper surface 2$a$ side of the wiring board 2, a wiring pattern including the wiring parts 2$f$, the bonding leads 2$j$, the vias 2$e$ is formed. The solder resist film 2$g$ is formed on a region (a hatched part of FIG. 12) having an area significantly smaller than the region of the first semiconductor chip 1 having a large area, and the region (the hatched part of FIG. 12) is formed in a rectangular shape and serves as a die bonding region in the LGA 9.

That is, also in the LGA 9, the die bonding region is restricted by adopting a restriction of the die bonding region with reference to the case of mounting the second semiconductor chip 3 being also as a minimum chip illustrated in FIG. 16, which will be described further below, on the wiring board 2 as a shared board. That is, the die bonding region is restricted with reference to a minimum chip (the second semiconductor chip 3). Therefore, also in the LGA 9, each of the plurality of bonding leads 2$j$ is disposed at a narrow pitch on a region further outside of the rectangular solder resist film 2$g$ defined with reference to the minimum mountable chip (the second semiconductor chip 3).

Note that, as illustrated in FIGS. 13 to 15, in the LGA 9 having the structure in which the first semiconductor chip 1 as a large chip is mounted, an end of the bonding lead 2$j$ near an inner side is positioned under the first semiconductor chip 1 and, in a planar view, the end of the bonding lead 2$j$ closer to the inside overlaps with the first semiconductor chip 1. Here, the outer perimeter of the solder resist film 2$g$ representing a die bonding region is terminated in an inner region of the first semiconductor chip 1. Therefore, the die bonding material 6 applied onto the solder resist film 2$g$ is also within the inner region of the first semiconductor chip 1. Therefore, a part of the sealing body 4 is disposed near the outer perimeter (the outer edge) of the first semiconductor chip 1 on the back surface 1$b$ side.

Furthermore, the electrode pad 1$c$ of the first semiconductor chip 1 and the bonding lead 2$j$ are electrically connected together with the wire 5.

The structure of the LGA 9 of the second embodiment other than those described above is similar to that of the LGA 7 of the first embodiment and is therefore not repetitively described herein.

Next, the structure is described in which the second semiconductor chip 3 as a minimum chip is mounted on the wiring board 2 of the second embodiment.

FIGS. 16 to 19 illustrate an LGA 10 having a second semiconductor chip 3 as a minimum chip mounted on the wiring board 2 of the second embodiment. The second semiconductor chip 3 as a minimum chip has a planar size of, for example, 4 mm×4 mm.

Also in the LGA 10, the solder resist film 2$g$ is formed on a region (a hatched part of FIG. 16) having an area significantly smaller than the region of the second semiconductor chip 3 having a small area, and the region (the hatched part of FIG. 16) is formed in a rectangular shape and serves as a die bonding region in the LGA 10.

That is, also in the LGA 10, since the die bonding region is restricted with reference to the case of mounting the second semiconductor chip 3 as a minimum chip on the wiring board 2 as a shared board, the outer perimeter of the rectangular solder resist film 2$g$ as a die bonding region is terminated in an inner region of the second semiconductor chip 3.

Therefore, the outer perimeter of the die bonding material 6 applied to be disposed onto the solder resist film 2$g$ is positioned in the inner region of the second semiconductor chip 3 as illustrated in FIG. 19. However, the die bonding material 6 may be disposed so as to run off the edge of the second semiconductor chip 3 to the extent of not covering the bonding lead 2$j$.

Note that, in the structure in which the second semiconductor chip 3 as a minimum chip is mounted on the wiring board 2, the plurality of bonding leads 2$j$ are arranged around the outside of the second semiconductor chip 3 as illustrated in FIG. 16, and electrode pads 3$c$ of the second semiconductor chip 3 and their corresponding bonding leads 2$j$ are electrically connected respectively with the wires 5 as illustrated in FIG. 17.

Here, in the wiring board 2 of the second embodiment, the lead pitch is narrower compared with the wiring board 2 of the first embodiment, and therefore the bonding lead 2$j$ cannot extend toward the center of the board as long as that of the wiring board 2 of the first embodiment.

Therefore, the length of each wire 5 cannot be shortened as much as the LGA 8 of the first embodiment (refer to FIG. 8).

However, as compared with the wire length of the semiconductor package 21 of the comparative example of FIG. 10, the wire can be shortened in the LGA 10 of the second embodiment.

The structure of the LGA 10 of the second embodiment other than those described above is similar to that of the LGA 8 of the first embodiment and is therefore not repetitively described herein.

According to the semiconductor device (the LGA 9, 10) of the second embodiment, to achieve sharing of the board so that semiconductor chips having different dimensions (such as the first semiconductor chip 1 and the second semiconductor chip 3) can be mounted, each of the plurality of bonding leads 2j is extended toward the center of the board. Also, only the die bonding region foamed of the solder resist film 2g supporting the minimum chip (the second semiconductor chip 3) is applied with the die bonding material 6. In this manner, even when a large chip (the first semiconductor chip 1) is mounted, wire bonding can be performed having the die bonding material 6 being prevented from covering the bonding leads 2j.

That is, also in the second embodiment, by restricting the die bonding region with reference to the minimum chip (the second semiconductor chip 3), the die bonding material 6 can be prevented from covering the bonding leads 2j even when the maximum chip is mounted, thereby allowing wire bonding.

In this manner, even semiconductor chips having different dimensions and different pad arrangements can be mounted on the same wiring board 2, and therefore sharing of the board can be achieved.

As a result, a development cost can be reduced, and a cost of the semiconductor device (the LGA 9, 10) can be reduced. Also, resources regarding development of the semiconductor device can be reduced and, furthermore, development time can be shortened.

Still further, since the wire can be shortened also in the semiconductor device (the LGA 9, 10) of the second embodiment, the used amount of the wires 5 can be reduced, and therefore a manufacture cost of the semiconductor device can be reduced.

Still further, by restricting the die bonding region, the used amount of the die bonding material 6 can be reduced, and therefore a manufacture cost of the semiconductor device can be reduced.

Effects obtained from the semiconductor device of the second embodiment other than those described above are similar to those obtained from the semiconductor device of the first embodiment and are therefore not repetitively described herein.

(Third Embodiment)

Figure 21:
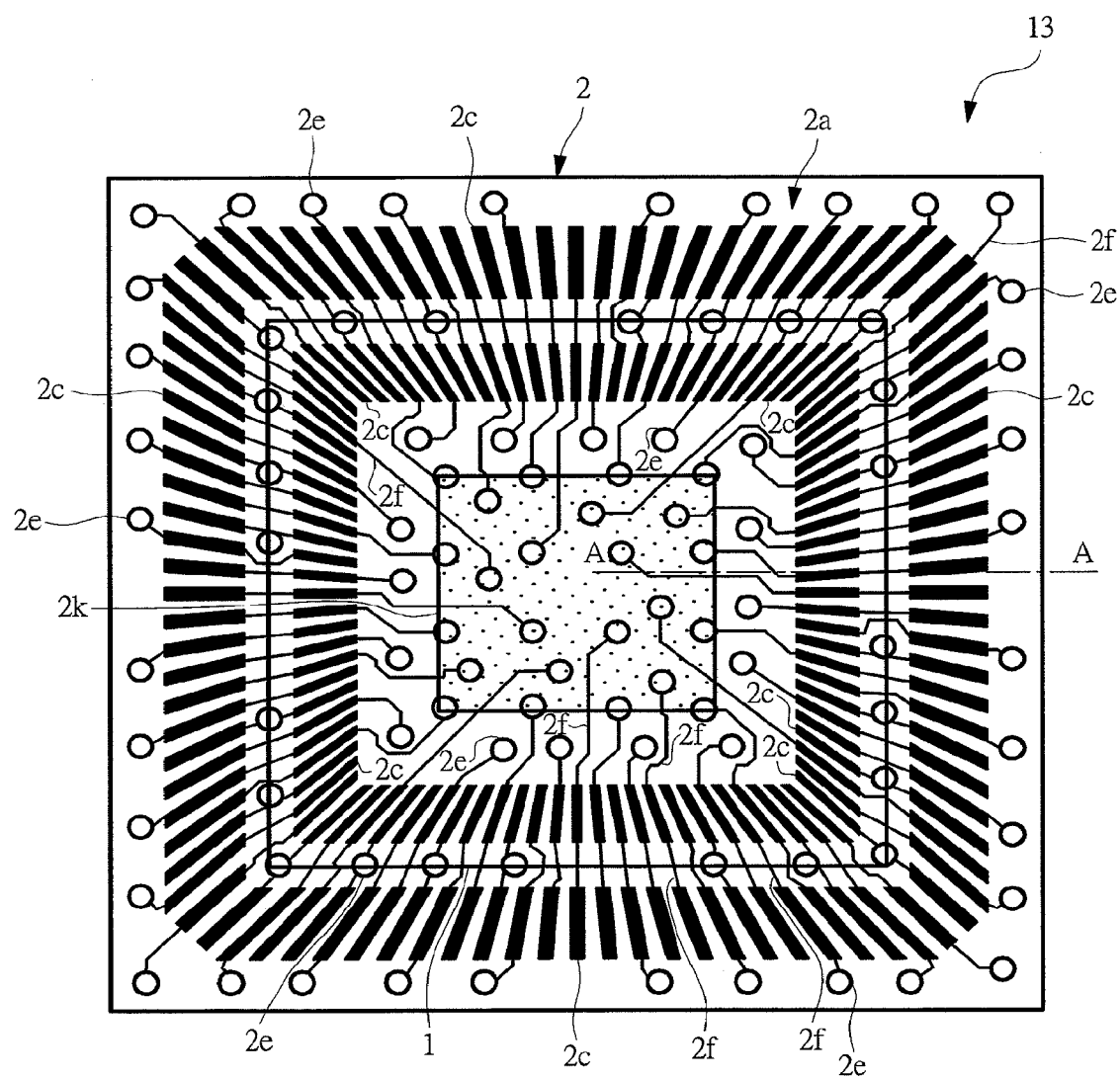
FIG. 21 is a plan view of an example of structure of a semiconductor device (having a large chip mounted thereon) of a third embodiment of the present invention, with a sealing body seen through and wires omitted therefrom.
Figure 22:
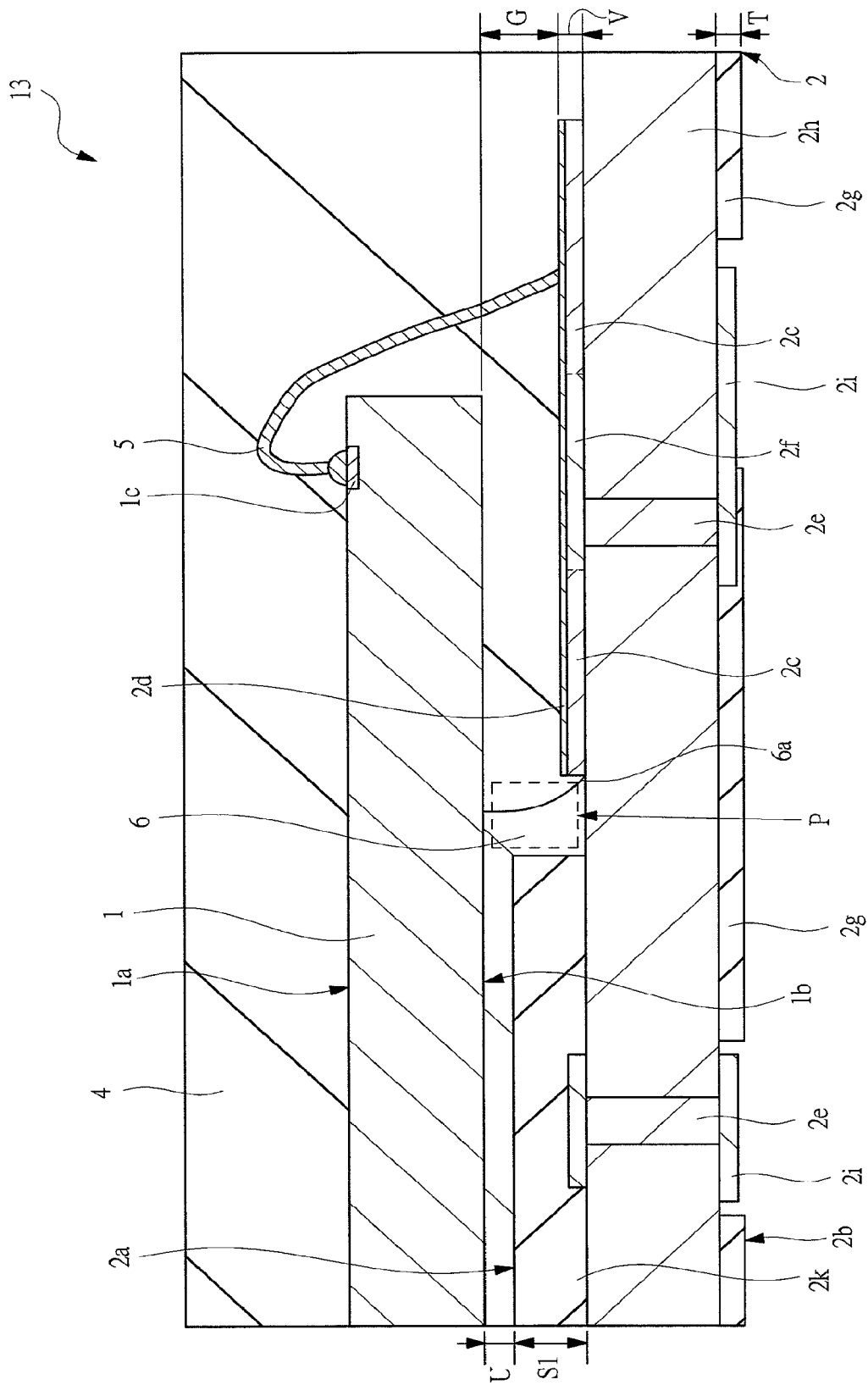
FIG. 22 is a partial cross-sectional view of an example of a structure cut along a line A-A of FIG. 21.
Figure 23:
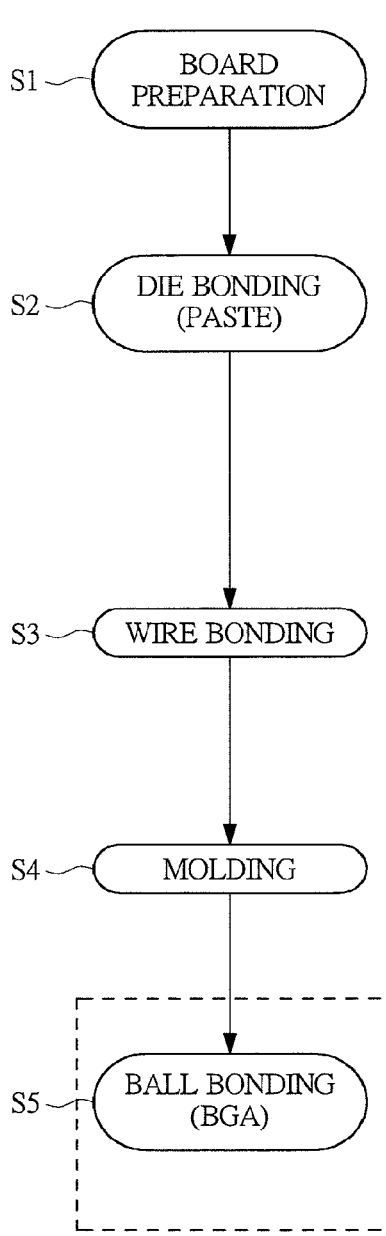
FIG. 23 is a manufacturing flow of an example of a procedure of assembling the semiconductor device of FIG. 21.
Figure 23:
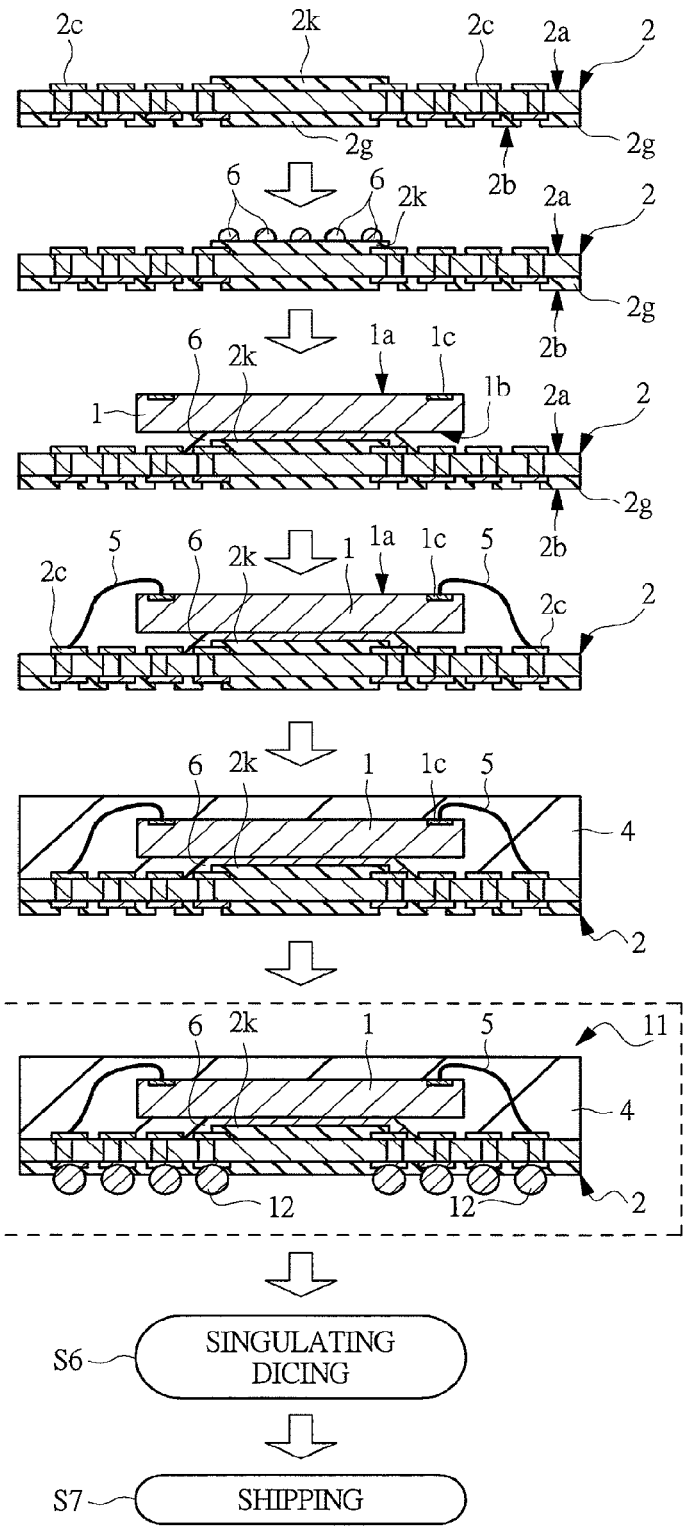
Figure 24:
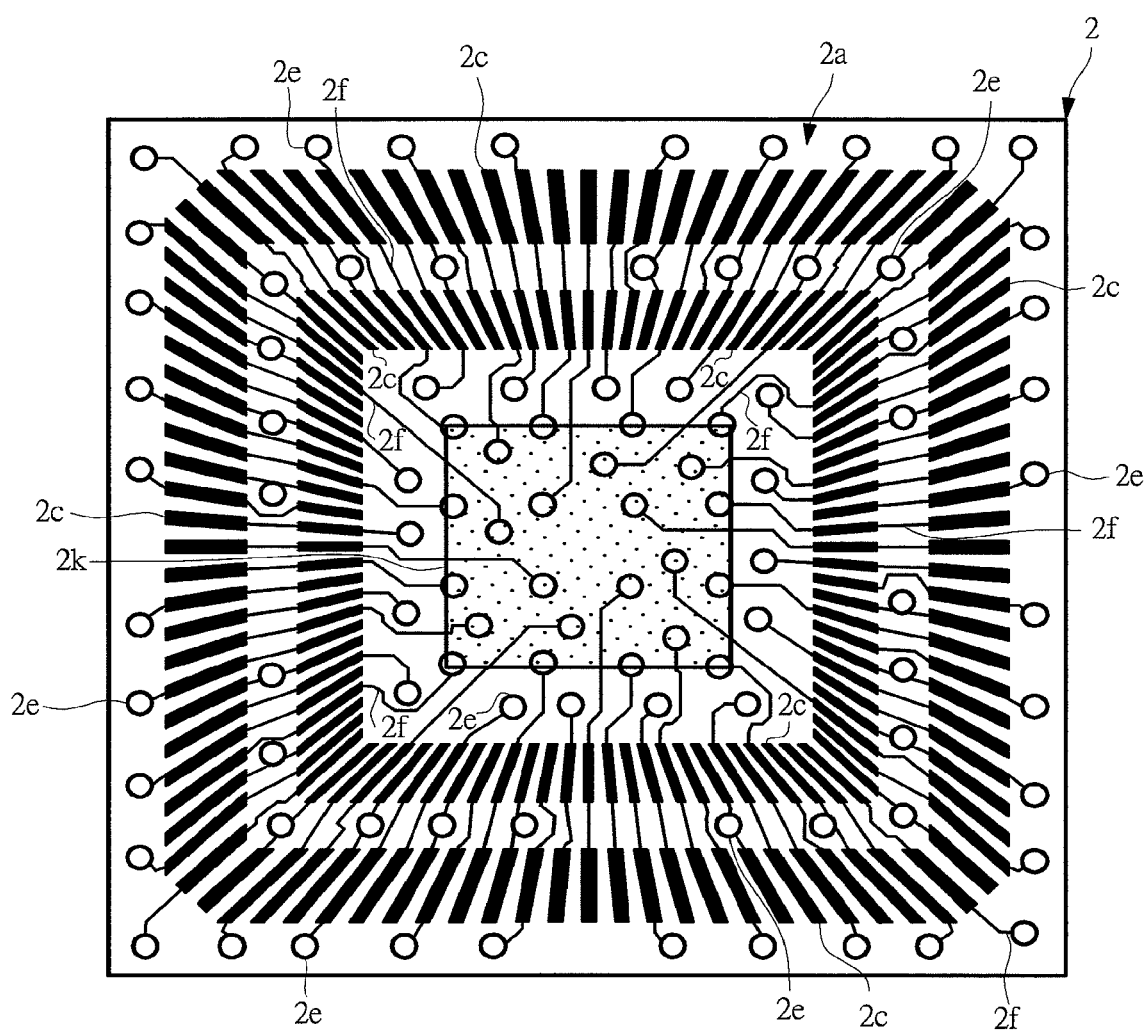
FIG. 24 is a plan view of an example of a structure of a wiring board for use in assembling of FIG. 23.
Figure 25:
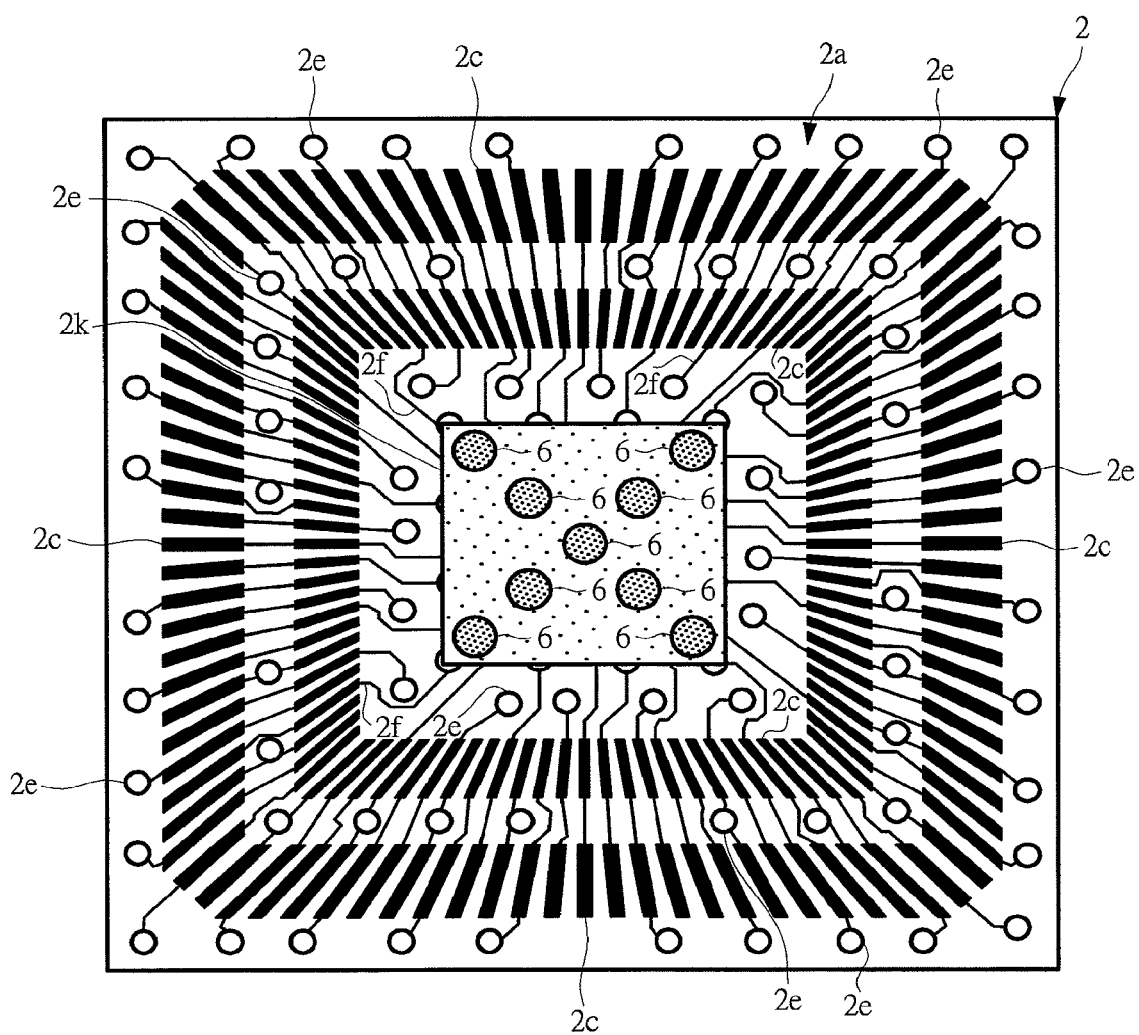
FIG. 25 is a plan view of an example of a structure after applying a die bonding material in assembling of FIG. 23.
Figure 26:
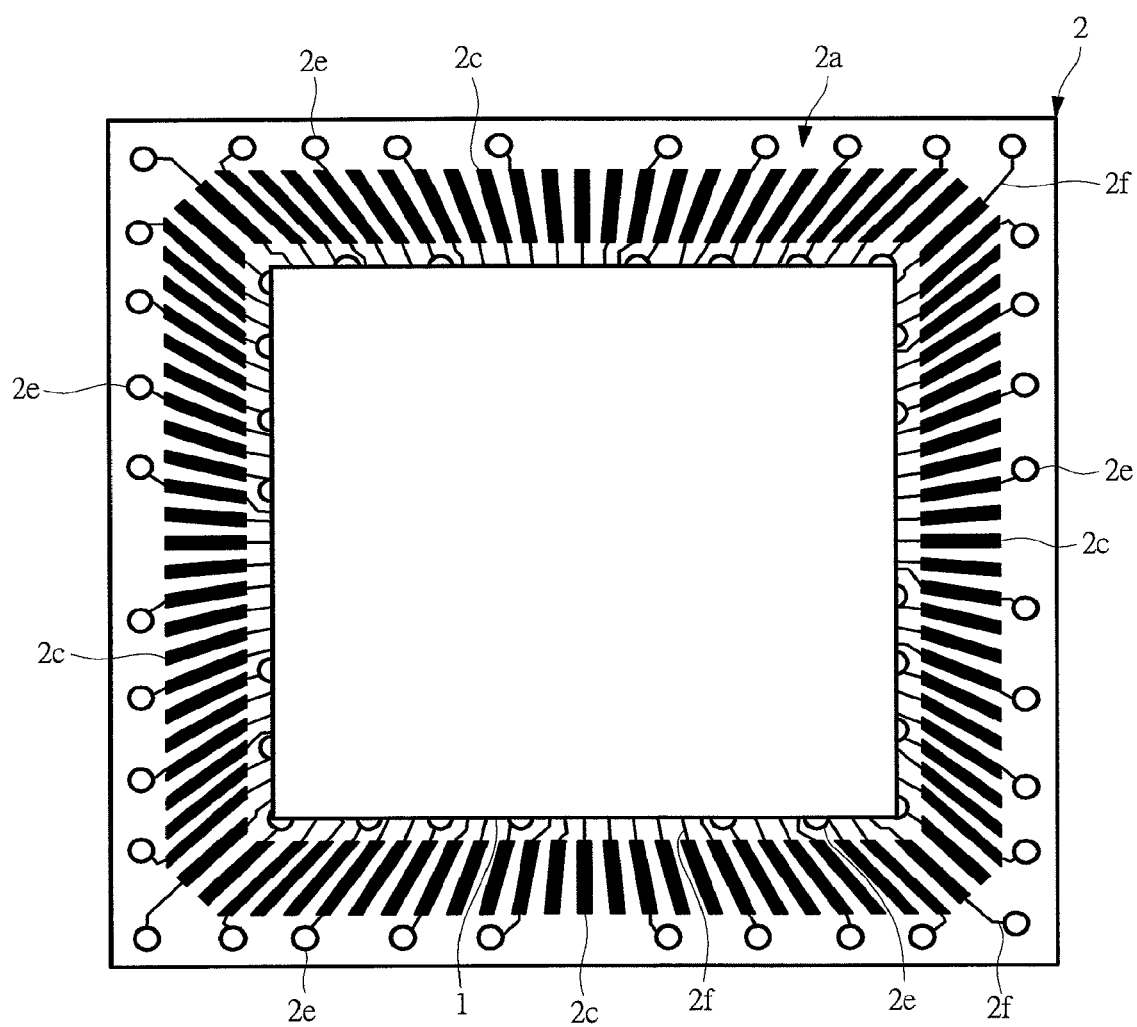
FIG. 26 is a plan view of an example of a structure after die bonding in the assembling of FIG. 23.
Figure 27:
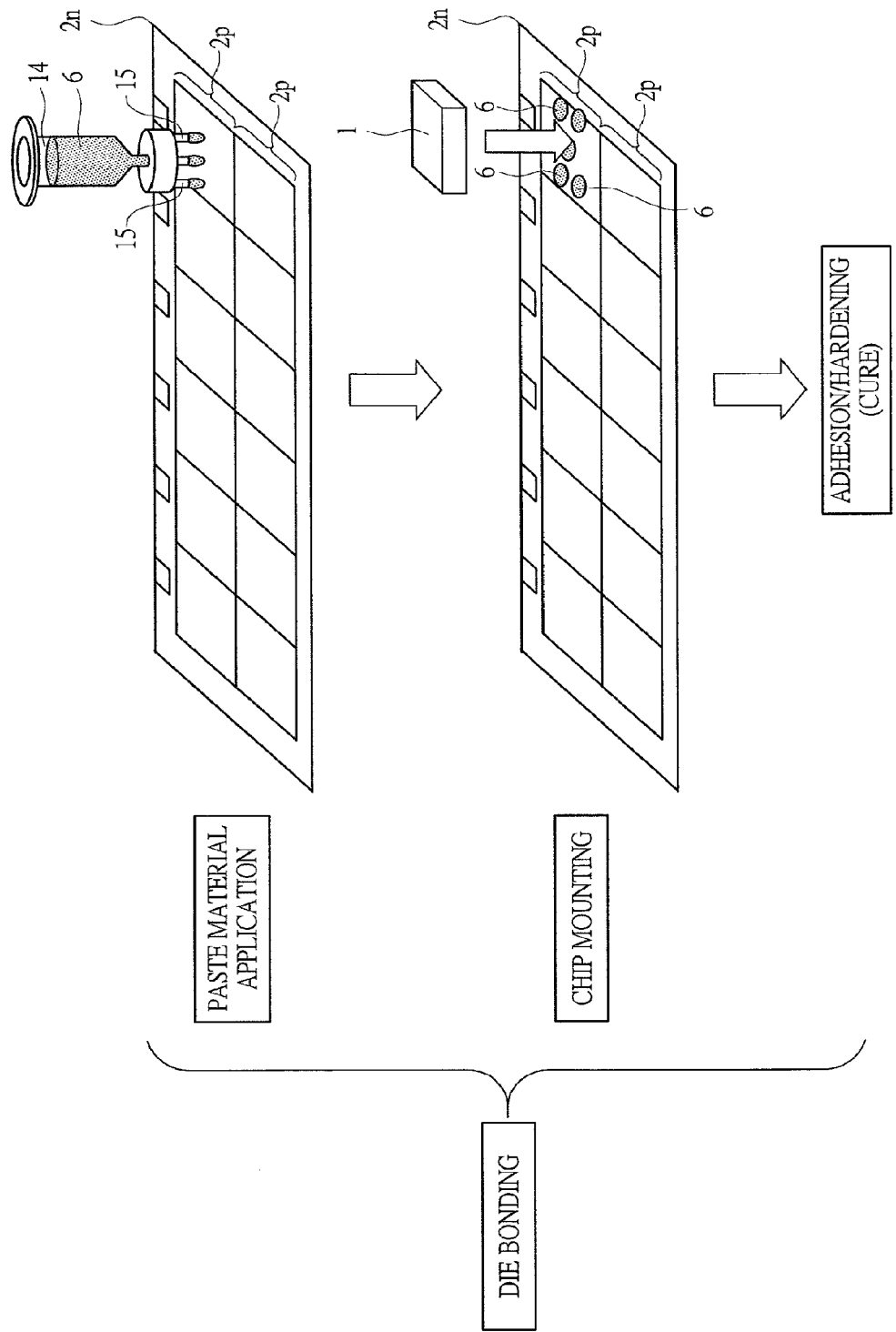
FIG. 27 is a perspective view of an example of a die bonding process in the assembling of FIG. 23.

FIG. 21 is a plan view of an example of a structure of a semiconductor device (having a large chip mounted thereon) according to a third embodiment of the present invention, with a sealing body seen through and wires omitted therefrom. FIG. 22 is a partial cross-sectional view of an example of a structure cut along a line A-A of FIG. 21. FIG. 23 is a manufacturing flow chart of an example of a procedure of assembling the semiconductor device of FIG. 21. Also, FIG. 24 is a plan view of an example of structure of a wiring board for use in the assembling of FIG. 23. FIG. 25 is a plan view of an example of a structure after application of a die bonding material in the assembling of FIG. 23. FIG. 26 is a plan view of an example of a structure after die bonding in the assembling of FIG. 23. FIG. 27 is a perspective view of an example of a die bonding process in the assembling of FIG. 23.

The semiconductor device of the third embodiment is an LGA 13 having a structure similar to that of the semiconductor device (the LGA 7, 8) of the first embodiment, and is the one that can solve a problem newly found by the inventors of the present invention in a board-type semiconductor device in which the plurality of bonding leads 2c are placed having a part of them extending below the semiconductor chip.

Here, the problem newly found by the inventors in the above-described board-type semiconductor device is described.

First, in the structure in which a semiconductor chip is mounted on the wiring board 2 by using the die bonding material 6 in a paste-like form (hereinafter, this may be also referred to simply as a paste material), a phenomenon may occur in which, with the paste material 6 spreading in a wetting manner, the paste material 6 is in contact with the bonding leads 2c and the paste material 6 is pulled to spread over the bonding leads 2c in a wetting manner. This occurs because, with a solder resist film (an insulating film, a first insulating film) 2k and the bonding leads 2c being close to each other, the paste material 6 extending off the edge of the solder resist film 2k tends to be in contact with the bonding leads 2c, and because the paste material 6 has a property of being more prone to spreading in a wetting manner over the metal-made bonding leads 2c than over the surface of the wiring board 2.

As a result, irregularities may occur in the wetting state of the paste material 6 below the semiconductor chip 1, or the paste material 6 is attached onto the surface of the bonding leads 2c to inhibit connections of the wires 5. Even if the wires 5 can be connected by wire bonding with the paste material 6 being attached onto the surface of the bonding leads 2c, it is often the case that a sufficient wire connection strength cannot be achieved.

There is also another problem in which, since the gap between the semiconductor chip 1 and the bonding lead 2c is small, such as 10 to 30 μm, this gap is not sufficiently filled with the mold resin, and a portion (void) unfilled with mold resin may be formed.

As a result, in a hygroscopic reflow test, volume expansion of moisture accumulated in this unfilled portion occurs, causing a crack of the mold resin from the unfilled portion as a starting point.

The LGA 13 of the third embodiment that will be described below has been devised to solve the problems described above and, furthermore, can achieve effects similar to those of the semiconductor device (the LGA 7, 8) of the first embodiment.

Next, the structure of the LGA 13 illustrated in FIGS. 21 and 22 is described. The LGA 13 has a structure in which the first semiconductor chip 1 as a semiconductor chip having a large planar size (outer size) is mounted on the wiring board 2.

The LGA 13 includes the wiring board 2 where semiconductor chips having planar sizes of a plurality of types can be mounted; the first semiconductor chip 1 having a relatively large planar size mounted on the wiring board 2; a plurality of wires 5, which are metal wires electrically connecting the first semiconductor chip 1 and the wiring board 2; and a sealing body 4 that seals the first semiconductor chip 1 and the plurality of wires 5 with a mold resin.

Note that, as with the LGAs 7 and 8, as being wire-bonded, the first semiconductor chip 1 is disposed having its main surface 1a facing upward. That is, the first semiconductor chip 1 is implemented in a face-up manner on the wiring board 2. Therefore, the first semiconductor chip 1 has its back surface 1b bonded to the wiring board 2 via a die bonding material 6, which is an adhesive material.

Here, the first semiconductor chip 1 is formed of silicon, for example, and has a semiconductor integrated circuit embedded therein, such as a microcontroller. The first semiconductor chip 1 has a substantially rectangular shape in a planar view, and has the main surface 1a and the back surface 1b on its opposite side. Note that a plurality of electrode pads 1c, which are surface electrodes, are formed so as to be arranged in a line around an outer edge of the main surface 1a. The semiconductor chip 1 has a planar size (outer size) of, for example, 4.0 mm×4.0 mm.

The wires 5 are gold wires, for example, each electrically connecting the electrode pad is of the first semiconductor chip 1 and the bonding lead 2c of the wiring board 2 corresponding to the electrode pad 1c.

The die bonding material 6 is formed by applying an adhesive material in a paste-like form, such as an epoxy-based insulating adhesive material.

In addition, the sealing body 4 is formed by thermosetting a mold resin having a thermosetting property, such as an epoxy-based mold resin having a thermosetting property.

Next, the wiring board 2 is described. The wiring board 2 is similar to the wiring board 2 of the first embodiment, and as illustrated in FIG. 22, the wiring board 2 has an upper surface 2a and a lower surface 2b on the opposite side to the upper surface 2a. Both of the upper surface 2a and the lower surface 2b have a rectangular shape as illustrated in FIG. 21. The structure of the wiring board 2 in a thickness direction is such that, as illustrated in FIG. 22, wiring parts 2f and the bonding leads 2c illustrated in FIG. 21 are formed on a core material 2h and its upper surface 2a side and, on the other hand, a plurality of lands 2i serving as external terminals are formed on a lower surface 2b side. Wiring parts 2f and the bonding leads 2c on the upper surface 2a side and the lands 2i on the lower surface 2b side are electrically connected to each other via a via 2e or a through hole.

Note that the plurality of lands 2i on the lower surface 2b side are arranged, for example, in a grid-like manner.

A solder resist film 2g as an insulating film is formed on the lower surface 2b side, and the solder resist film 2g is formed around each of the plurality of lands 2i as external terminals so that the plurality of lands 2i are exposed.

On the other hand, on the upper surface 2a side of the wiring board 2, a wiring pattern including the wiring parts 2f, the bonding leads 2c, the vias 2e as illustrated in FIG. 21 is formed. The solder resist film 2k is formed on a region having an area significantly smaller than the region of the first semiconductor chip 1 having a large area, and this region of the solder resist film 2k is formed in a rectangular shape and serves as a die bonding region in the LGA 13.

As with the LGA 7 of the first embodiment, the die bonding region in the LGA 13 is restricted by adopting a restriction of the die bonding region when a minimum mountable chip (the second semiconductor chip 3 of FIG. 7) is mounted on the wiring board 2 as a shared board. That is, also in the LGA 13 of the third embodiment, the die bonding region is restricted with the solder resist film 2k with reference to a minimum mountable chip. Therefore, each of the plurality of bonding leads 2c is formed on a region further outside of the rectangular solder resist film 2k defined with reference to the minimum mountable chip.

That is, the wiring board 2 has, for example, the upper surface 2a; the plurality of bonding leads 2c arranged on and around the solder resist film 2k that is formed on the region (the die bonding region) of the upper surface 2a to be applied with the die bonding material 6; the lower surface 2b on the opposite side to the upper surface 2a; and the plurality of lands 2i formed on the lower surface 2b. Furthermore, the first semiconductor chip 1 is mounted on the solder resist film 2k via the die bonding material 6. That is, the die bonding material 6 is disposed between the solder resist film 2k and the first semiconductor chip 1.

Therefore, as with the LGA 7 of the first embodiment, semiconductor chips of different planar sizes can be mounted also on the wiring board 2 of the LGA 13 of the third embodiment. Here, the dimensions of the pattern of the rectangular solder resist film 2k of the wiring board 2 are smaller than the planar size of the semiconductor chip (the first semiconductor chip 1).

That is, also in the LGA 13, as illustrated in FIG. 21, the solder resist film 2k of the wiring board 2 on the upper surface 2a side is formed in a rectangular shape at a substantial center of the upper surface 2a as a die bonding region (the hatched part), but no solder resist film other than the rectangular solder resist film 2k is formed on the upper surface 2a side. That is, the entire outer perimeter of the pattern of the solder resist film 2k is terminated at a position inside of the outer perimeter of the first semiconductor chip 1, and this pattern is not formed in a region outside of the first semiconductor chip 1.

In this manner, the die bonding material 6 is also in the state of being disposed inside of the outer perimeter of the first semiconductor chip 1.

Note that, in the LGA 13, a gap G between the first semiconductor chip 1 and the bonding lead 2c illustrated in FIG. 22 is set as G>50 μm. This is set so that, since fillers contained in the mold resin for filling this gap each have a particle diameter of 30 μm to 50 μm, fillers having a diameter of 50 μm can enter the gap.

To set this gap G as G>50 μm, in the LGA 13, a film thickness of the solder resist film 2k as a die bonding region is thicker than the film thickness of the solder resist film 2g at a portion where the semiconductor chip is not mounted. In other words, the film thickness of the solder resist film 2k as a die bonding region is thicker than the film thickness of the other solder resist films. More specifically, as illustrated in FIG. 22, a film thickness S1 of the solder resist film 2k on an upper surface 2a side of the wiring board 2 is thicker than a film thickness T of the solder resist film 2g on a lower surface 2b side (S1>T). Here, the film thickness S1 is, for example, on the order of S1>60 μm, and the film thickness T is, for example, on the order of T=50 μm. Furthermore, a thickness V including plating (nickel-gold plating 2d) on the front surface of the bonding leads 2c is, for example, on the order of V=30 μm, and a thickness U of the die bonding material 6 in a paste-like form below the first semiconductor chip 1 is, for example, on the order of 20 μm. Therefore, with setting S1>60 μm, the gap G>50 μm can be ensured.

Also, making the film thickness of the solder resist film 2k below the first semiconductor chip 1 thicker than the film thickness of the other the solder resist films also has an effect in suppressing spreading of the die bonding material 6 in a wetting manner to the bonding leads 2c. That is, by making the film thickness of the solder resist film 2k below the first semiconductor chip 1 thicker than the film thickness of the other solder resist films, a space portion P beside the solder resist film 2k and formed of a side surface of the solder resist film 2k, the back surface 1b of the first semiconductor chip 1, a front surface of the core material 2h of the wiring board 2, and a side surface of the bonding lead 2c has a high height, thereby allowing the volume of the structure to be increased compared with that of the structure before the film thickness of the solder resist film 2k is made thick. Note that the space portion P is formed around the rectangular solder resist film 2k.

In this manner, as the volume of the space portion P beside the solder resist film 2k is increased, the amount of the die bonding material 6 that can be filled (that can be contained) in the space portion P is increased.

That is, the die bonding material 6 running off the edge forms a fillet along the side surface of the solder resist film 2k. The larger the film thickness of the solder resist film 2k, the larger the size of the fillet, and the larger the volume of the die bonding material 6 accumulated in the space portion P. As a result, an end 6a of the die bonding material 6 running off the edge is disposed (accumulated) in a region (the space portion P) between the solder resist film 2k and the plurality of bonding leads 2c. Therefore, it is possible to suppress the die bonding material 6 running off the solder resist film 2k from being in contact with the bonding leads 2c to be pulled and spreading in a wetting manner over the bonding leads 2c.

Furthermore, as described above, since the gap between the first semiconductor chip 1 and the bonding leads 2c is widened, the mold resin can be reliably injected in the gap, and the mold resin can be prevented from being unfilled (the occurrence of a void can be prevented).

Here, the core material 2h in the wiring board 2 is made of, for example, a glass epoxy resin, and the solder resist film 2k and the solder resist film 2g are made of an epoxy-based resin or the like. Furthermore, the wiring parts 2f, the lands 2i, the via 2e, and the bonding leads 2c are made of, for example, a metal containing a copper alloy as a main ingredient. Also, on the front surface of each bonding lead 2c, nickel-gold plating 2d is formed so as to ensure an excellent connection with the gold wire (the wire 5).

Note that, after assembling as the LGA 13, as illustrated in FIG. 22, the plurality of bonding leads 2c, the wiring parts 2f, and others are covered and protected by a part of the sealing body 4.

The structure of the LGA 13 of the third embodiment other than those described above is similar to that of the LGA 7 of the first embodiment and is therefore not repetitively described herein.

Next, assembling of the LGA 13 of the third embodiment is described with reference to the manufacturing flow in FIG. 23.

First, a board is prepared as shown at step S1 in FIG. 23. Here, a multi-piece board for taking a plurality of pieces (a wiring board) 2n is prepared on which a plurality of device regions 2p of FIG. 27 are formed each as a region where one LGA 13 is to be formed. On the other hand, a plurality of first semiconductor chips 1 each having a desired integrated circuit formed thereon are prepared.

Note that, on each device region (wiring board 2) 2p of the multi-piece board 2n, as illustrated in FIG. 24, the solder resist film 2k is formed at the center as a die bonding region. That is, at the center of the upper surface 2a of each wiring board (each device region 2p) 2, the solder resist film (a first insulating film) 2k is formed having an area smaller than that of the first semiconductor chip 1 and having the first semiconductor chip 1 mounted thereon. Around this solder resist film 2k, the plurality of bonding leads 2c are disposed.

Also, on the lower surface 2b of each wiring board (each device region 2p) 2, the solder resist film 2g is formed as an insulating film. The film thickness of the solder resist film 2k on the upper surface 2a side is larger than the film thickness of the solder resist film 2g on the lower surface 2b side. The film thickness S1 of the solder resist film 2k is, for example, on the order of S1>60 μm.

Then, die bonding shown at step S2 in FIG. 23 is performed. In the die bonding process, the die bonding material 6 as an adhesive material in a paste-like form is first supplied onto each wiring board 2. Here, the die bonding material 6 is supplied onto the solder resist film 2k of each wiring board 2. For example, as illustrated in paste material application in FIG. 27, a syringe 14 with its tip having a multipoint nozzle 15 mounted thereon is used to apply the die bonding material 6 at plural points onto the solder resist film 2k as illustrated in FIG. 25. Note that, while the method of multipoint application by using the multipoint nozzle 15 is described herein, multipoint application may be performed by using a single (one) nozzle, or any shape may be rendered. The multipoint nozzle 15 is effective when the application time is desired to be shortened, because when the chip size is large, application can be completed by one-time application over a wide application region.

After applying the die bonding material 6, as illustrated in FIG. 26 and chip mounting illustrated in FIG. 27, the first semiconductor chip 1 is mounted on the wiring board 2 via the die bonding materials 6. In the die bonding process, as illustrated in FIG. 22, chip mounting is performed by applying the die bonding material 6 to be applied uniformly over a wide range from the multipoint-type shower nozzle 15 so that a gap between the first semiconductor chip 1 and the solder resist film 2k of the wiring board 2 is filled with the die bonding material 6.

Furthermore, the process is performed so that an end 6a of the die bonding material 6 is positioned between the solder resist film 2k and the plurality of bonding leads 2c. That is, as illustrated in FIG. 22, since the solder resist film 2k as a die bonding region is formed so as to have a large film thickness, the region (the space portion P) beside the solder resist film 2k and formed with the plurality of bonding leads 2c has a large height and therefore has a large volume. As a result, the die bonding material 6 running off the edge of the region (the space portion P) can be accommodated in the region (the space portion P).

In other representations, the first semiconductor chip 1 can be mounted so that the end 6a of the running-off die bonding material 6 is positioned in the region (the space portion P) beside the solder resist film 2k having a film thickness larger than the film thickness of the other solder resist films and the plurality of bonding leads 2c.

Then, the die bonding material 6 is cured by performing a heat treatment by adhering and curing as shown in FIG. 27. As a condition for the heat treatment here, for example, heating is performed at about 150° C. to 170° C. for 60 minutes to 90 minutes. Note that the condition for the heat treatment here is not meant to be restrictive.

After completion of die bonding, wire bonding shown at step S3 in FIG. 23 is performed. Here, the electrode pad 1c on the main surface (front surface) 1a of the first semiconductor chip 1 and the bonding lead 2c on the upper surface 2a of the wiring board 2 are electrically connected to each other by the wire (the metal wire) 5.

Note that this wire bonding shown at step S3 can be stably performed because the die bonding material 6 is not attached to a portion where the wire 5 is connected on the bonding lead 2c as described above.

Then, molding (sealing) shown at step S4 is performed. Specifically, the first semiconductor chip 1, the plurality of wires 5, and further the die bonding material 6 are sealed with the sealing body 4. Here, in the LGA 13, as described above (as illustrated in FIG. 22), the gap G between the first semiconductor chip 1 and the bonding lead 2c is larger than 50 μm.

In this manner, since the gap between the first semiconductor chip 1 and the bonding lead 2c is wide, the mold resin can be reliably injected into the gap, and unfilling of the mold resin can be prevented. Furthermore, in a reliability test such as a hygroscopic reflow test, the occurrence of a crack from the unfilled portion as a starting point can also be suppressed. As a result, reliability of the semiconductor device can be improved.

Then, singulating dicing shown at step S6 is performed to complete assembling of the LGA 13, and the procedure then goes to shipping shown at step S7.

Figure 20:
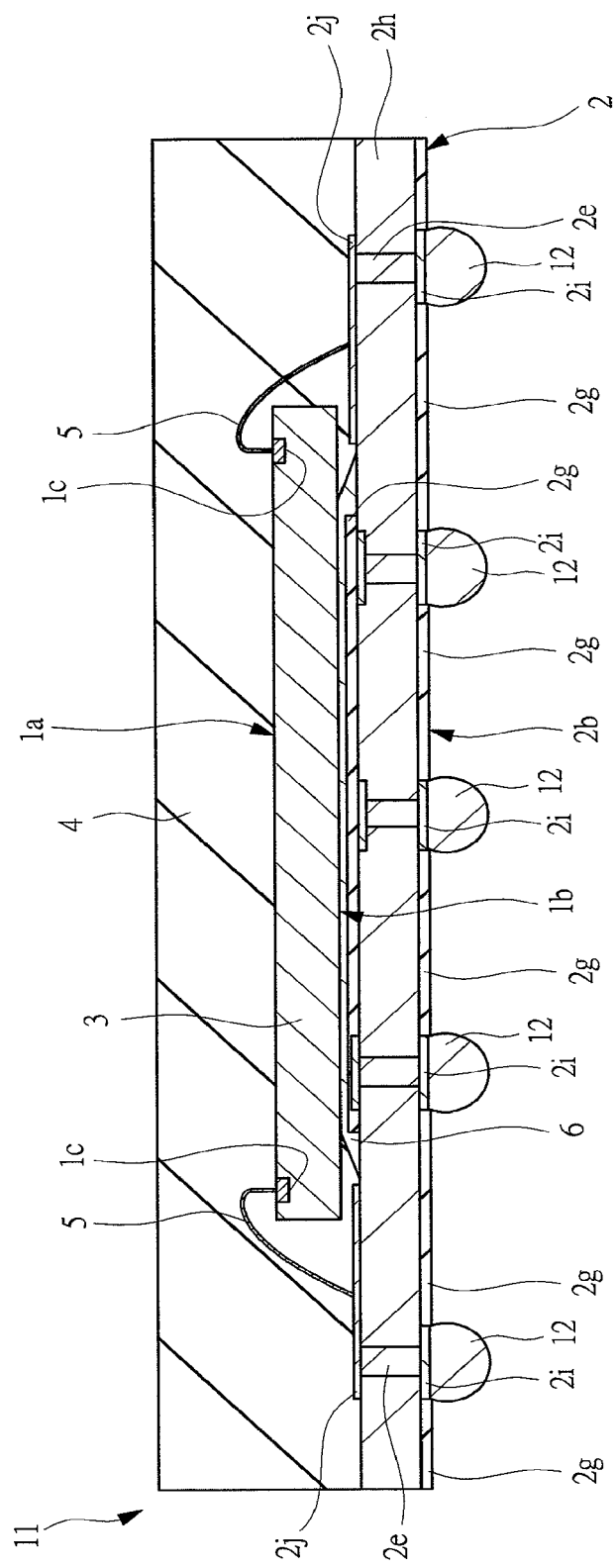
FIG. 20 is a cross-sectional view of an example of a structure of a semiconductor device (BGA) of a modification example of the present invention.

Note that, when the semiconductor device is a BGA 11 as illustrated in FIG. 20, which will be described further below, after molding is performed at step S4, balls are bonded as shown at step S5, and then singulating dicing shown at step S6 is performed to complete assembling of the BGA 11. The procedure then goes to shipping shown at step S7.

According to the LGA 13 and its assembling of the third embodiment, the solder resist film 2k below the first semiconductor chip 1 is made thick. Therefore, the volume of the space portion P beside the solder resist film 2k can be increased. In this manner, the end 6a of the running-off die bonding material 6 can be positioned in the region between the solder resist film 2k and the plurality of bonding leads 2c.

As a result, the die bonding material 6 can be suppressed from spreading over the bonding leads 2c in a wetting manner, and the occurrence of a phenomenon can be reduced in which the wire 5 cannot be connected to the bonding lead 2c or an appropriate wire connection strength cannot be achieved in wire bonding.

Furthermore, ash the die bonding material 6 is prevented from spreading over the bonding leads 2c in a wetting manner, the occurrence of irregularities in the die bonding material 6 placed between the first semiconductor chip 1 and the solder resist film 2k can also be prevented. Therefore, reliability of the semiconductor device can be improved.

Next, a modification example of the third embodiment is described.

Figure 28:
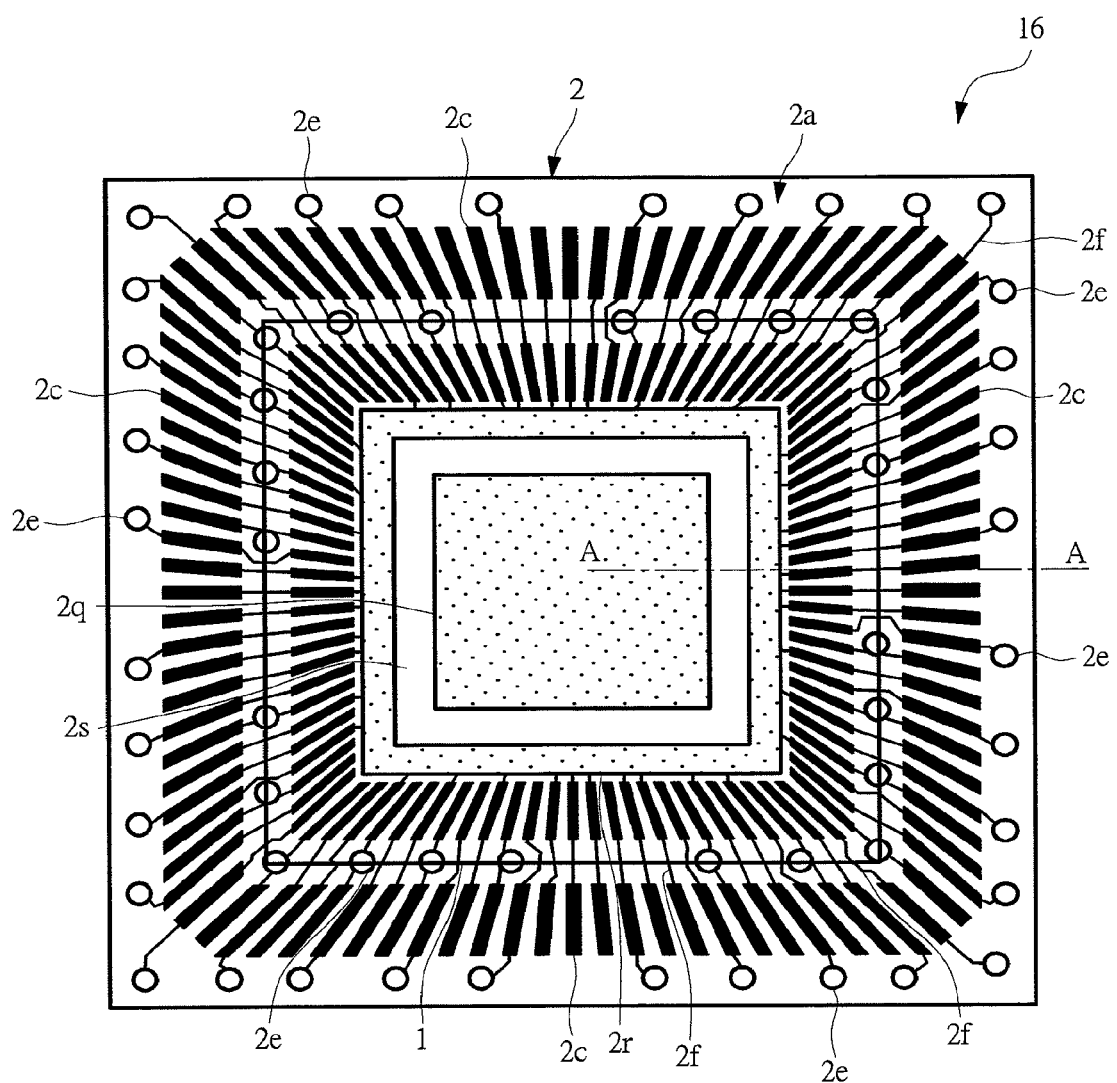
FIG. 28 is a plan view of an example of a structure of a semiconductor device (having a large chip mounted thereon) of a modification example of the third embodiment of the present invention, with a sealing body seen through and wires omitted therefrom.
Figure 29:
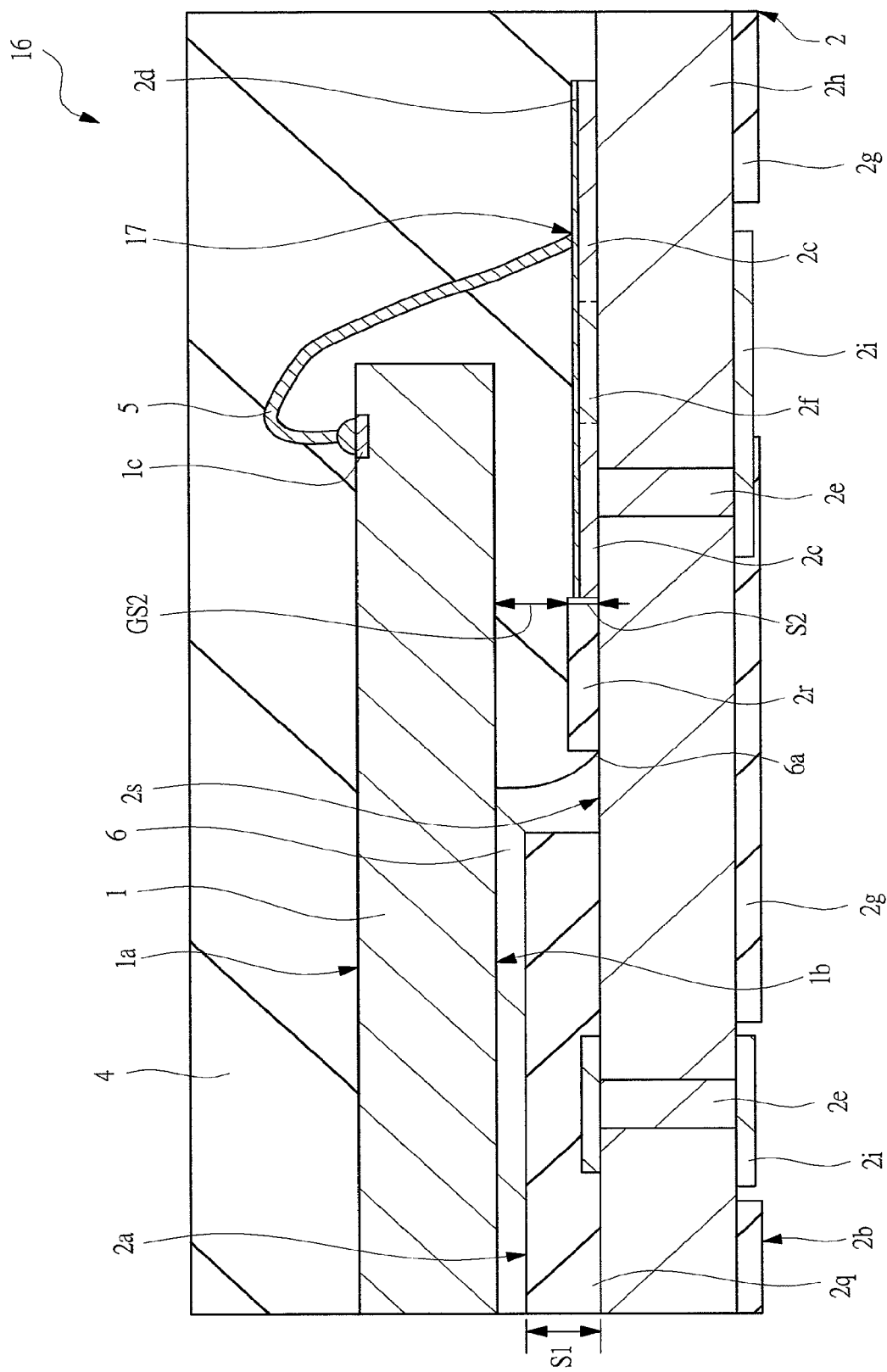
FIG. 29 is a partial cross-sectional view of the structure cut along a line A-A of FIG. 28.
Figure 30:
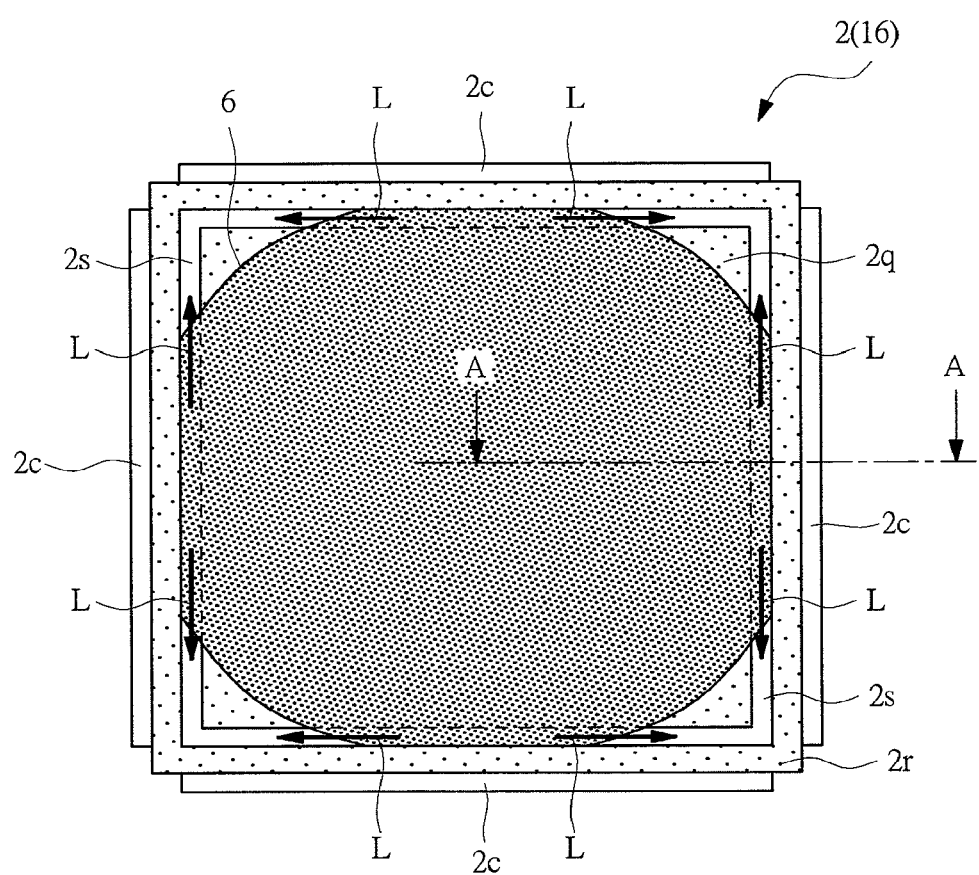
FIG. 30 is a plan view of an example of a flowing state of a die bonding material at the time of applying the die bonding material in assembling of the semiconductor device of FIG. 28.
Figure 31:
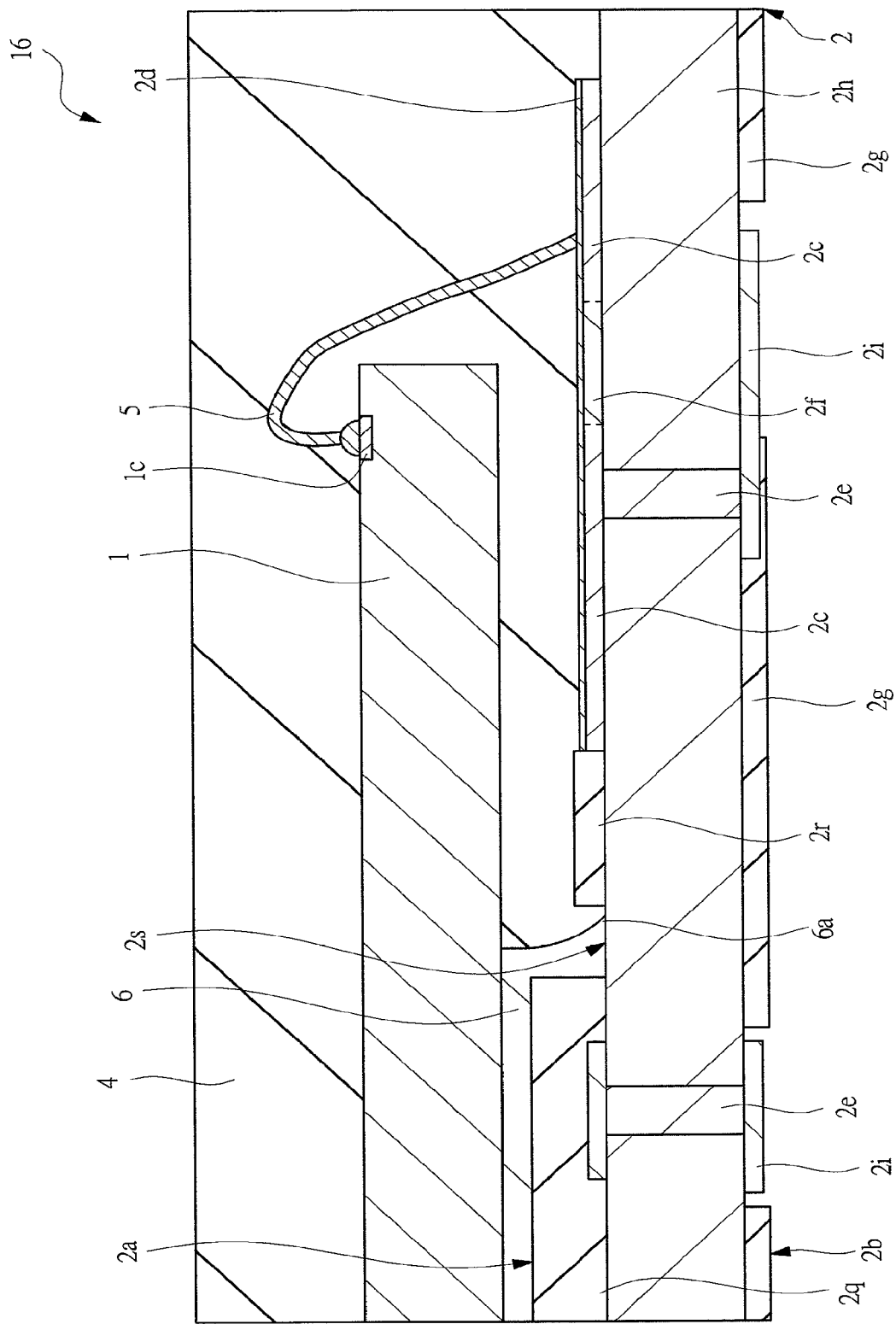
FIG. 31 is a partial cross-sectional view of a structure cut along a line A-A of FIG. 30.
Figure 32:
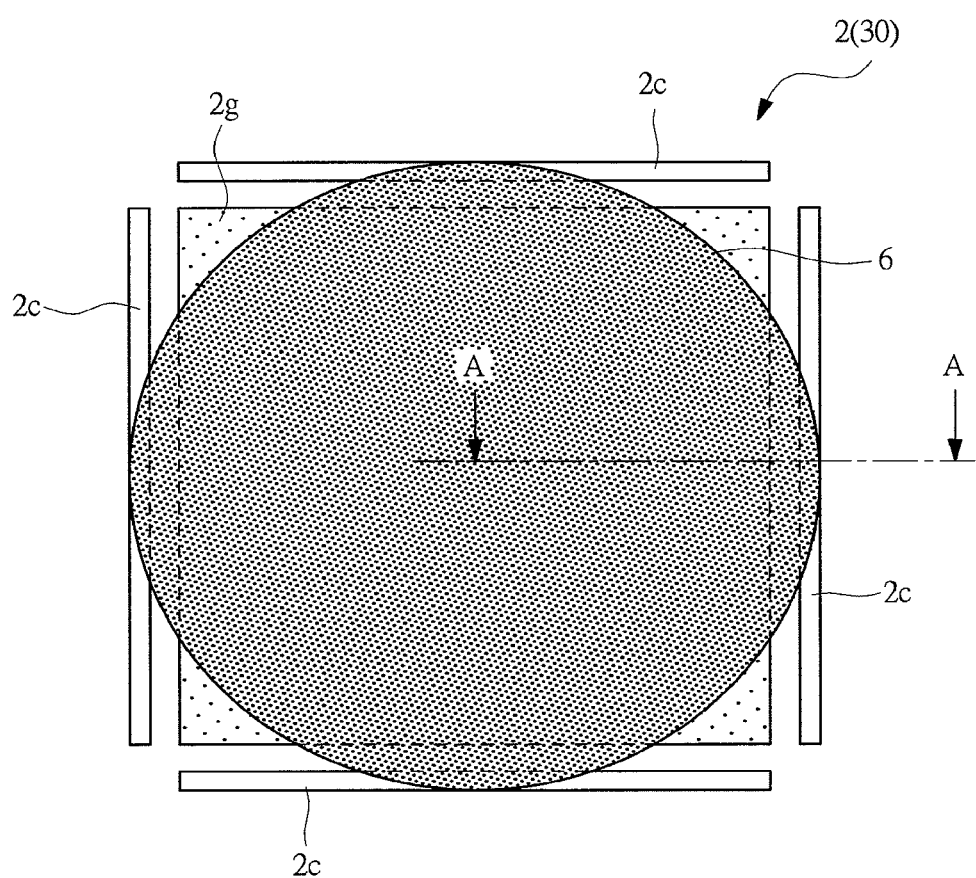
FIG. 32 is a plan view, illustrating a flowing state of a die bonding material at the time of applying the die bonding material in a comparative example.
Figure 33:
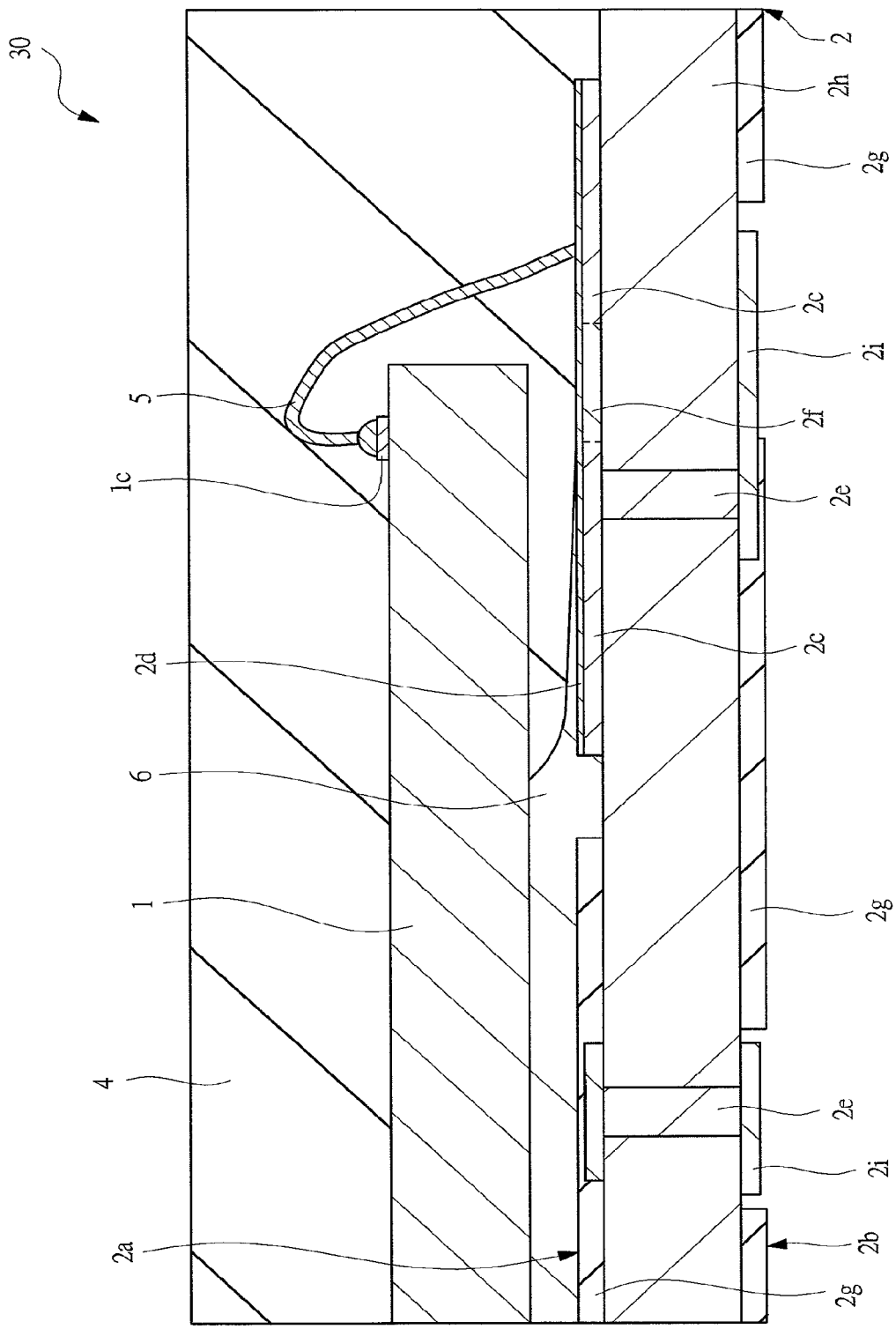
FIG. 33 is a partial cross-sectional view of a structure cut along a line A-A of FIG. 32.

FIG. 28 is a plan view of a structure of a semiconductor device (having a large chip mounted thereon) of a modification example of the third embodiment of the present invention, with a sealing body seen through and wires omitted therefrom. FIG. 29 is a partial cross-sectional view of the structure cut along a line A-A of FIG. 28. FIG. 30 is a plan view of an example of a flowing state of a die bonding material upon application of a die bonding material in assembling of the semiconductor device of FIG. 28. FIG. 31 is a partial cross-sectional view of a structure cut along a line A-A of FIG. 30. FIG. 32 is a plan view, illustrating a flowing state of a die bonding material upon application of the die bonding material in a comparative example. FIG. 33 is a partial cross-sectional view of a structure cut along a line A-A of FIG. 32.

The semiconductor device illustrated in FIGS. 28 and 29 is an LGA 16 having a structure similar to that of the LGA 13, and is different from the LGA 13 in that a solder resist film 2r is formed around a solder resist film (a first insulating film) 2q as a die bonding region on the upper surface 2a of the wiring board 2. That is, on the upper surface 2a of the wiring board 2, as illustrated in FIG. 28, the solder resist film (the first insulating film) 2q formed in a region to be applied with the die bonding material 6 and having a rectangular planar shape, the solder resist film (the second insulating film) 2r formed so as to surround the solder resist film 2q in a periphery of the solder resist film 2q, and the bonding leads 2c placed further around the solder resist film 2r are formed. Therefore, the solder resist film 2r is formed between the solder resist film 2q and the plurality of bonding leads 2c, and is formed away from the solder resist film 2q.

On the other hand, on the lower surface 2b of the wiring board 2, the plurality of lands 2i as external terminals of the LGA 16 are formed.

Note that, on the solder resist film 2q on the upper surface 2a of the wiring board 2, the first semiconductor chip 1 having the plurality of electrode pads 1c formed on the main surface 1a and having a large area in a planar direction is mounted via the die bonding material 6. That is, the die bonding material 6 is placed between the solder resist film 2q of the wiring board 2 and the first semiconductor chip 1.

Furthermore, the plurality of electrode pads 1c of the first semiconductor chip 1 and the plurality of bonding leads 2c of the wiring board 2 are electrically connected to each other with the plurality of wires (metal wires) 5. Each of the plurality of wires 5 is connected to the bonding lead 2c at a connection point 17.

Also, each of the plurality of bonding leads 2c on the upper surface 2a of the wiring board 2 extends long from the outer perimeter of the board to the center of the board. Also, since the first semiconductor chip 1 has a chip having a large area, a part of each of the plurality of bonding leads 2c, that is, a portion near the center of the board, is positioned below the first semiconductor chip 1. Therefore, the area of the solder resist film 2q as a die bonding region is smaller than the area of the first semiconductor chip 1.

Also, as illustrated in FIG. 29, as with the LGA 13, a film thickness S1 of the solder resist film 2q is set as S1>60 μm. Therefore, the solder resist film 2q below the first semiconductor chip 1 is thick.

Furthermore, a difference from the LGA 13 is that the solder resist film 2r as a second insulating film is formed around the solder resist film 2q in the LGA 16. This solder resist film 2q has a film thickness S2 on the order of S2=50 μm, which is at a degree similar to that of the solder resist film 2g on the lower surface 2b side Therefore, the film thickness S1 of the solder resist film 2q>the film thickness S2 of the solder resist film 2r, indicating that the film thickness S1 of the solder resist film 2q is larger than the film thickness S2 of the solder resist film 2r.

However, the film thickness of the solder resist film 2r may be at a degree (30 μm to 50 μm) similar to the thickness (30 μm) of the bonding lead 2c.

Also, as illustrated in FIG. 28, the solder resist film 2r has a planar shape in a ring-like shape, for example, and is disposed away from the rectangular solder resist film 2q. Therefore, outside of the solder resist film 2q, a groove part 2s is formed as a space portion formed by being surrounded by the solder resist film 2q and the solder resist film 2r.

In the LGA 16, as with the LGA 13, the solder resist film 2q as a die bonding region below the first semiconductor chip 1 is formed to be thick. In this manner, the height of the groove part 2s as a space portion beside the solder resist film 2q can be increased. As a result, the volume of the groove part 2s is increased. Therefore, a part of the end 6a of the extending die bonding material 6 can be positioned in the groove part 2s as a region between the solder resist film 2q and the solder resist film 2r.

That is, when an adhesive material in a paste-like form is adopted as the die bonding material 6, in the die bonding process of assembling the LGA 16, application of the die bonding material 6 is performed so that the die bonding material 6 runs of the edge of the solder resist film 2q, so that no gap is formed between the solder resist film 2q and the first semiconductor chip 1. In this structure, the die bonding material 6 running off the edge of the solder resist film 2q is then terminated in the groove part 2s beside the solder resist film 2q.

Therefore, as the die bonding material 6 is running off the edge of the solder resist film 2q, an adhesion area of the die bonding material 6 with the wiring board 2 is larger than the area of the solder resist film 2q.

Here, the reason of providing the solder resist film 2r around the solder resist film 2q is described.

As illustrated in FIG. 31, as the solder resist film 2r is provided adjacently to the end of each bonding lead 2c near the center of the board in the extending direction of the bonding lead 2c, the distance from the solder resist film 2q to the bonding lead 2c can be increased. In this manner, the running-off die bonding material 6 is less prone to reaching the bonding lead 2c.

Furthermore, as illustrated in FIG. 30, the solder resist film 2r is formed between the solder resist film 2q and the bonding lead 2c, and the solder resist film 2q and the solder resist film 2r are placed away from each other, thereby forming the groove part 2s between the solder resist film 2q and the solder resist film 2r. In this manner, the running-off die bonding material 6 is diffused in the extending direction (an L direction) of the groove part 2s. Thus, the die bonding material 6 can be inhibited from reaching the bonding lead 2c. That is, diffusion of the die bonding material 6 from the center of the chip to a direction outside the board can be suppressed by the capacity of the groove part 2s. Still further, as described above regarding the LGA 13, the die bonding material 6 in a paste-like form has a property of being, in general, less prone to spreading in a wetting manner to the solder resist film than to a metal-made bonding lead. Therefore, as the solder resist film 2r is being placed between the solder resist film 2q and the bonding lead 2c, the die bonding material 6 running off the edge of the solder resist film 2q can be suppressed from spreading over the bonding lead 2c in a wetting manner.

By contrast, in an LGA 30 of the comparative example illustrated in FIGS. 32 and 33, no solder resist film as another insulating film is formed between the solder resist film 2q and the bonding lead 2c. Therefore, the die bonding material 6 running off the edge of the solder resist film 2q flows to directly run over the bonding leads 2c and thus it easily covers the bonding lead 2c.

As such, in the LGA 16 illustrated in FIGS. 28 and 29, by disposing the solder resist film 2r between the solder resist film 2q and the bonding lead 2c, the die bonding material 6 running off the edge of the solder resist film 2q can be made less prone to cover the bonding lead 2c.

The structure of the LGA 16 illustrated in FIGS. 28 and 29 other than those described above, assembling of the LGA 16, and other effects obtained from the LGA 16 are similar to those of the LGA 13 and therefore are not repetitively described.

Note that, while the LGA 16 has a structure in which the solder resist film 2r is provided having the film thickness of the solder resist film 2q being thickened, the film thickness of the solder resist film 2q does not have to be thickened. Even when the solder resist film 2r is provided without particularly thickening the film thickness of the solder resist film 2q, the phenomenon in which the die bonding material 6 running off the edge of the bonding leads 2c in a wetting manner can be suppressed as compared with the case of not providing the solder resist film 2r. That is, the structure may be such that the LGA 30 illustrated in FIGS. 32 and 33 is provided simply with the solder resist film 2r.

(Fourth Embodiment)

Figure 34:
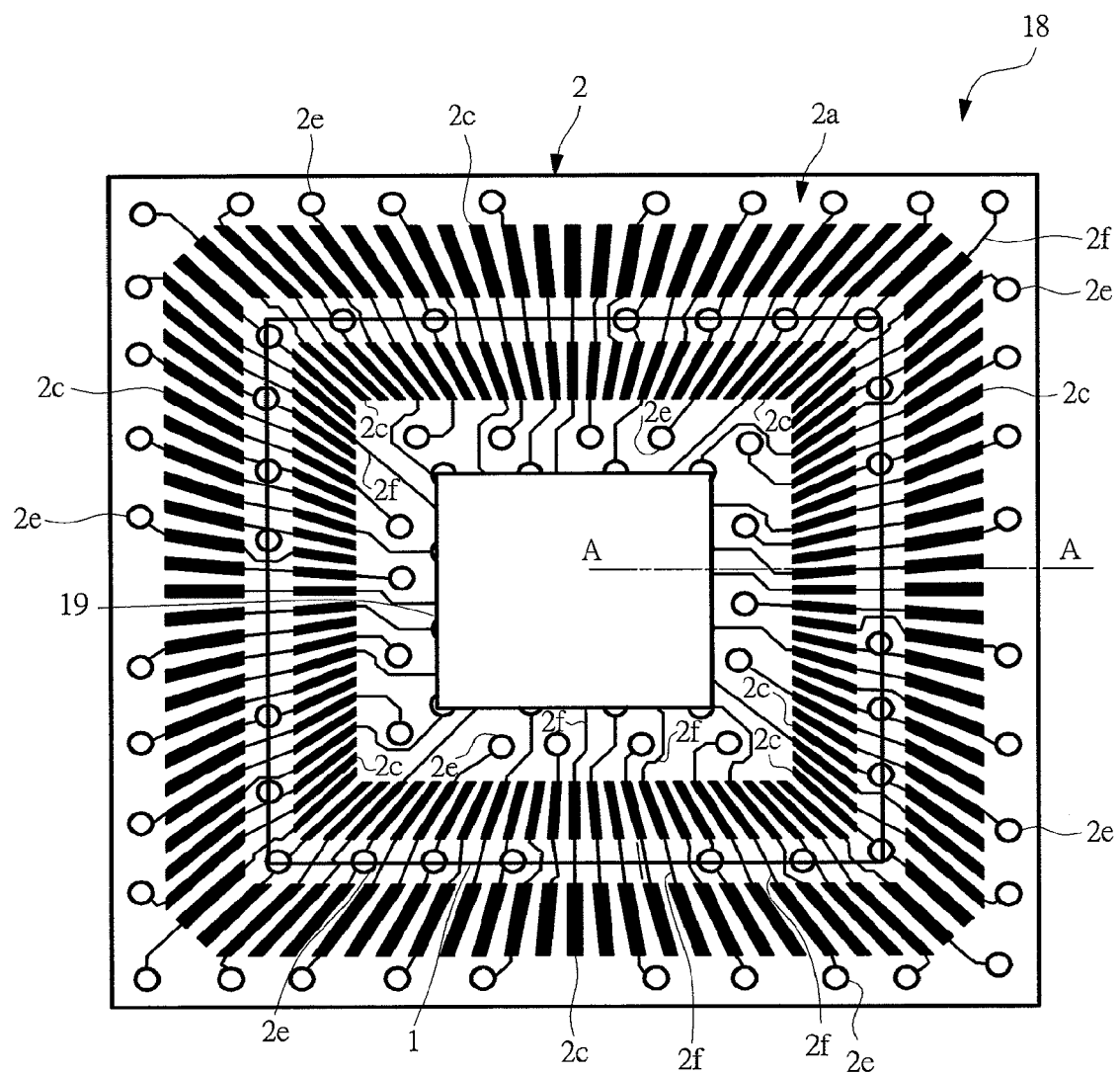
FIG. 34 is a plan view of an example of a structure of a semiconductor device (having a large chip mounted thereon) according to a fourth embodiment of the present invention, with a sealing body seen through and wires omitted therefrom.
Figure 35:
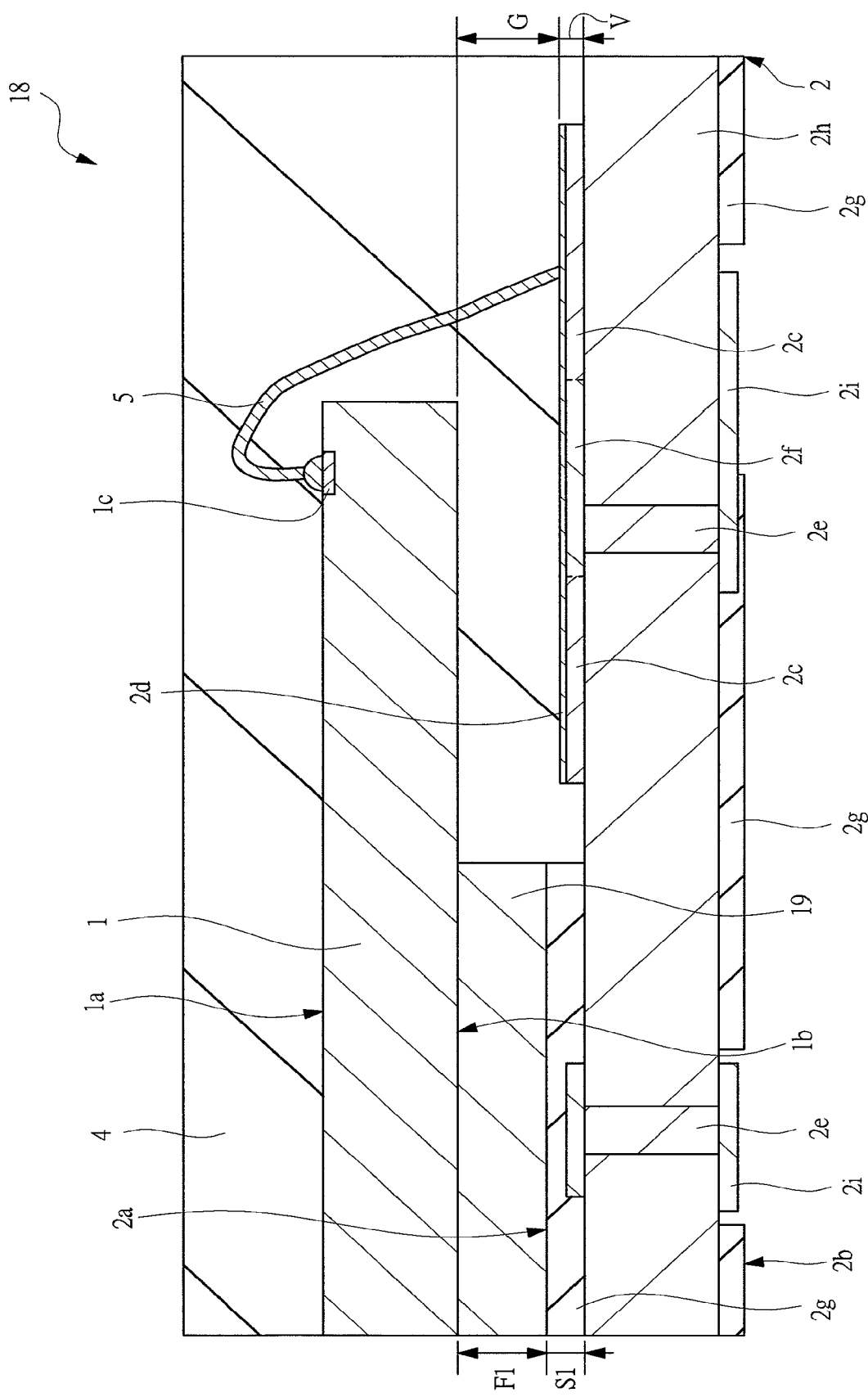
FIG. 35 is a partial cross-sectional view of an example of a structure cut along a line A-A of FIG. 34.
Figure 36:
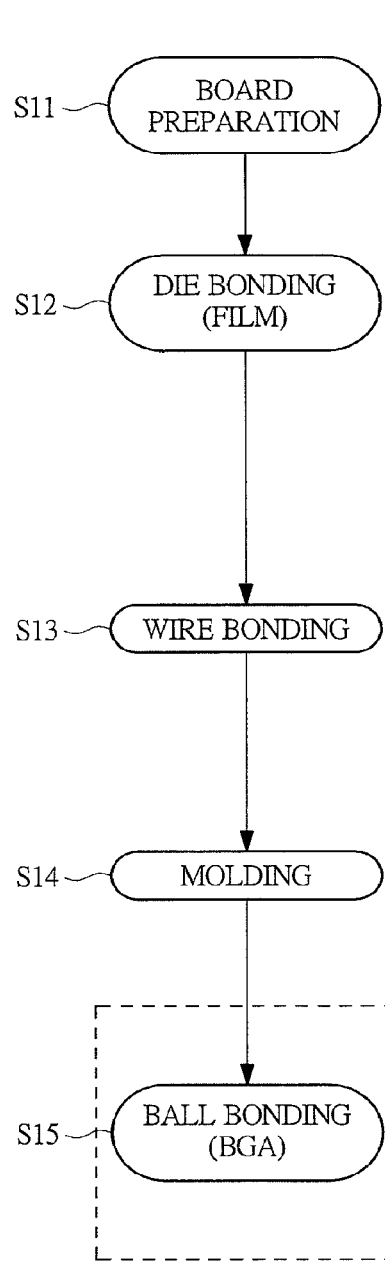
FIG. 36 is a manufacturing flow chart of an example of a procedure of assembling the semiconductor device of FIG. 34.
Figure 36:
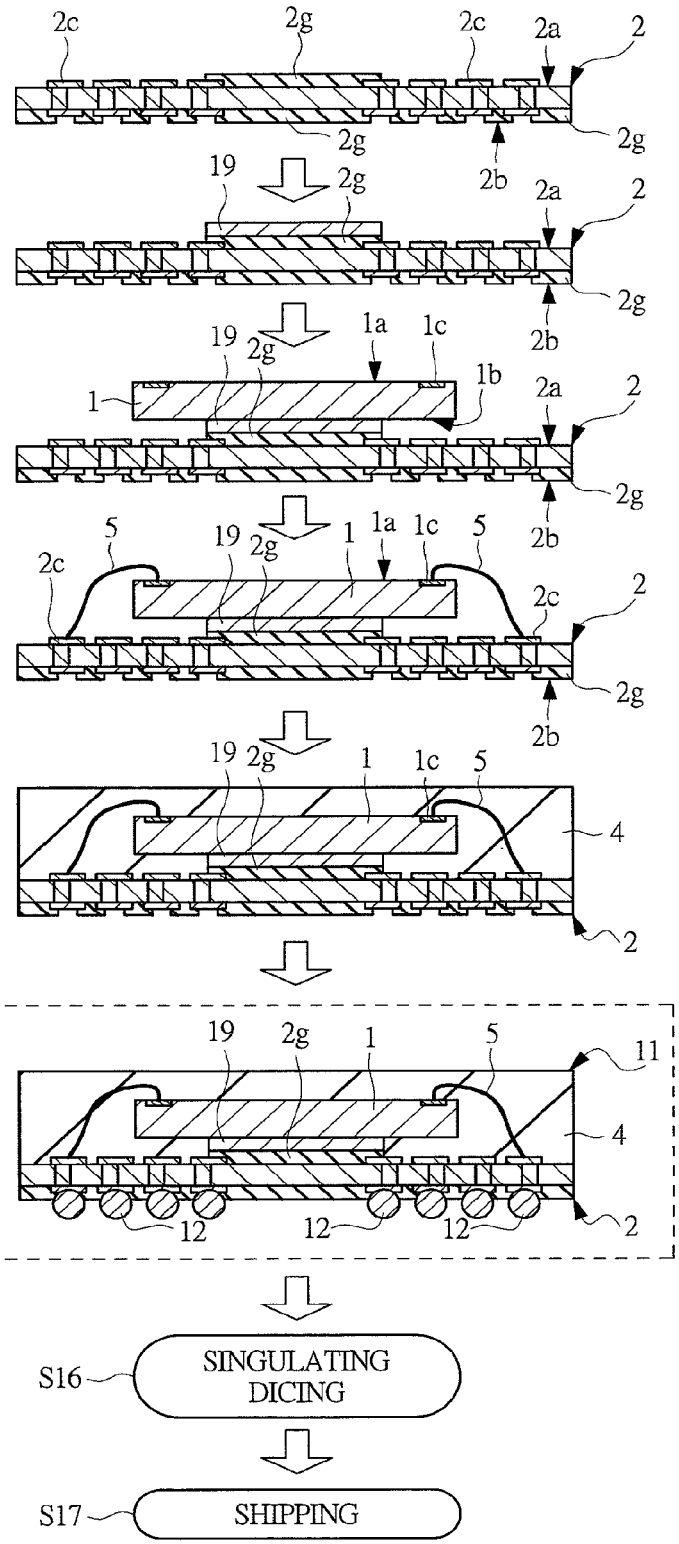
Figure 37:
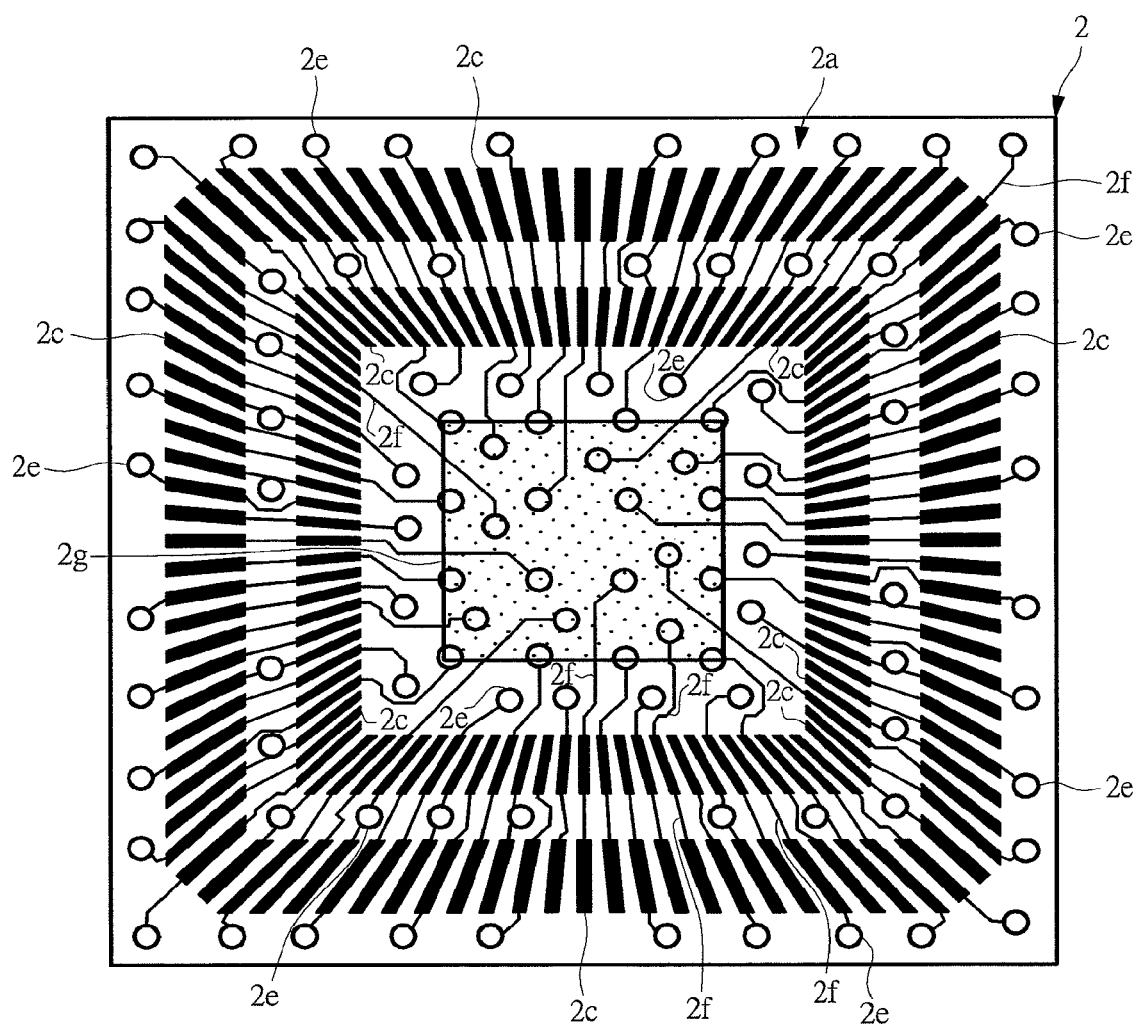
FIG. 37 is a plan view of an example of a structure of a wiring board for use in the assembling of FIG. 36.
Figure 38:
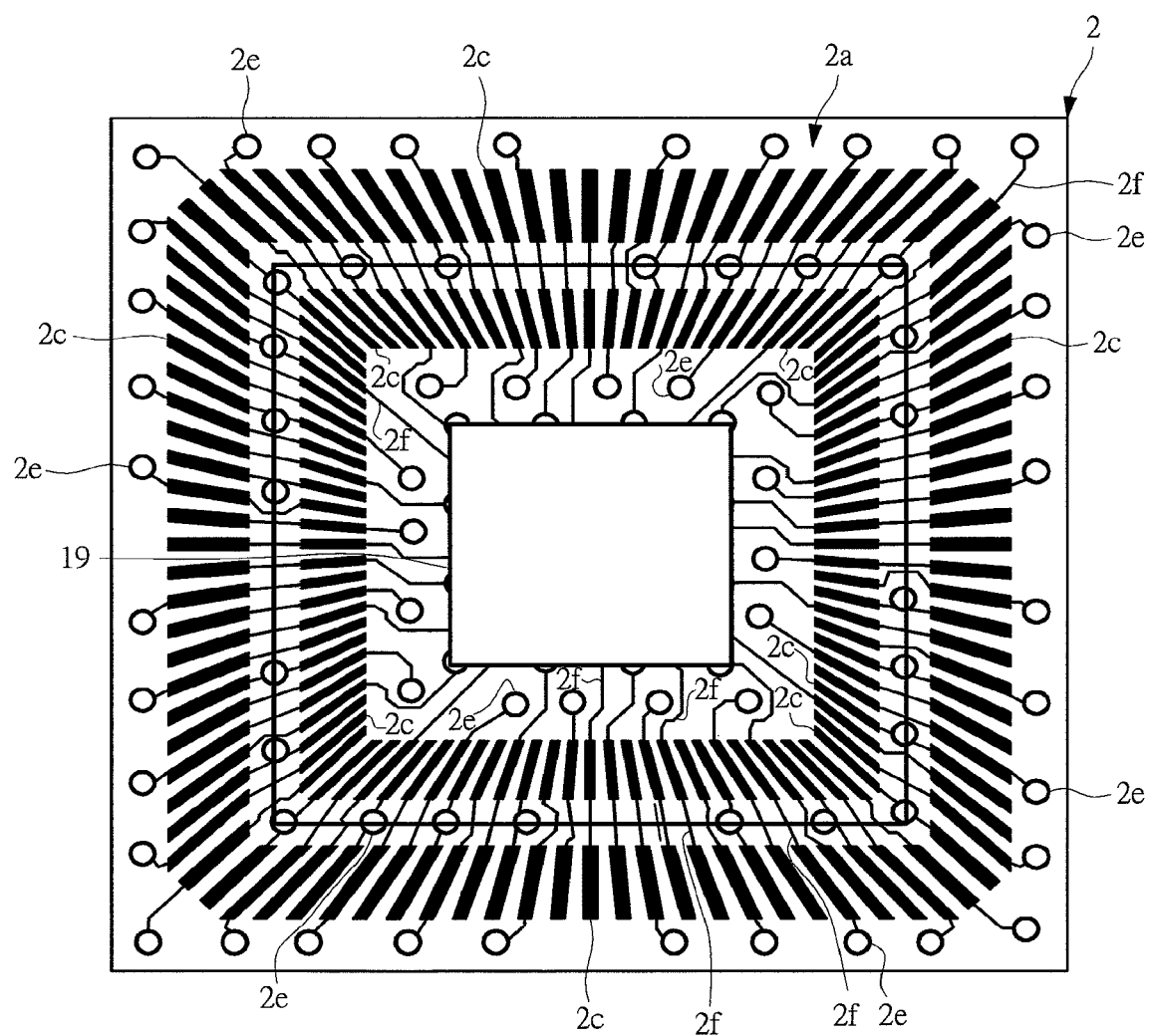
FIG. 38 is a plan view of an example of a structure after a die bonding material is supplied in the assembling of FIG. 36.
Figure 39:
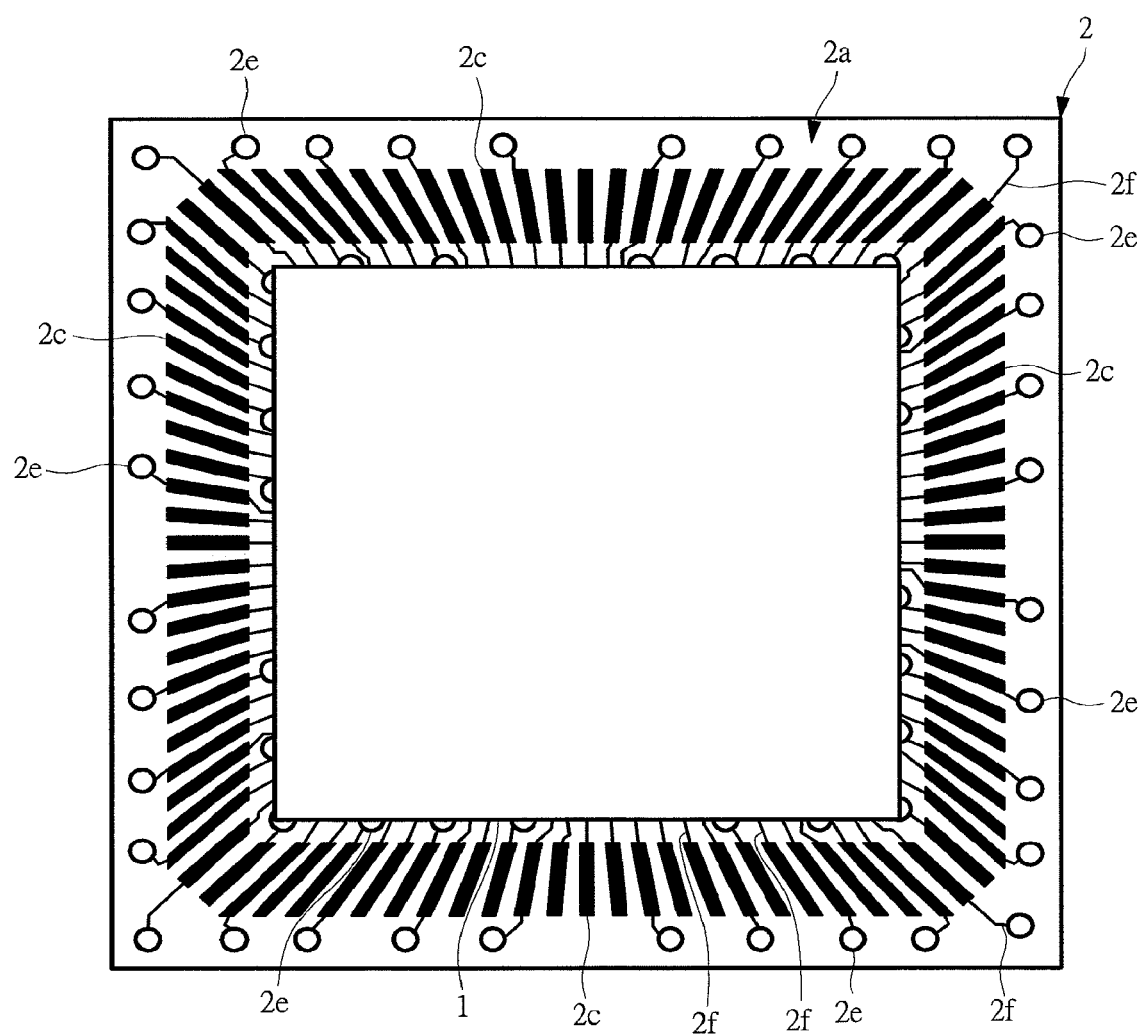
FIG. 39 is a plan view of an example of a structure after die bonding in the assembling of FIG. 36.

FIG. 34 is a plan view of an example of a structure of a semiconductor device (having a large chip mounted thereon) according to a fourth embodiment of the present invention, with a sealing body seen through and wires omitted therefrom. FIG. 35 is a partial cross-sectional view of an example of a structure cut along a line A-A of FIG. 34. Furthermore, FIG. 36 is a manufacturing flow chart of an example of a procedure of assembling the semiconductor device of FIG. 34. FIG. 37 is a plan view of an example of a structure of a wiring board for use in assembling of FIG. 36. FIG. 38 is a plan view of an example of a structure after a die bonding material is supplied in assembling of FIG. 36. FIG. 39 is a plan view of an example of structure after die bonding in assembling of FIG. 36.

The semiconductor device of the fourth embodiment illustrated in FIGS. 34 and 35 is an LGA 18 having a structure similar to that of the LGA 13 of the third embodiment, and is different from the LGA 13 in that a die bonding material 19 in a film-like form is used as an adhesive material for die bonding of the first semiconductor chip 1. This die bonding material 19 in a film-like form is formed of, for example, only an adhesive layer, and has a thickness F1 of, for example, F1>30 μm.

In the LGA 18 of the fourth embodiment, in place of an adhesive material in a paste-like form, a die bonding material 19 in a film-like form is adopted as an adhesive material for die bonding. In general, the filmy die bonding material 19 outflows (spreads in a wetting manner) less compared with an adhesive material in a paste-like form. Therefore, an outflow of the adhesive material from the solder resist film 2g as a die bonding region can be suppressed, and thus spreading of the adhesive material over the bonding lead 2c in a wetting manner can be suppressed. In this manner, only the matter of concern is to inject a mold resin in the gap between the first semiconductor chip 1 and the bonding lead 2c. Therefore, as with the LGA 13 of the third embodiment, the thickness F1 of the die bonding material 19 in a film-like form may be set so that the gap G between the first semiconductor chip 1 and the bonding lead 2c is G>50 μm.

Here, as described regarding the LGA 13, the thickness including the plating (the nickel-gold plating 2d) on the front surface of the bonding lead 2c is, for example, 30 μm, and, furthermore, when the solder resist film 2g as a die bonding region has a standard film thickness S1 of 50 μm, F1 is set to be larger than 30 μm (F1>30 μm), thereby achieving G>50 μm.

Therefore, in the LGA 18, the thickness F1 of the die bonding material 19 in a film-like form is set as F1>30 μm.

Note that, in the LGA 18, the film thickness S1 of the solder resist film 2g as a die bonding region and the thickness F1 of the die bonding material 19 in a film-like form are set so that the gap between the first semiconductor chip 1 and the bonding lead 2c can be reliably filled with the mold resin. That is, a total of the film thickness S1 of the solder resist film 2g and the thickness F1 of the die bonding material 19 in a film-like form is larger than 80 μm so that the gap G between the first semiconductor chip 1 and the bonding lead 2c satisfies G>50 μm. That is, either of the film thickness S1 of the solder resist film 2g and the thickness F1 of the die bonding material 19 in a film-like form may be larger as long as the total the thicknesses is larger than 80 μm. For example, the film thickness S1 of the solder resist film 2g may be equal to or larger than 60 μm.

However, the first semiconductor chip 1 has an overhung structure in which a portion near an end of the first semiconductor chip 1 protrudes from the solder resist film 2g and the die bonding material 19 in a film-like form. Therefore, ultrasound waves are less prone to be transmitted at the time of wire bonding. To solve this problem, the thickness of the die bonding material 19 in a film-like form is made as thin as possible than that of the solder resist film 2g. In this manner, the base is stabilized at the time of wire bonding to cause ultrasound waves to be more reliably transmitted, thereby increasing the connection strength of the wire bonding.

The structure of the LGA 18 other than those described above is similar to that of the LGA 13 of the third embodiment and is therefore not repetitively described herein.

Next, assembling of the LGA 18 of the fourth embodiment is described with reference to the manufacturing flow in FIG. 36.

First, a board is prepared as shown at step S11 in FIG. 36. Here, a multi-piece board for taking a plurality of pieces (a wiring board) 2n is prepared on which the plurality of device regions 2p illustrated in FIG. 27 are formed each being as a region where one LGA 18 is to be formed. On the other hand, a plurality of the first semiconductor chips 1 each having a desired integrated circuit formed thereon are prepared.

Note that, on each of the device regions (wiring board 2) 2p of the board 2n for taking a plurality of pieces, as illustrated in FIG. 37, the solder resist film 2g is formed at the center as a die bonding region. That is, at the center of the upper surface 2a of each wiring board (each device region 2p) 2, the solder resist film (a first insulating film) 2g is formed having an area smaller than that of the first semiconductor chip 1 and having the first semiconductor chip 1 mounted thereon. Around this solder resist film 2g, the plurality of bonding leads 2c are disposed.

Also, as illustrated in FIG. 35, on the lower surface 2b of each of the wiring boards (each of the device regions 2p) 2, the solder resist film 2g is also formed as an insulating film. The film thickness S1 of the solder resist films 2g on the upper surface 2a side and the lower surface 2b side is, for example, S1=50 μm.

Then, die bonding shown at step S12 in FIG. 36 is performed. In the die bonding process, the die bonding material 19 as an adhesive material in a film-like form is first applied onto each of the wiring boards 2. Here, as illustrated in FIGS. 36 and 38, the die bonding material 19 in a film-like form each obtained by cutting in advance to have a shape and dimensions similar to those of the pattern of the solder resist film 2g is attached onto the solder resist film 2g of each wiring board 2.

After the die bonding material 19 is attached to the solder resist film 2g, as illustrated in FIGS. 36 and 39, the first semiconductor chip 1 is mounted on the wiring board 2 via the die bonding material 19. In the die bonding process, the die bonding material 19 is heated via the first semiconductor chip 1 and the wiring board 2, thereby connecting the first semiconductor chip 1 to the solder resist film 2g.

Note that, since the die bonding material 19 is an adhesive material in a film-like form, the die bonding material 19 does not outflow from the solder resist film 2g to the outside to cover the bonding lead 2c.

After completion of die bonding, wire bonding shown at step S13 of FIG. 36 is performed. Here, the electrode pad 1c on the main surface (front surface) 1a of the first semiconductor chip 1 and the bonding lead 2c on the upper surface 2a of the wiring board 2 are electrically connected to each other by the wire (the metal wire) 5.

Then, molding shown at step S14 is performed. That is, the first semiconductor chip 1, the plurality of wires 5, and further the die bonding material 19 are sealed with the sealing body 4. Here, also in the LGA 18, as illustrated in FIG. 35, the gap G between the first semiconductor chip 1 and the bonding lead 2c is larger than 50 μm and thus the gap between the first semiconductor chip 1 and the bonding lead 2c is large. Therefore, the mold resin can be injected deeply into the gap, and unfilling of the mold resin can be prevented.

Then, singulating dicing shown at step S16 is performed to complete assembling of the LGA 18, and the procedure then goes to shipping shown at step S17.

Note that, as with the third embodiment, when the semiconductor device is the BGA 11 as illustrated in FIG. 20, which will be described further below, after molding is performed at step S14, balls are provided as shown at step S15, and then dicing into pieces shown at step S16 is performed to complete assembling of the BGA 11. The procedure then goes to shipping shown at step S17.

According to the LGA 18 and its assembling of the fourth embodiment, the die bonding material 19 in a film-like form is adopted as an adhesive material for die bonding. In this manner, it is possible to suppress the die bonding material 19 from outflowing from the solder resist film 2g to the outside to cover the bonding leads 2c. That is, outflowing of the adhesive material from the solder resist film 2g as a die bonding region is smaller than that of the pasty adhesive material. Therefore, spreading of the adhesive material to the bonding leads 2c in a wetting manner can be avoided, and the occurrence of a bonding defect in wire bonding can be avoided.

Also, by setting the total of the thickness of the die bonding material 19 in a film-like form and the film thickness of the solder resist film 2g larger than 80 μm, the gap between the first semiconductor chip 1 and the bonding lead 2c can be made larger than 50 μm. In this manner, the mold resin can be reliably injected into the gap.

According to the foregoing, it is possible to prevent the gap between the first semiconductor chip 1 and the bonding lead 2c from being unfilled with the mold resin.

Effects obtained from the LGA 18 and its assembling of the fourth embodiment other than those described above are similar to those obtained from the LGA 13 of the third embodiment and are therefore not repetitively described herein.

Next, a modification example of the fourth embodiment is described.

Figure 40:
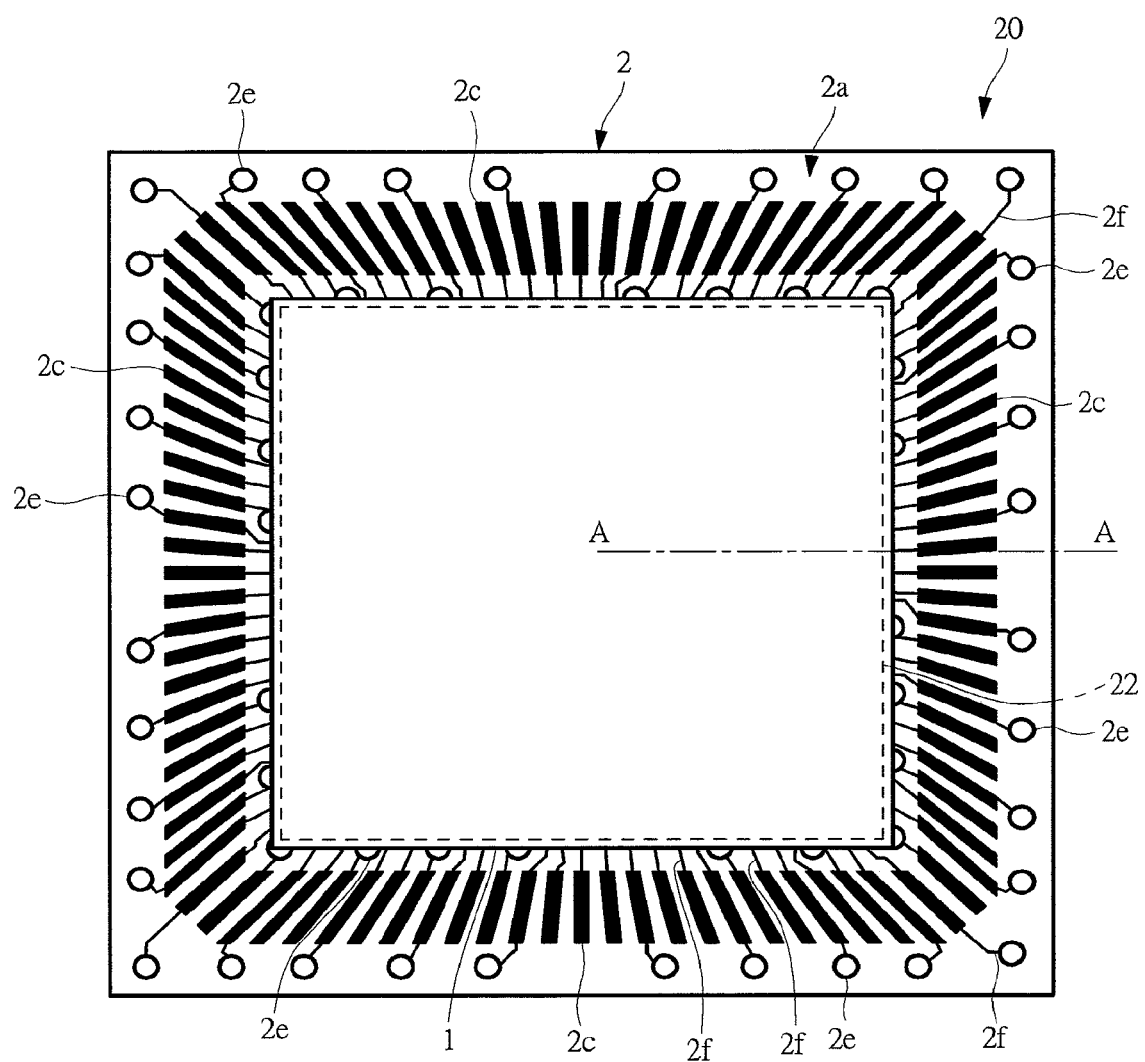
FIG. 40 is a plan view of a structure of a semiconductor device (having a large chip mounted thereon) according to a modification example of a fourth embodiment of the present invention, with a sealing body seen through and wires omitted therefrom.
Figure 41:
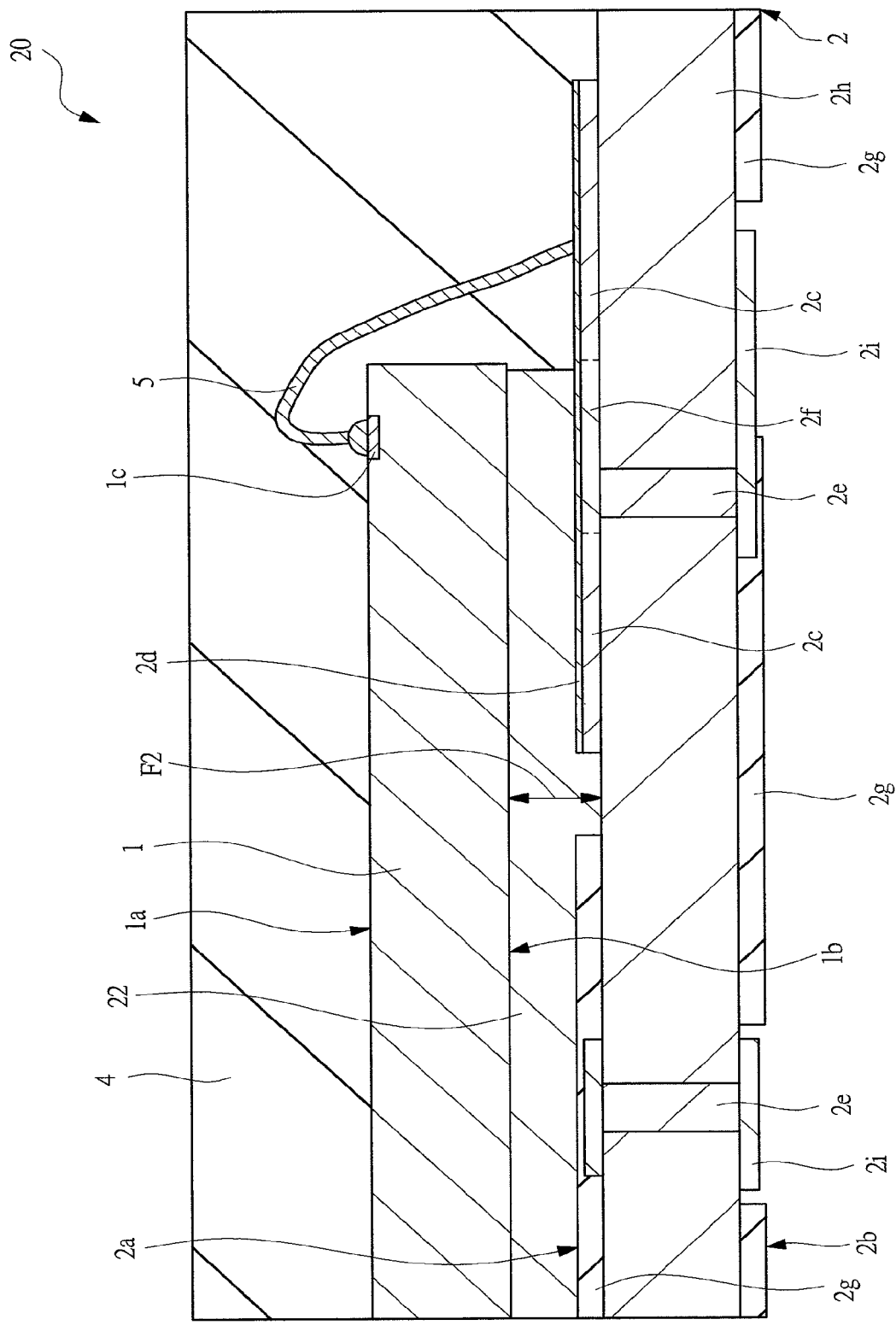
FIG. 41 is a partial cross-sectional view of a structure cut along a line A-A of FIG. 40.
Figure 42:
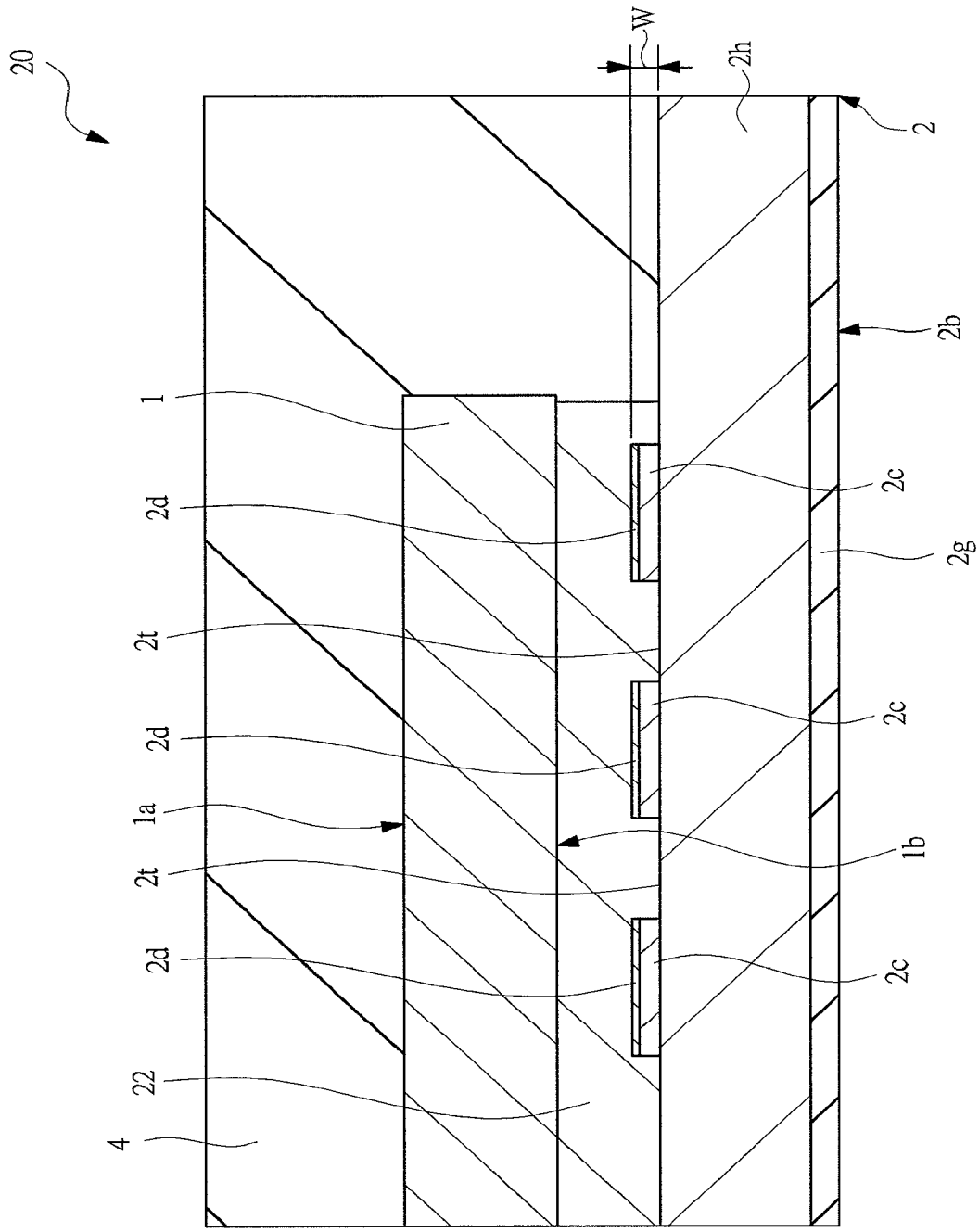
FIG. 42 is a partial cross-sectional view of a structure cut along a lead arrangement direction of FIG. 40.
Figure 43:
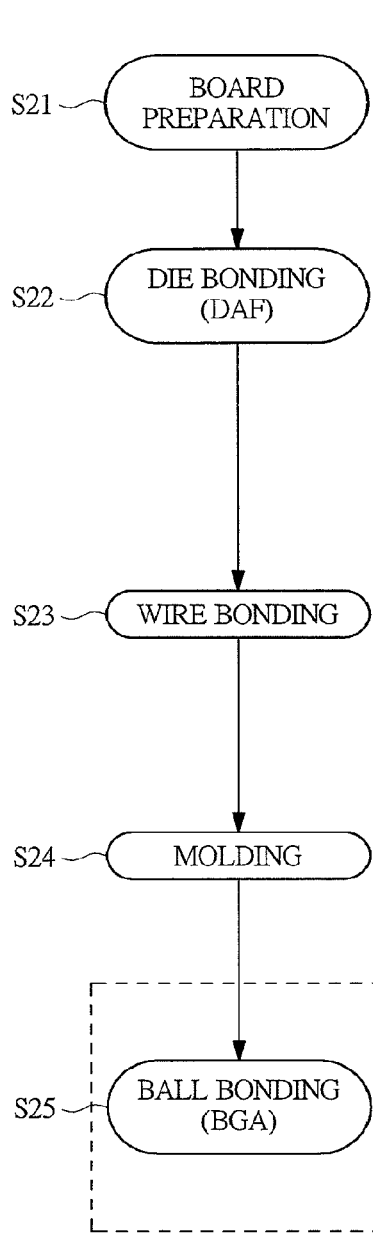
FIG. 43 is a manufacturing flow chart of an example of a procedure of assembling the semiconductor device of FIG. 40.
Figure 43:
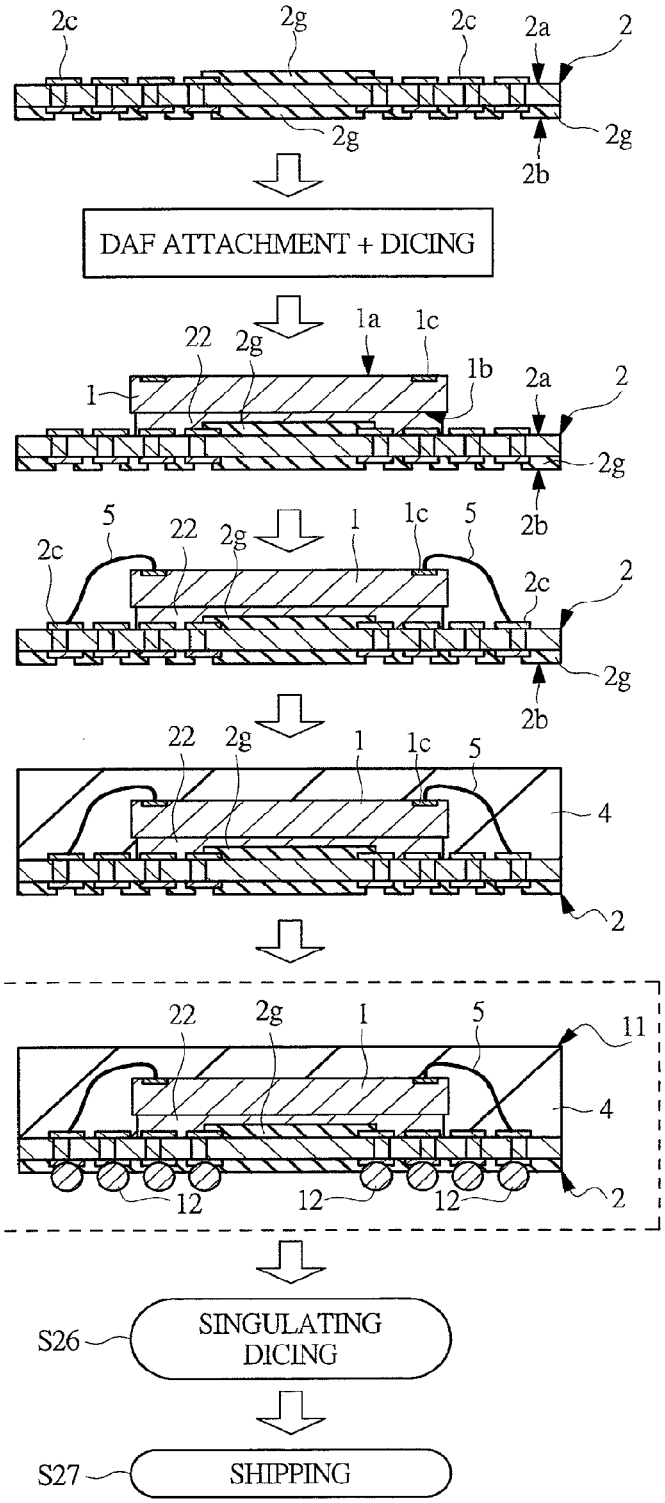
Figure 44:
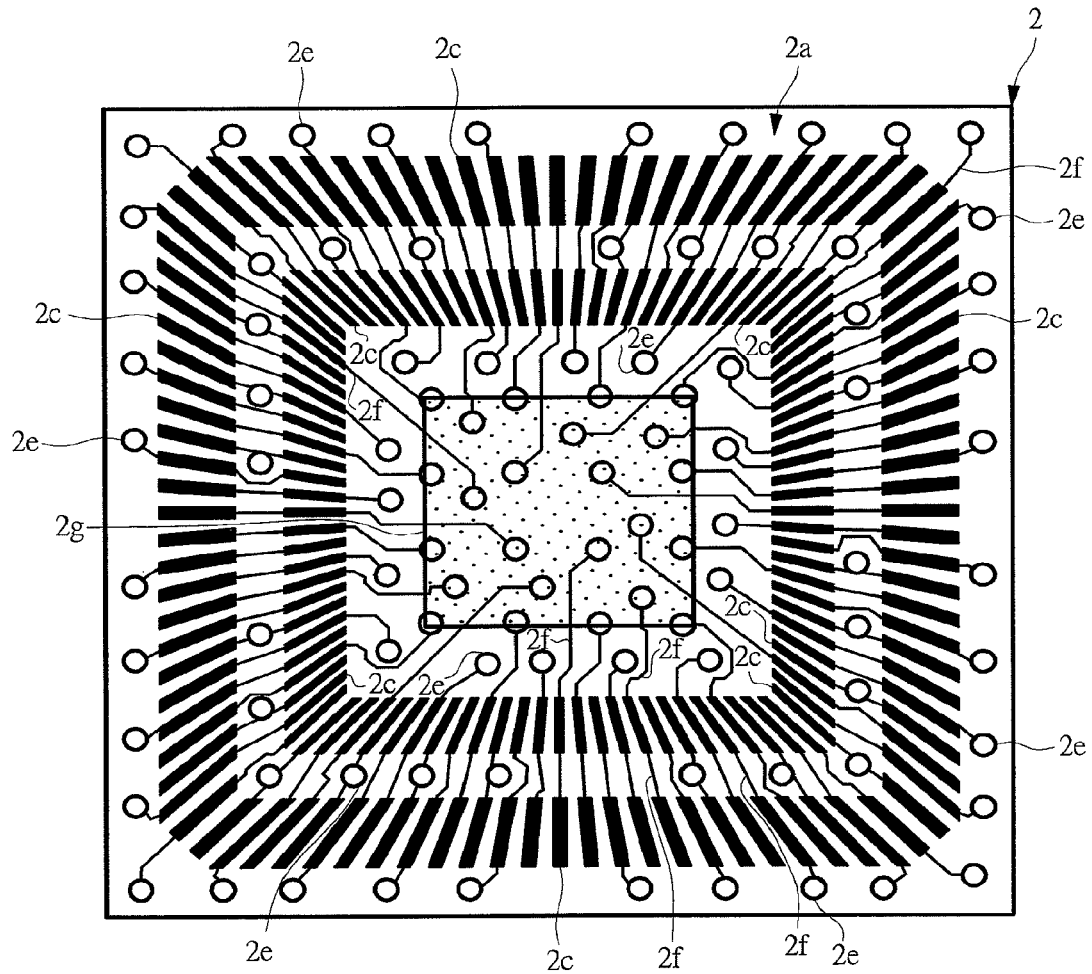
FIG. 44 is a plan view of an example of a structure of a wiring board for use in the assembling of FIG. 43.
Figure 45:
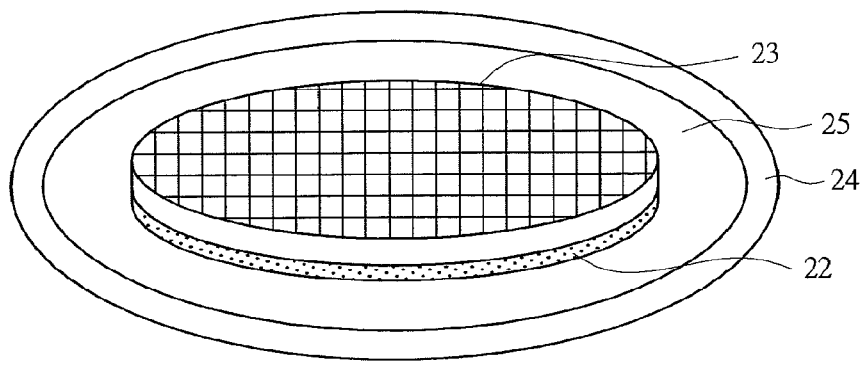
FIG. 45 is a perspective view of an example of a wafer state at the time of dicing in the assembling of FIG. 43.
Figure 46:
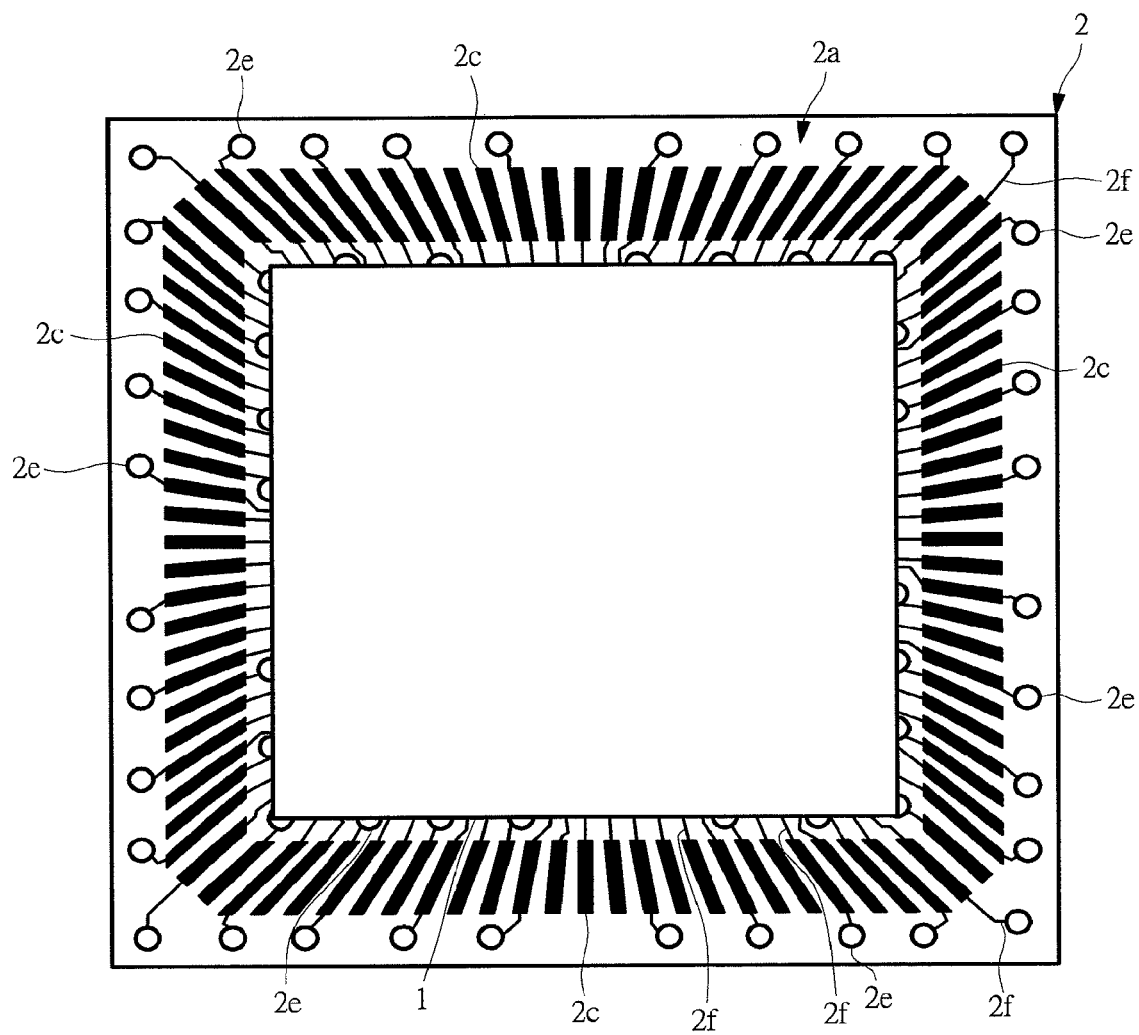
FIG. 46 is a plan view of an example of a structure after die bonding in the assembling of FIG. 43.

FIG. 40 is a plan view of a structure of a semiconductor device (having a large chip mounted thereon) of the modification example of the fourth embodiment of the present invention, with a sealing body seen through and wires omitted therefrom. FIG. 41 is a partial cross-sectional view of a structure cut along a line A-A of FIG. 40. FIG. 42 is a partial cross-sectional view of a structure cut along a direction of arranging leads of FIG. 40. FIG. 43 is a manufacturing flow of an example of a procedure of assembling the semiconductor device of FIG. 40. FIG. 44 is a plan view of an example of a structure of a wiring board for use in the assembling of FIG. 43. FIG. 45 is a perspective view of an example of a wafer state upon dicing in the assembling of FIG. 43. FIG. 46 is a plan view of an example of a structure after die bonding in the assembling of FIG. 43.

The semiconductor device illustrated in FIGS. 40 to 42 is an LGA 20 having a structure similar to that of the LGA 18, and uses, like the LGA 18, the die bonding material 22 in a film-like form as an adhesive material for die bonding of the first semiconductor chip 1. A difference from the LGA 18 is that the die bonding material 22 in a film-like form is an adhesive material capable of being high enough to infill (to be embedded) and this die bonding material in a film-like form capable of being high enough to infill is disposed also in a gap between the first semiconductor chip 1 and the plurality of bonding leads 2c.

Therefore, as illustrated in FIGS. 41 and 42, the structure is such that only the die bonding material 22 in a film-like form is disposed below the first semiconductor chip 1 and only the die bonding material 22 is filled in the gap between the first semiconductor chip 1 and the wiring board 2. As illustrated in FIG. 42, the die bonding material 22 in a film-like form is also embedded in a step portion 2t between adjacent bonding leads 2c among the plurality of bonding leads 2c. Furthermore, a part of the upper surface of the plurality of bonding leads 2c is covered with the die bonding material 22.

Note that, also in the LGA 20, in place of a pasty adhesive material, the die bonding material 22 in a film-like form is adopted as an adhesive material for die bonding. Therefore, the amount of outflowing of the adhesive material from the solder resist film 2g as a die bonding region is reduced as compared with an adhesive material in a paste-like form. Therefore, spreading of the adhesive material over the bonding lead 2c in a wetting manner can be suppressed. Furthermore, since the die bonding material 22 is disposed over an entire portion below the chip, the die bonding material 22 is also disposed in the gap between the first semiconductor chip 1 and the plurality of bonding leads 2c. That is, no gap is formed between the first semiconductor chip 1 and the plurality of bonding leads 2c. That is, the need for consideration of whether the mold resin can fill a gap can be eliminated. Furthermore, the space between the first semiconductor chip 1 and the wiring board 2 is filled with the die bonding material 22 in a film-like form. That is, the structure is not an overhung structure as in the LGA 18. Therefore, as compared with the LGA 18 having an overhung structure, ultrasound waves to be applied upon wire boding can be easily transmitted, and thus stable wire bonding can be performed.

Here, the die bonding material 22 in a film-like form for use in the LGA 20 is embedded also in the step portion 2t between the plurality of bonding leads 2c, and therefore is capable of being high enough to infill. As the die bonding material 22 capable of being high enough to infill, for example, an adhesive material in a film-like form called a DAF (Die Attach Film). Here, the case of adopting the DAF is described.

Note that, as a film physical property of the DAF capable of being embedded the step portion 2t of the pattern (the bonding lead 2c), a hot melting viscosity @ 130° C. (a viscosity upon film attaching) is preferably set smaller than or equal to 1500 Pa·s.

Also, as illustrated in FIG. 42, the bonding lead 2c has a thickness W, for example, W=20 to 40 μm. Therefore, since the step portion 2t of 40 μm at maximum has to be fully embedded, in further consideration of a margin on the order of 20 μm, the die bonding material 22 in a film-like form has a thickness F2=40 μm+20 μm=60 μm.

Here, since the condition is such that the thickness of the die bonding material 22 allows full embedding in the step portion 2t (20 to 40 μm) of the bonding lead 2c, the thickness is not restricted to 60 μm as long as the thickness allows full embedding of the step portion 2t.

Note that the structure of the LGA 20 other than those described above is similar to that of the LGA 18 of the fourth embodiment and is therefore not repetitively described herein.

Next, assembling of the LGA 20 of the fourth embodiment is described with reference to a manufacturing flow of FIG. 43.

First, a board is prepared as shown at step S21 of FIG. 43. Here, a multi-piece board for taking a plurality of pieces (a wiring board) 2n is prepared on which a plurality of the device regions 2p of FIG. 27 are formed each as a region where one LGA 20 is to be formed. On the other hand, a plurality of the first semiconductor chips 1 each having a desired integrated circuit formed thereon are prepared.

Note that, on each device region (wiring board 2) 2p of the multi-piece board 2n, as illustrated in FIG. 44, the solder resist film 2g is formed at the center as a die bonding region. That is, at the center portion of the upper surface 2a of each wiring board (each device region 2p) 2, the solder resist film (a first insulating film) 2g is formed having an area smaller than that of the first semiconductor chip 1 and having the first semiconductor chip 1 mounted thereon. Around this solder resist film 2g, the plurality of bonding leads 2c are disposed.

Also on the lower surface 2b of each wiring board (each device region 2p) 2, the solder resist film 2g is formed as an insulating film. Both of the solder resist films 2g on the upper surface 2a side and the lower surface 2b side have a film thickness of, for example, 50 μm.

On the other hand, a wafer 23 illustrated in FIG. 45 as a semiconductor wafer is prepared, and then die bonding at step S22 of FIG. 43 is performed first. In the die bonding process, [DAF attaching+dicing] is performed. That is, the die bonding material (DAF) 22 as an adhesive material in a film-like form is attached to the back surface of the wafer 23 illustrated in FIG. 45, and then the wafer 23 with the die bonding material 22 attached thereto is fixed to a dicing sheet 25 supported by a wafer ring 24. In this wafer state, dicing is performed to obtain first semiconductor chips 1 with the die bonding material (DAF) 22 as an adhesive material in a film-like form attached to the rear surface thereof.

Then, as illustrated in FIGS. 43 and 46, each of the first semiconductor chips 1 is mounted on the wiring board 2 via the die bonding material 22. In the die bonding process, the die bonding material 22 is heated via the first semiconductor chip 1 and the wiring board 2, thereby connecting the first semiconductor chip 1 to the solder resist film 2g.

In this manner, the state is such that parts of the upper surfaces of the solder resist film 2g and the plurality of bonding leads 2c are covered with the die bonding material 22 as an adhesive material in a film-like form. That is, as illustrated in FIG. 41, the state is such that the die bonding material 22 is disposed over the entire region below the first semiconductor chip 1.

Note that, as with assembling of the LGA 18, since the die bonding material 22 is an adhesive material in a film-like form, the die bonding material 22 does not outflow to the outside from the solder resist film 2g to cover the bonding leads 2c.

After completion of the die bonding, wire bonding shown at step S23 of FIG. 43 is performed. Here, the electrode pad 1c on the main surface (front surface) 1a of the first semiconductor chip 1 and the bonding lead 2c on the upper surface 2a of the wiring board 2 are electrically connected to each other by a wire (a metal wire) 5.

Then, molding shown at step S24 is performed. That is, the first semiconductor chip 1, the plurality of wires 5, and further the die bonding material 22 are sealed with the sealing body 4. Here, in the LGA 20, as illustrated in FIG. 41, the die bonding material 22 is disposed over an entire region below the first semiconductor chip 1. Therefore, unfilling of the mold resin in the gap between the first semiconductor chip 1 and the bonding lead 2c can be prevented.

Then, singulating dicing shown at step S26 is performed to complete assembling of the LGA 20, and the procedure then goes to shipping shown at step S27.

Also, as with the assembling of the LGA 18, when the semiconductor device is the BGA 11 as illustrated in FIG. 20, which will be described further below, after molding is performed at step S24, balls are bonded as shown at step S25, and then singulating dicing shown at step S26 is performed to complete assembling of the BGA 11. The procedure then goes to shipping shown at step S27.

In the assembling of the LGA 20 described above, it has been described that the die bonding material 22 as a DAF is attached on a chip side (wafer side) in advance and is then mounted on the wiring board 2. Alternatively, in the die bonding process, the die bonding material 22 may be attached to the solder resist film 2g of the wiring board 2 and then the first semiconductor chip 1 may be mounted on the wiring board 2. That is, when a DAF is used as an adhesive material for die bonding, the DAF may be attached on any of the chip side and the board side.

According to the LGA 20 and its assembling of the fourth embodiment, as with the case of the LGA 18, the die bonding material (DAF) 22 in a film-like form is used as an adhesive material for die bonding. In this manner, it is possible to suppress the die bonding material 22 from outflowing from the solder resist film 2g to the outside to cover the bonding leads 2c. That is, outflowing of the adhesive material from the solder resist film 2g as a die bonding region is reduced. Therefore, spreading of the adhesive material to the bonding leads 2c in a wetting manner can be avoided, and the occurrence of a bonding defect in wire bonding, or the like can be avoided.

Furthermore, since the die bonding material 22 is disposed over the entire region below the first semiconductor chip 1, the need for filling the gap between the first semiconductor chip 1 and the bonding leads 2c with the mold resin is eliminated. Therefore, a problem of unfilling the gap can also be avoided.

Still further, in the assembling of the LGA 20, the gap between the first semiconductor chip 1 and the bonding lead 2c is required to be set high so as to allow filling of the mold resin, but this can be eliminated, and therefore the thickness (height) of the LGA 20 can be made thinner (lower) as compared with the LGA 18.

Effects obtained from the LGA 20 and its assembling according to the fourth embodiment other than those described above are similar to those obtained from the LGA 18 of the fourth embodiment and are therefore not repetitively described herein.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, in the first, second, third, and fourth embodiments, while descriptions have been made regarding an LGA being taken as an example, the semiconductor device may be a BGA (Ball Grid Array) in place of an LGA, as long as the device is of board-type.

FIG. 20 is a cross-sectional view of an example of a structure of a semiconductor device (BGA) of a modification example of the present invention. The BGA 11 as a semiconductor device illustrated in FIG. 20 has the first semiconductor chip 1 mounted via the die bonding material 6 such as a paste material on the upper surface 2a of the wiring board 2 as a BGA board, in which the electrode pads 1c as a surface electrode of the first semiconductor chip 1 and the bonding leads 2c on the upper surface 2a of the wiring board 2 are electrically connected by the plurality of wires 5. Furthermore, the first semiconductor chip 1 and the plurality of wires 5 are resin-sealed with the sealing body 4 formed of a sealing resin on the upper surface 2a of the wiring board 2.

Note that, on the lower surface 2b side of the wiring board 2, a plurality of solder balls 12 to be external terminals are provided so as to be arranged in a grid form (a lattice form).

Also, while FIG. 20 illustrates a situation where the first semiconductor chip 1 having a large size is mounted, it goes without saying that the BGA 11 can have the second semiconductor chip 3 as a minimum chip mounted thereon.

Note that, while the LGAs 7, 8, 9, and 10 are low-cost as compared with the BGA 11, their mounting difficulty is high and, in particular, their terminal coplanarity sensitivity is high. Therefore, they are suitable for a small-sized package (smaller than about 10 mm×10 mm) capable of suppressing coplanarity to be small. The BGA 11 is suitable for a relatively large-sized package larger than or equal to 10 mm×10 mm because it can control coplanarity by bumps (the solder balls 12). Also, in some cases, the BGA 11 can be selected for a small-sized package in view of mounting difficulty.

In the first and second embodiments, descriptions have been made on the cases where the semiconductor chips having two types of dimensions are mounted on the shared board (the wiring board 2). Alternatively, the number of types of dimensions of a mountable semiconductor chip is not restricted to two but may be three or more, as long as conditions, such as the number of pins, are the same.

The type of semiconductor chip mountable on the common board is not restricted to a planar size, and a semiconductor chip of a different pad arrangement can be mounted.

The present invention is suitable for a board-type semiconductor device.

What is claimed is:
1. A semiconductor device comprising:
a wiring board having a core material which has a top surface and a bottom surface opposite the top surface, a first insulating film being formed over the top surface of the core material, and a plurality of bonding leads being disposed around the first insulating film;
a semiconductor chip having an obverse surface over which a plurality of electrode pads are formed and a reverse surface opposite the obverse surface and being mounted over the first insulating film via a die bonding material; and
a plurality of metal wires electrically connecting to the plurality of bonding leads of the wiring board and the plurality of electrode pads, respectively,
wherein each of the plurality of bonding leads has a first part and a second part outside the first part,
wherein, in plan view, a plane area of the first insulating film is smaller than a plane area of the semiconductor chip, and
wherein, in cross-section view, an end portion of the die bonding material is located in a space portion defined by a side surface of the first insulating film, the reverse surface of the semiconductor chip, the top surface of the core material, and a side surface of the first part of each of the plurality of bonding leads.

2. The semiconductor device according to claim 1, wherein a bonding area of the die bonding material and the wiring board is greater than the area of the first insulating film.

3. The semiconductor device according to claim 1, wherein, in plan view, the semiconductor chip overlaps with a part of the first part and does not overlap with the second part of each of the plurality of bonding leads, and wherein the plurality of metal wires are electrically connected to the second part of each of the plurality of bonding leads.

4. The semiconductor device according to claim 1,
wherein, in plan view, the semiconductor chip does not overlap with the first and second parts of each of the plurality of bonding leads, and
wherein the plurality of metal wires are electrically connected to the first part of each of the plurality of bonding leads.

5. The semiconductor device according to claim 1,
wherein a first wiring part electrically connected to the first and second parts of a first bonding lead of the plurality of bonding leads overlaps with a first via and electrically connects to the first via.

6. The semiconductor device according to claim 1,
wherein, in plan view, the semiconductor chip overlaps with a part of the first part of each of the plurality of bonding leads, and
wherein the end portion of the die bonding material is located on an inner side of an outer perimeter of the semiconductor chip.

7. The semiconductor device according to claim 1,
wherein a part of a sealing body is disposed at an outer edge of the semiconductor chip on the reverse surface side of the semiconductor chip.

8. The semiconductor device according to claim 1,
wherein the die bonding material is formed by applying an adhesive material a paste-like form.

9. The semiconductor device according to claim 1,
wherein a film thickness of the first insulating film is thicker than a film thickness of a second insulating film on which the semiconductor chip is not mounted.

10. The semiconductor device according to claim 9,
wherein the end portion of the die bonding material is located between the first and second insulating films.

* * * * *